(12) United States Patent
Iwata et al.

(10) Patent No.: US 8,071,916 B2
(45) Date of Patent: Dec. 6, 2011

(54) WAFER HEATING APPARATUS AND SEMICONDUCTOR MANUFACTURING APPARATUS

(75) Inventors: Keiji Iwata, Kirishima (JP); Koichi Nagasaki, Kirishima (JP); Tsunehiko Nakamura, Kirishima (JP)

(73) Assignee: Kyocera Corporation, Kyoto (JP)

( * ) Notice: Subject to any disclaimer, the term of this patent is extended or adjusted under 35 U.S.C. 154(b) by 924 days.

(21) Appl. No.: 11/571,352

(22) PCT Filed: Jun. 28, 2005

(86) PCT No.: PCT/JP2005/011823
§ 371 (c)(1), (2), (4) Date: Dec. 27, 2006

(87) PCT Pub. No.: WO2006/006391
PCT Pub. Date: Jan. 19, 2006

(65) Prior Publication Data
US 2008/0017627 A1    Jan. 24, 2008

(30) Foreign Application Priority Data

Jun. 28, 2004 (JP) .................. 2004-189545
Aug. 24, 2004 (JP) .................. 2004-243904
Sep. 27, 2004 (JP) .................. 2004-278793

(51) Int. Cl.
*F23D 11/00* (2006.01)
*C23C 16/00* (2006.01)

(52) U.S. Cl. ..................... 219/385; 118/725

(58) Field of Classification Search .......... 219/385–471; 392/407–441; 118/724, 725, 726
See application file for complete search history.

(56) References Cited

U.S. PATENT DOCUMENTS

| | | | |
|---|---|---|---|
| 5,643,483 A | 7/1997 | Kubota et al. | |
| 6,179,924 B1 * | 1/2001 | Zhao et al. | 118/725 |
| 6,433,318 B2 * | 8/2002 | Danko | 219/536 |
| 6,500,266 B1 * | 12/2002 | Ho et al. | 118/730 |

(Continued)

FOREIGN PATENT DOCUMENTS

JP   58016590 A   1/1983

(Continued)

OTHER PUBLICATIONS

Japanese language office action dated Apr. 11, 2008 and its English language translation for corresponding Japanese application 2004189545 lists the references above.

(Continued)

*Primary Examiner* — Daniel L Robinson
(74) *Attorney, Agent, or Firm* — DLA Piper LLP (US)

(57) ABSTRACT

A wafer heating apparatus which is capable of quickly cooling by improving the cooling rate of the heater section is provided.
The wafer heating apparatus comprises a plate-shaped member having two opposing principal surfaces with one of the principal surfaces serving as a mounting surface to mount a wafer thereon and the other principal surface having a band-shaped resistive heating member formed thereon, power feeder terminals connected to the resistive heating member for supplying electric power to the resistive heating member, a casing provided to cover the power feeder terminals on the other surface of the plate-shaped member and a nozzle of which tip faces the other surface of the plate-shaped member for cooling the plate-shaped member, wherein the position of the tip of the nozzle as projected onto the other surface of the plate-shaped member is located between the bands of the resistive heating member.

22 Claims, 16 Drawing Sheets

U.S. PATENT DOCUMENTS

| | | |
|---|---|---|
| 6,534,750 B1 | 3/2003 | Tanoue et al. ............... 219/444.1 |
| 6,815,647 B2 | 11/2004 | Tanoue et al. ............... 219/444.1 |
| 6,897,414 B2 | 5/2005 | Ito et al. |
| 7,417,206 B2 * | 8/2008 | Nakamura ................. 219/444.1 |
| 2002/0190054 A1 | 12/2002 | Ito et al. |
| 2006/0289448 A1 * | 12/2006 | Natsuhara et al. ......... 219/444.1 |

FOREIGN PATENT DOCUMENTS

| | | |
|---|---|---|
| JP | 07280462 A | 10/1995 |
| JP | 08082920 A | 3/1996 |
| JP | 10-284382 | 10/1998 |
| JP | 2001-135684 | 5/2001 |
| JP | 2001-168022 | 6/2001 |
| JP | 2001-203156 | 7/2001 |
| JP | 2001-297857 | 10/2001 |
| JP | 2001-297858 | 10/2001 |
| JP | 2001-313249 | 11/2001 |
| JP | 2001351970 A | 12/2001 |
| JP | 2002-064133 | 2/2002 |
| JP | 2002-076102 | 3/2002 |
| JP | 2002-083848 | 3/2002 |
| JP | 2002-100462 | 4/2002 |
| JP | 2002100460 A | 4/2002 |
| JP | 2002-246159 | 8/2002 |
| JP | 2002-373846 | 12/2002 |
| JP | 2003-100818 | 4/2003 |
| JP | 2003347177 A | 12/2003 |
| JP | 2004022475 A | 1/2004 |
| JP | 2004031593 A | 1/2004 |
| JP | 2004-063813 | 2/2004 |
| WO | 0203434 A1 | 1/2002 |

OTHER PUBLICATIONS

Japanese language office action dated Apr. 16, 2008 and its English language translation for corresponding Japanese application 2004189545 lists the references above.

* cited by examiner

WAFER HEATING APPARATUS AND SEMICONDUCTOR MANUFACTURING APPARATUS

FIELD OF THE INVENTION

The present invention relates to a wafer heating apparatus used in the manufacture and inspection of semiconductors, and a semiconductor manufacturing apparatus using the same, for such applications as forming a thin film of semiconductor on a semiconductor wafer or on a liquid crystal substrate, or forming a resist film by drying and baking a liquid resist applied onto a wafer.

BACKGROUND ART

Semiconductor devices are extremely important products used in diverse products ranging from industrial use to home use. A semiconductor chip which constitutes the semiconductor device is manufactured by, for example, forming various circuits on a silicon wafer and cutting the wafer into the chips of predetermined size.

In a semiconductor manufacturing process where various circuits are formed on a silicon wafer, a wafer heating apparatus is used to heat the semiconductor wafer such as silicon wafer (hereinafter referred to simply as wafer) when forming a thin film of semiconductor, etching the film and baking the resist film.

Conventional semiconductor manufacturing apparatuses can be divided into batch operation type which heats a plurality of wafers simultaneously and sequential operation type which heats the wafers one by one. The sequential operation type has an advantage that the temperature can be controlled more accurately, although it can process less wafers at a time. While the use of semiconductor heating apparatuses of the batch operation type has been predominant in the past, use of semiconductor heating apparatuses of the sequential operation type where the wafers are processed one by one has been increasing as the wafer size increases from 8 inches to 12 inches while wiring of the semiconductor devices becomes finer and higher accuracy is required in controlling the wafer processing temperature.

When the sequential operation type is employed, however, it is required to reduce the time taken to process each wafer since the number of wafers processed at a time decreases. Therefore, there is a strong demand for the wafer heating apparatus to reduce the time required in cooling down as well as in heating. Accordingly in the wafer heating apparatus, it is a common practice to place a heater section, comprising a plate-shaped member which has a resistive heating member, in a casing and provide a cooling nozzle in the casing so as to forcibly cool the heater section by supplying a cooling medium from the nozzle (Japanese Unexamined Patent Publication (Kokai) No. 2003-100818 and Japanese Unexamined Patent Publication (Kokai) No. 2004-063813).

Recently wafer heating apparatuses made of ceramics are widely used as the wiring of the semiconductor devices becomes finer and higher accuracy is required in controlling the wafer processing temperature.

The wafer heating apparatuses made of ceramics are disclosed in, for example, Japanese Unexamined Patent Publication (Kokai) No. 2001-135684, Japanese Unexamined Patent Publication (Kokai) No. 2001-203156, Japanese Unexamined Patent Publication (Kokai) No. 2001-313249 and Japanese Unexamined Patent Publication (Kokai) No. 2002-76102. FIG. 19 shows a wafer heating apparatus 171 made of ceramics disclosed in Japanese Unexamined Patent Publication (Kokai) No. 2001-203156.

The wafer heating apparatus 171 made of ceramics comprises a plate-shaped ceramic member 172 and a casing 179 as the major components, wherein the plate-shaped ceramic member 172 made of nitride ceramics or carbide ceramics is secured to the opening of the bottomed casing 179 made of a metal such as aluminum, by means of bolt 180 via an insulating connecting member 174 made of a resin, of which top surface is used as a mounting surface 173 to mount the wafer W thereon, and a resistive heating member 175 having concentric configuration as shown in FIG. 20 is provided on the bottom surface of the plate-shaped ceramic member 172 thereby forming a heater section.

With this configuration, a cooling medium is injected from a nozzle 182 into a space delimited by the plate-shaped ceramic member 172 and the casing so as to circulate and is discharged through a discharge port 183, thereby cooling the heater section.

In order to form a uniform film over the entire surface of the wafer W or provide uniform heat-reaction condition of the resist film by using the wafer heating apparatus 171 made of ceramics of such a constitution, it is important to make the temperature distribution uniform by minimizing the temperature difference across the surface of wafer, and it is necessary to heat and cool down the wafer in a short period of time. In addition, it is necessary to change the temperature setting of the wafer heating apparatus 171 in order to vary the wafer temperature, and it is required to heat the wafer heating apparatus 171 made of ceramics in a short period of time and cool it down in a short period of time.

Japanese Unexamined Patent Publication (Kokai) No. 2002-83848 discloses that disturbance of the flow of the cooling medium can be mitigated by keeping the surface roughness of the bottom surface of the casing within a predetermined value, and that it is made possible to improve the efficiency of heating and cooling.

Japanese Unexamined Patent Publication (Kokai) No. 2002-100462 discloses that heating rate and cooling rate of the wafer can be increased by controlling the heat capacity of the wafer heating apparatus 171 made of ceramic to 5000 J/K or less. However, the casing 179 has a heat capacity 3.3 times that of plate-shaped ceramic member 173 or more, and the ratio S/V of the surface area S of the casing 179 to the volume V of the casing 179 is less than 5 (1/cm), and therefore the cooling time cannot be sufficiently reduced.

Thus it has been taking relatively long time to change the set temperature of heating the wafer with any of the prior art technologies, and there has been a demand for a wafer heating apparatus capable of changing the temperature in a shorter period of time.

In the meantime, it has been in practice to decrease the temperature difference across the surface of wafer by controlling the distribution of resistance of the resistive heating member 175 having band shape or controlling the temperature of the resistive heating member 175 having band shape separately, and it has been proposed to increase the amount of heat generated from the surrounding area in the case of a structure susceptible to heat sink.

But any of the proposals have problems that a very complicated structure and complex control are required, and there is a demand for a wafer heating apparatus capable of heating with uniform temperature distribution with a simple structure.

Moreover, since the wafer heating apparatus 171 is vulnerable to the light, heat, processing gas and other influences when used in a semiconductor manufacturing apparatus, the resistive heating member 175 is required to have durability against oxidization and other attack on the surface. For this reason, it has been proposed to coat the resistive heating member 175 with an insulation layer on a part or whole of the surface thereof, so as to improve the durability of the resistive heating member 175 (refer to Japanese Unexamined Patent Publication (Kokai) No. 2001-297857).

Since the insulation layer can also serve as a heat insulator for the resistive heating member 175, it may make an obstacle in quickly cooling down the wafer heating apparatus 171 which has been heated. Therefore, there has been a wafer heating apparatus where surface roughness Ra of the insulation layer is controlled in a range from 0.01 to 10 μm in an attempt to improve the cooling effect (refer to Japanese Unexamined Patent Publication (Kokai) No. 2001-297858).

DISCLOSURE OF THE INVENTION

As described above, the conventional wafer heating apparatus has the problem of long cooling time. In particular, it has been difficult to cool down the heater section of the wafer heating apparatus, which heats large wafers measuring 300 mm or more, in a short period of time.

A wafer heating apparatus having a resistive heating member covered with an insulation layer has such a problem that the resistive heating member and the insulation layer have low strength of bonding with the plate-shaped member due to the difference in thermal expansion coefficients of the constituent materials. Upon repetitive cycles of heating and cooling, or when cooling gas is discharged from the nozzle, such troubles occur as peel-off of the resistive heating member and the insulation layer or cracks therein.

Therefore, it is not sufficient in protecting the resistive heating member 175 to simply form the insulation layer over the area of the resistive heating member 175 provided on the plate-shaped ceramic member 172.

An object of the present invention is to provide a wafer heating apparatus which is capable of quickly cooling by improving the cooling rate of the heater section comprising the plate-shaped member that has the resistive heating member, and a semiconductor manufacturing apparatus which uses the same.

Another object of the present invention is to provide a wafer heating apparatus which is capable of quickly cooling, and has high reliability without undergoing any deterioration in performance such as peel-off of the resistive heating member and the insulation layer or crack when subjected to repetitive cycles of heating and cooling, or a cooling medium is discharged.

In order to achieve the object described above, the wafer heating apparatus of the present invention comprises a plate-shaped member having two opposing principal surfaces with one of the principal surfaces serving as a mounting surface to mount a wafer thereon and the other principal surface having a band-shaped resistive heating member formed thereon, power feeder terminals connected to the resistive heating member for supplying electric power to the resistive heating member, a casing provided to cover the power feeder terminals on the other surface of the plate-shaped member and a nozzle of which tip faces the other surface of the plate-shaped member for cooling the plate-shaped member, wherein the position of the tip of the nozzle as projected onto the other surface of the plate-shaped member is located between the bands of the resistive heating member.

The semiconductor manufacturing apparatus is characterized in that it is provided with the wafer heating apparatus of the present invention.

The wafer heating apparatus of the present invention having the constitution described above is capable of quickly cooling, since the position of the tip of the nozzle as projected onto the other surface of the plate-shaped member is located between the bands of the resistive heating member, it is made possible to increase the cooling rate of the heater section of the plate-shaped member.

The present invention also provides the wafer heating apparatus of high reliability which is capable of quickly cooling without undergoing any deterioration in performance, by forming protrusions and recesses on the surface of the resistive heating member.

The present invention further provides the wafer heating apparatus of high reliability which is capable of quickly cooling without undergoing any deterioration in performance, by providing the insulation layer with a surface having protrusions and recesses on the resistive heating member.

DESCRIPTION OF REFERENCE NUMERALS

Figure 1:
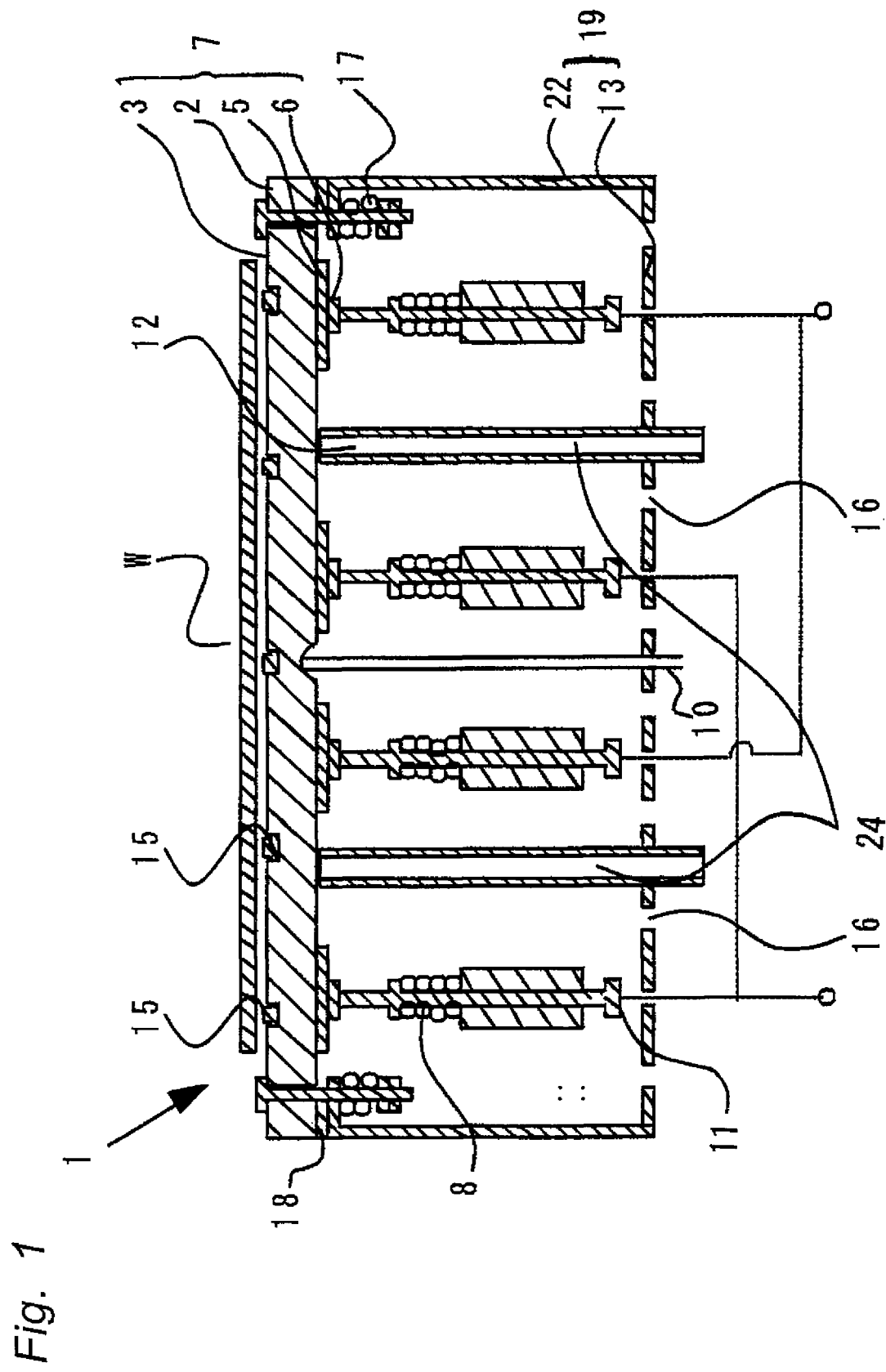
FIG. 1 is a sectional view showing the constitution of the wafer heating apparatus according to first embodiment of the present invention.

W: Semiconductor wafer
1: Wafer heating apparatus
2: Plate-shaped member
3: Mounting surface
5: Resistive heating member
6: Power feeder section
7: Heater section
8: Elastic member (power feeder section)
10: Temperature sensor
11: Power feeder terminal
12, 14: Insulation layer
13: Base plate
15: Wafer support pin
16: Opening
17: Elastic member (casing)
18: Heat insulating member
19: Casing (support member)
22: Side wall
24: Nozzle
24a: Nozzle tip
401, 55, 61: Surface having protrusions and recesses
41, 56, 62: Protrusion
42, 57, 63: Recess
P20: Position of nozzle tip (between bands of resistive heating member)
P30: Position of nozzle tip (between a plurality of resistive heating members)
AP: Position of nozzle tip (between bands of resistive heating member)
55: Surface having protrusions and recesses of resistive heating member
56: Protrusion of resistive heating member
57: Recess of resistive heating member
60: insulation layer
61: Surface having protrusions and recesses of insulation layer
62: Protrusion of insulation layer
63: Recess of insulation layer

BEST MODE FOR CARRYING OUT THE INVENTION

Preferred embodiments of the present invention will now be described with reference to the accompanied drawings.

First Embodiment

FIG. 1 is a sectional view showing the constitution of the wafer heating apparatus 1 according to the first embodiment of the present invention. The wafer heating apparatus 1 of the first embodiment comprises a plate-shaped member 2 having one of the principal surfaces thereof serving as a mounting surface 3 to mount a wafer W thereon and the other principal surface having a resistive heating member 5 formed thereon, power feeder terminals 11 for supplying electric power to the resistive heating member 5, cooling nozzle 24 for cooling the plate-shaped member 2 and a metal casing 19 which covers the power feeder terminals 11 and supports the cooling nozzle 24. Power feeder section 6 connected to the resistive heating member 5 is formed on the other principal surface of the plate-shaped member 2, and the power feeder terminals 11 are connected to the power feeder section 6. The plate-shaped member 2 is attached to the casing 19 via a heat insulating member 18. Thus in the first embodiment, the heater section 7 is constituted from the plate-shaped member 2 one of the principal surfaces thereof serving as a mounting surface 3 to mount a wafer W thereon, the resistive heating member 5 and the power feeder section 6.

According to the present invention, the plate-shaped member 2 is preferably formed from ceramics consisting of silicon carbide or aluminum nitride having high heat conductivity as the main component.

The resistive heating member 5 preferably has a configuration that allows it to heat the mounting surface 3 uniformly, such as narrow bands disposed symmetrically with respect to the center of the plate-shaped member 2. Specifically, a spiral shape having a center at the center of the plate-shaped member 2 (FIG. 3) or a plurality of separate resistive heating members 5 in concentric circles may be employed.

Figure 4:
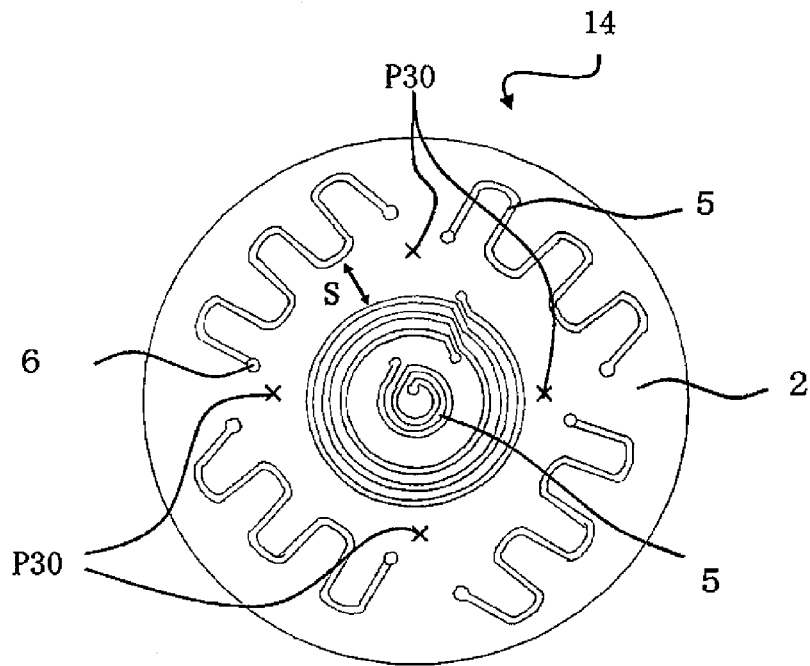
FIG. 4 is a diagram showing a variation of the configuration of bands of the resistive heating member formed on the plate-shaped member and the positions of tips of the nozzles in the wafer heating apparatus according to the first embodiment.

Alternatively, a plurality of meandering resistive heating members 5 may be disposed in a symmetrical arrangement with respect to the center of the plate-shaped member 2. FIG. 4 shows an example of the resistive heating member 5 comprising a plurality (4 in FIG. 4) of meandering portions consisting of straight segments connected by arced sections. Uniformity of heating can be improved further by dividing the resistive heating member 5 into a plurality of portions.

In the first embodiment, the power feeder section 6 formed from such a material as gold, silver, palladium or platinum is connected to the resistive heating member 5, and the power feeder terminals 11 are pressed into contact with the power feeder section 6 via the elastic member 8 so as to establish electrical continuity. The power feeder terminals 11 may also be directly bonded onto the resistive heating member 5 by soldering, brazing or the like.

The metal casing 19 has a side wall 22 and a base plate 13, and the plate-shaped member 2 is disposed to oppose the base plate 13 so as to cover the top of the casing 19. The base plate 13 has the power feeder terminals 11 for supplying electric power to the power feeder section 6, the nozzle 24 for cooling the plate-shaped member 2 and temperature sensors 10 for measuring the temperature of the plate-shaped member 2. The base plate 13 also has an opening 16 for discharging the cooling gas.

While the plate-shaped member 2 and the casing 19 are held together by means of bolts along the periphery thereof, these members are elastically held together by screwing nuts via the heat insulation member 18 and the elastic member 17 so that the plate-shaped member 2 and the casing 19 will not make direct contact with each other in the first embodiment. With this constitution, since the force acting on the plate-shaped member 2 can be absorbed by the elastic member 17 when the casing 19 deforms due to temperature change, the plate-shaped member 2 can be prevented from deforming or warping, thereby preventing the temperature of the wafer surface from varying from point to point due to warping of the plate-shaped member 2.

The wafer heating apparatus 1 according to the first embodiment of the present invention having the constitution described above is capable of heating the wafer W uniformly when electric power is supplied to the resistive heating member 5 thereby heating the mounting surface 3. And the heater section 7 can be quickly cooled down by sending cooling air from the nozzle 24 thereto at the same time as the power supply is stopped.

The wafer heating apparatus 1 according to the first embodiment of the present invention is characterized in that the position of the tip of the nozzle 24 as projected onto the other surface of the plate-shaped member 2 is located between the bands of the resistive heating member 5 when viewed in the direction of blowing from the nozzle.

Figure 2:
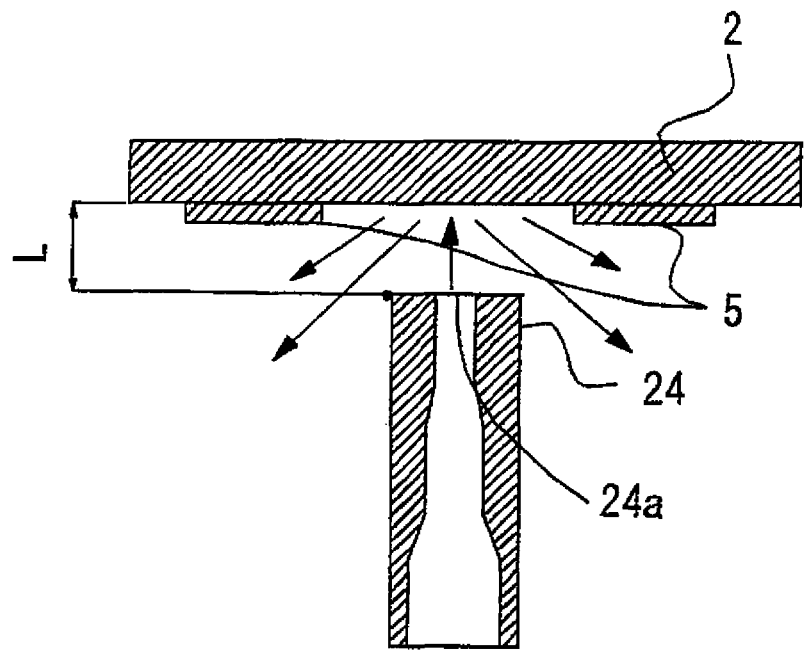
FIG. 2 is an enlarged view showing the relative position of the cooling nozzle and the resistive heating member in the wafer heating apparatus according to the first embodiment.

FIG. 2 is an enlarged view of a part of FIG. 1 (a portion including the plate-shaped member 2, the resistive heating member 5 and the tip 24a of the nozzle 24) showing the relative positions of the tip 24a of the cooling nozzle 24 and the resistive heating member. In the wafer heating apparatus 1 according to the first embodiment, a cooling medium such as cooling air is injected from the nozzle 24 onto the area between the resistive heating members 5, as shown in FIG. 2.

Figure 3:
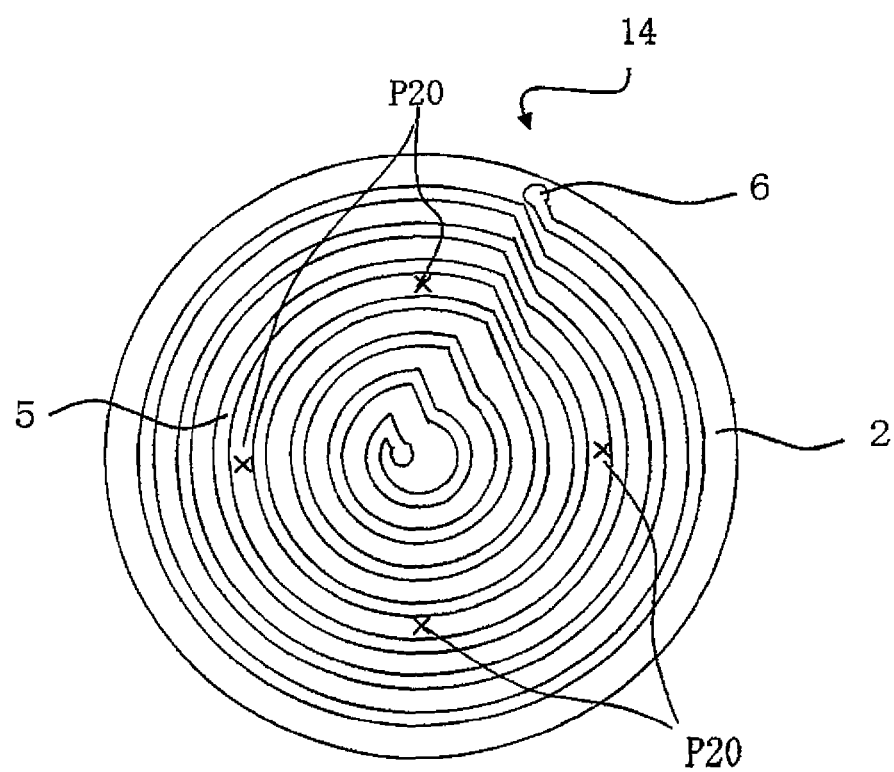
FIG. 3 is a plan view showing the configuration of bands of the resistive heating member formed on the plate-shaped member and the positions of the tips of nozzles in the wafer heating apparatus according to the first embodiment.

The phrase that the tip of the nozzle 24 is located between the resistive heating members 5 means that the center of the tip of the nozzle 24 faces the surface of the plate-shaped member 2 located between the adjacent portions of the resistive heating member 5 as indicated by reference numeral P20 in FIG. 3. Preferably, the center of the tip of the nozzle 24 faces the center between the adjacent portions of the resistive heating member 5. This means that, in the first embodiment, since the surface of the plate-shaped member 2 having a thermal conductivity higher than that of the surface of the resistive heating member 5 is located between the adjacent portions of the resistive heating member 5, the medium discharged from the nozzle 24 directly cools the surface of the plate-shaped member 2. This enables it to efficiently cool the plate-shaped member 2 so as to remove heat from the heater section 7 in a shorter period of time, thereby reducing the time required to cooling the heater section 7.

In case the resistive heating member 5 of the wafer heating apparatus 1 according to the first embodiment comprises a plurality of separate portions, the tip of the nozzle 24 may also be disposed so as to face the surface of the plate-shaped member 2 located between two adjacent portions of the resistive heating member 5.

FIG. 4 is a plan view showing an example of the configuration of the heater section 7 including a plurality of the independent resistive heating members 5. When the tip 12a of the cooling nozzle 24 is caused to face the position P30 located between the plurality of the resistive heating members 5 in the heater section 7 having the constitution described above, the cooling medium discharged from the nozzle 24 directly hits the surface of the plate-shaped member 2 which has high heat conductivity, so as to remove heat from the plate-shaped member 2, thereby enabling it to efficiently cool the heater section 7.

Particularly in the area between the adjacent portions of the resistive heating member 5, in comparison to the area between the adjacent bands of the single resistive heating member 5, a larger surface area can be secured for the portion where the medium discharged from the nozzle 24 directly hits, so as to make it possible to efficiently cool the heater section 7 in a short period of time. It is preferable to apply the cooling medium to the area between the plurality of separate portions of the single resistive heating member 5 in this way, since it enables it to secure a larger surface area where the cooling medium is caused to directly hit the plate-shaped member 2.

In the constitution shown in FIG. 4, one piece of inner resistive heating member 5 having spiral shape is disposed at the center, intermediate resistive heating member 5 having spiral shape is disposed outside of the former with the centers located at the same position (coaxial arrangement), and four outer resistive heating members 5 are disposed outside of the former symmetrically with respect to the center of the plate-shaped member 2 (symmetrical arrangement). That is, in the constitution shown in FIG. 4, the resistive heating members 5 are disposed in an arrangement which combines concentricity and symmetry with the centers of concentricity and symmetry located at the center of the plate-shaped member 2, thereby making it possible to decrease the temperature difference across the surface of wafer and increase the space S between the resistive heating members 5, so that the exposed area of the plate-shaped member 2 can be increased and the heater section 7 can be cooled down efficiently.

While coaxial arrangement and symmetrical arrangement are combined in the constitution shown in FIG. 4, a plurality of resistive heating members may be disposed in symmetrical arrangement or a plurality of resistive heating members may be disposed in concentric arrangement according to the present invention.

In the wafer heating apparatus 1 according to the first embodiment, it is preferable that the plate-shaped member 2 and the resistive heating member 5 have different values of heat conductivity and that heat conductivity of the plate-shaped member 2 is higher than that of the resistive heating member 5.

In the first embodiment, the plate-shaped member 2 is preferably made of a material having high heat conductivity in the portion which receives the flow of cooling medium in order to efficiently cool the plate-shaped member 2. For this reason, the plate-shaped member 2 is required to have high heat conductivity in the portion which receives the flow of cooling medium, and is set higher than that of the resistive heating member 5 in the first embodiment. Also in the first embodiment, the resistive heating member 5 may be formed by printing and baking an electrically conductive paste that includes electrically conductive metal particles, glass frit and metal oxide, with the resultant material having heat conductivity of 1 to 40 W/(m·K), as will be described in detail later. According to the present invention, it is preferable to use the plate-shaped member 2 having higher heat conductivity. The plate-shaped member 2 may be made of, for example, sintered aluminum nitride (heat conductivity 180 W/(m·K)) or sintered silicon carbide (heat conductivity 100 W/(m·K)).

In the wafer heating apparatus 1 according to the first embodiment, in case a plurality of the nozzles 24 are provided, the plurality of nozzles 24 are preferably disposed so that the tips of the nozzles 24 lie on a circle having the center located at the center of the plate-shaped member 2. That is, it is preferable that positions of the tips of the nozzles as projected onto the other surface of the plate-shaped member 2 lie on a circle when viewed in the direction of blowing from the nozzle. In case the resistive heating members 5 are disposed on a circle, it is preferable that this circle and the circle whereon the tips of the nozzles 24 lie do not coincide with each other on the plane of projection (the other surface of the plate-shaped member 2).

Constitution of the resistive heating member 5 is very important for uniformly heating the wafer. In order to uniformly heat the wafer, it is preferable that the resistive heating member 5 is disposed in a pattern which is symmetric with respect to the center of the plate-shaped member 2. In case the resistive heating members 5 of arc shape are located on one or more circles, it is preferable that resistance per unit area is constant along the circle, which enables it to achieve uniform temperature distribution. When the tips of the nozzles lie on the circle where the resistive heating members 5 having arc shape are located in such a casing, it becomes necessary to dispose the resistive heating member 5 so as to avoid this in the nozzle 24 portion, thus resulting in difference in the value of resistance per unit area along the circle which causes non-uniform temperature distribution.

For this reason, it is preferable that positions of the centers of the tips of the plurality of nozzles 24 as projected onto the other surface of the plate-shaped member 2 lie on a circle different from the circle where the resistive heating members 5 having arc shape are located, when viewed in the direction of blowing from the nozzle.

The number of the nozzles 24 is preferably from 4 to 16. When the number of the nozzles 24 is less than 4, each nozzle covers too large an area having too large heat capacity to cool, thus resulting in low cooling efficiency and longer time taken to cool. When the number of the nozzles 24 is more than 16, a large facility having a large capacity of holding gas is required to obtain sufficient levels of gas pressure and velocity required by the nozzle 24, which is not convenient for mass production. Accordingly, the number of the nozzles 24 is preferably from 4 to 16.

It is also preferable that the nozzles 24 are disposed on concentric circles. When the nozzles are not disposed on concentric circles, cooling effect tends to become uneven such that a longer time is taken in cooling some portions with lower cooling efficiency. In order to cool quickly, it is preferable to dispose the nozzles at symmetrical positions, which reduces the time taken in cooling and enables efficient cooling operation.

In the wafer heating apparatus 1 according to the first embodiment, temperature of the plate-shaped member 2 is measured by means of temperature sensor 10 of which distal end is embedded in the plate-shaped ceramic member 2. While the temperature sensor 10 is preferably sheathed type thermocouple having outer diameter of 0.8 mm or less, in consideration of the response characteristic and the ease of maintenance, thermocouple of bare wire type having outer diameter of 0.5 mm or less or a thermistor such RTD may also be used. The distal end of the temperature sensor 10 is preferably secured in a hole formed in the plate-shaped member 2 while being pressed against the inner wall surface of the hole by means of a fastening member provided in the hole, in order to ensure the reliability of measurement.

Second Embodiment

The wafer heating apparatus according to second embodiment of the present invention will now be described with reference to the accompanying drawings.

Figure 5A:
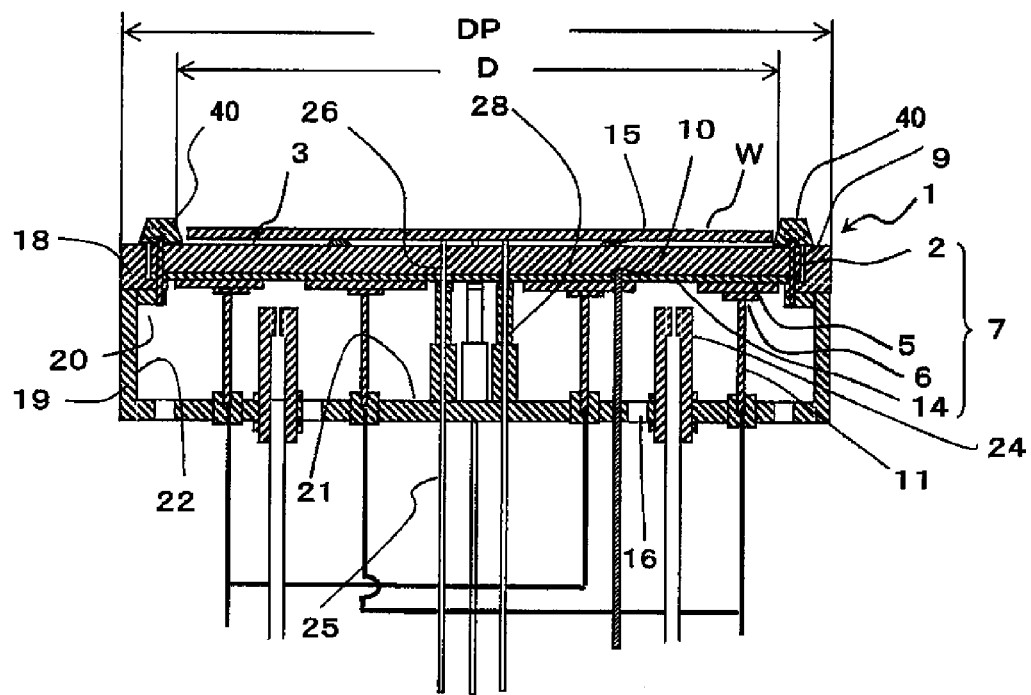
FIG. 5A is a sectional view showing the constitution of the wafer heating apparatus according to second embodiment of the present invention.
Figure 5B:
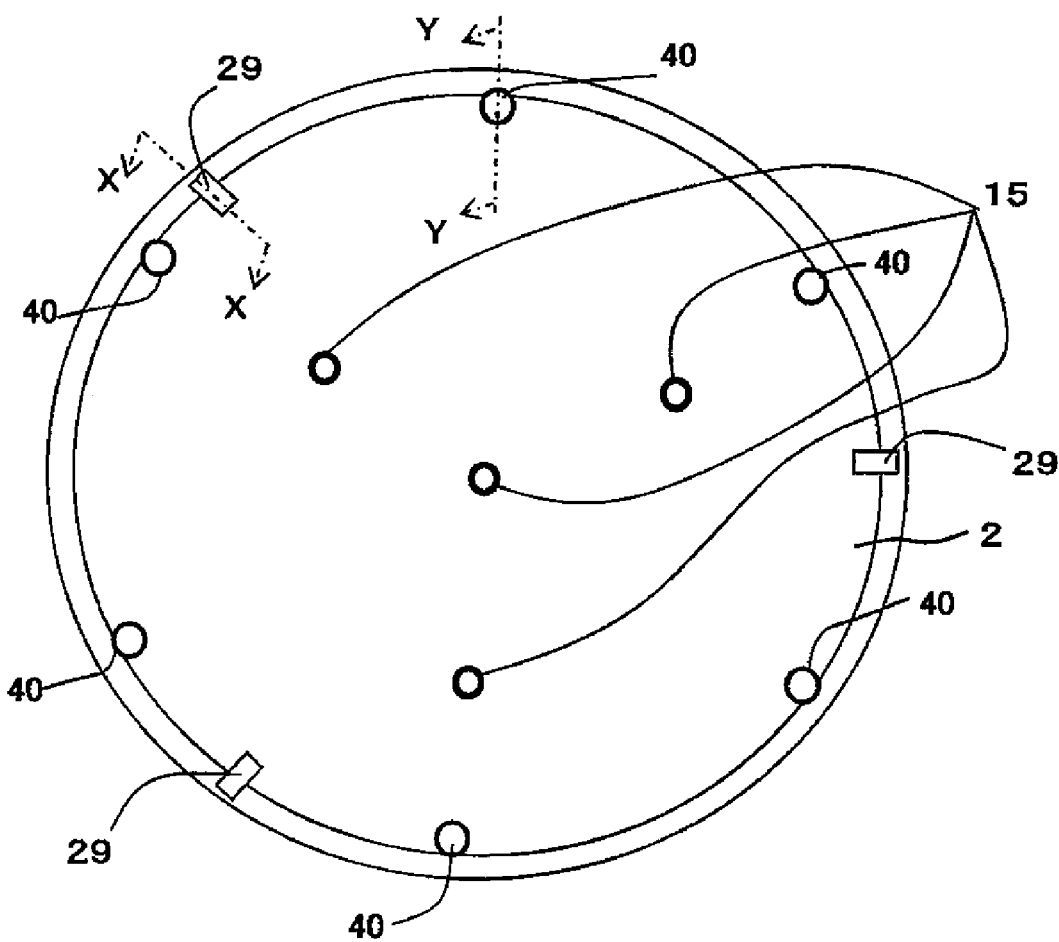
FIG. 5B is a plan view showing the constitution of the wafer heating apparatus according to the second embodiment of the present invention.

FIG. 5A is a sectional view showing the constitution of the wafer heating apparatus according to the second embodiment of the present invention, and FIG. 5B is a top view thereof.

The wafer heating apparatus 1 of the second embodiment comprises the plate-shaped member 2, having one of the principal surfaces thereof serving as the mounting surface 3 to mount a wafer W thereon and the other principal surface having the band-shaped resistive heating member 5 formed thereon via the insulation layer 14, and the casing 19 having the opening 16, with the power feeder terminals 11 connected to the power feeder section 6, the cooling nozzle 24 and pin guide 28 having through hole provided in the casing 19. In the wafer heating apparatus 1 of the second embodiment, the heater section 7 is constituted from the plate-shaped member 2, the insulation layer 14, the resistive heating member 5 formed thereon and the power feeder sections 6 formed at both ends thereof. The plate-shaped member 2 is formed from, for example, ceramics consisting of silicon carbide or aluminum nitride having a high heat conductivity as the main component. The insulation layer 14 is formed from, for example, an insulating material such as glass or resin which can bond well with the plate-shaped member 2. The plate-shaped member 2 is fastened onto the casing 19 via the heat insulating member 18 by means of screws 40 or the like.

A wafer lift pin 25 is inserted into a through hole of the pin guide 28 attached to the casing 19 and into a through hole of the plate-shaped member 2 formed coaxially with the through hole of the pin guide 28, so as to move the wafer W vertically. This enables it to load the wafer W onto the mounting surface 3 or unload it therefrom.

Figure 6:
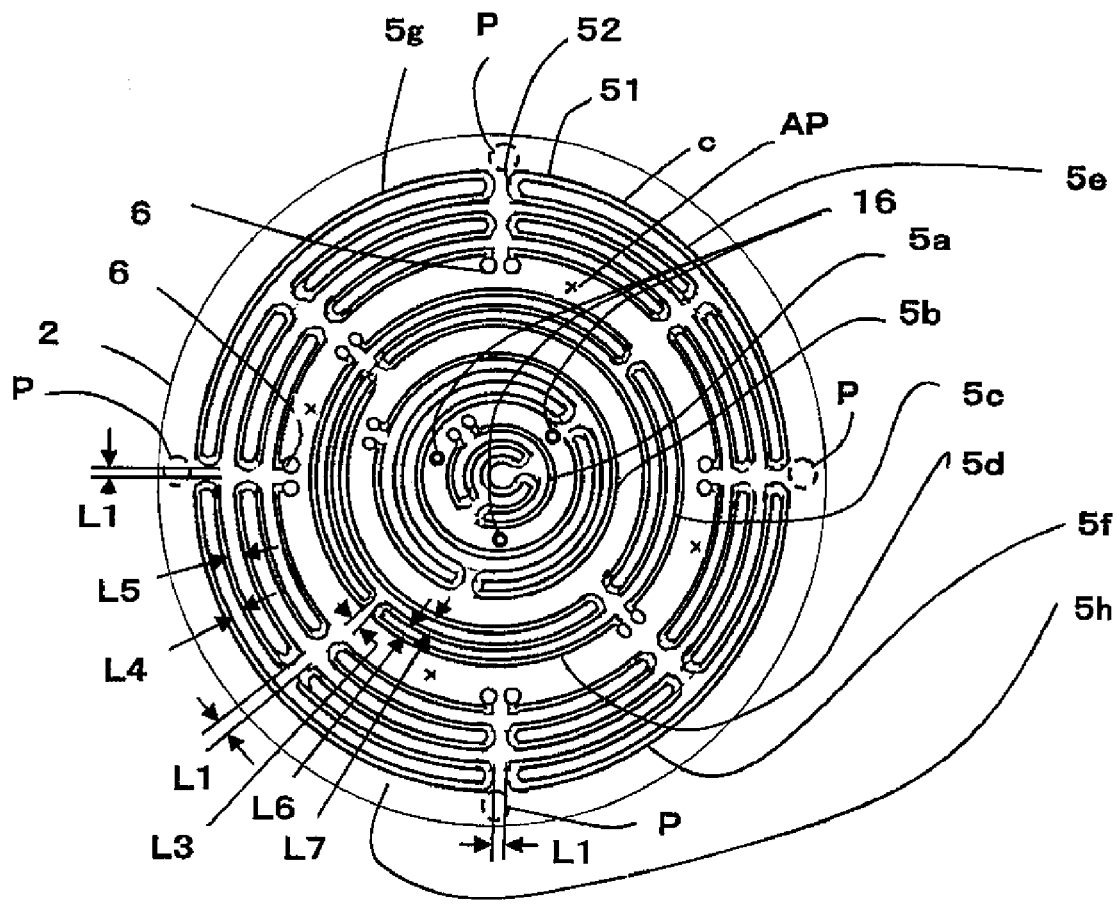
FIG. 6 is a front view showing the constitution of the resistive heating member of the wafer heating apparatus according to the second embodiment.
Figure 7A:
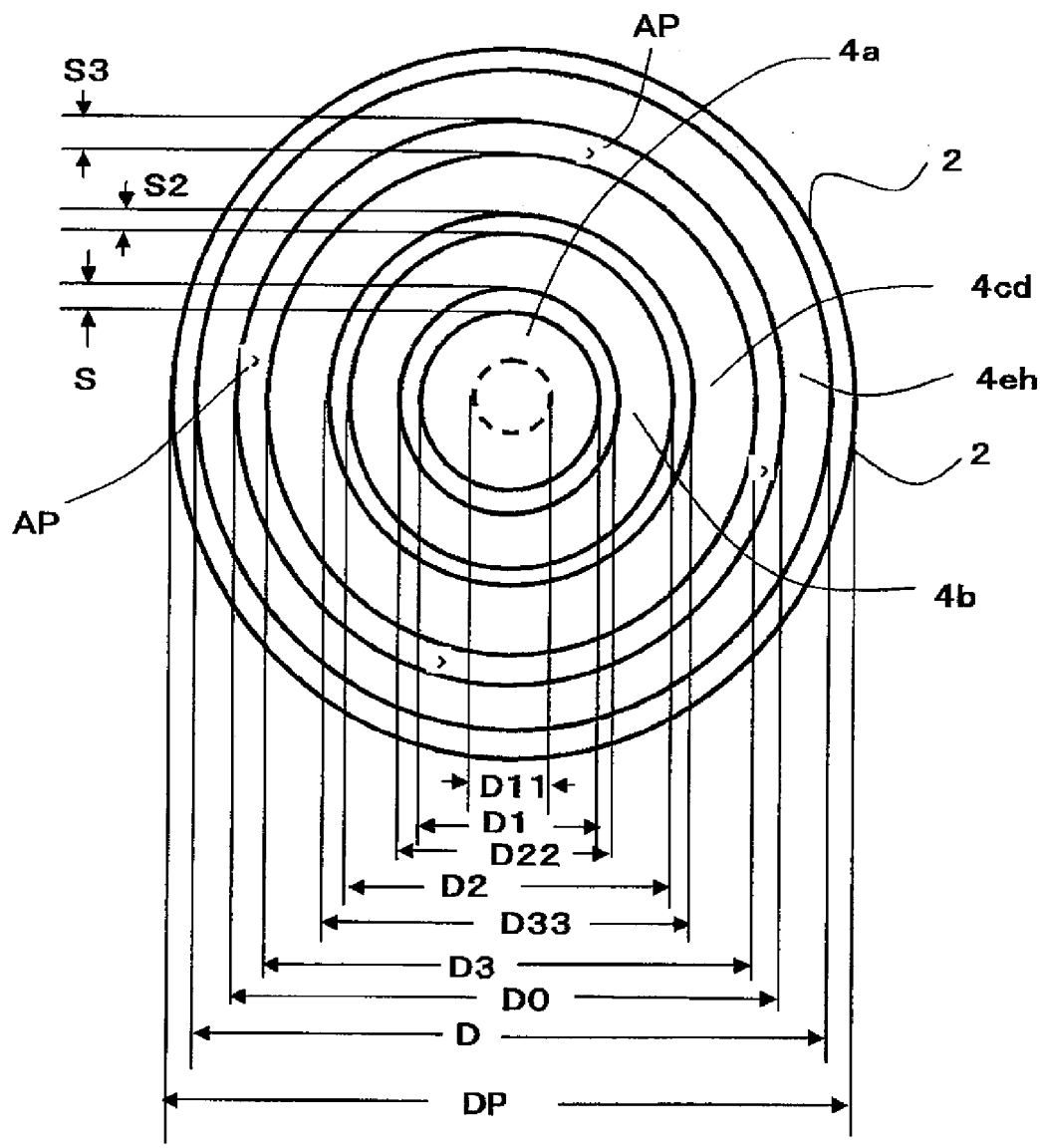
FIG. 7A is a diagram showing the resistive heating member zone of the wafer heating apparatus according to the second embodiment.
Figure 7B:
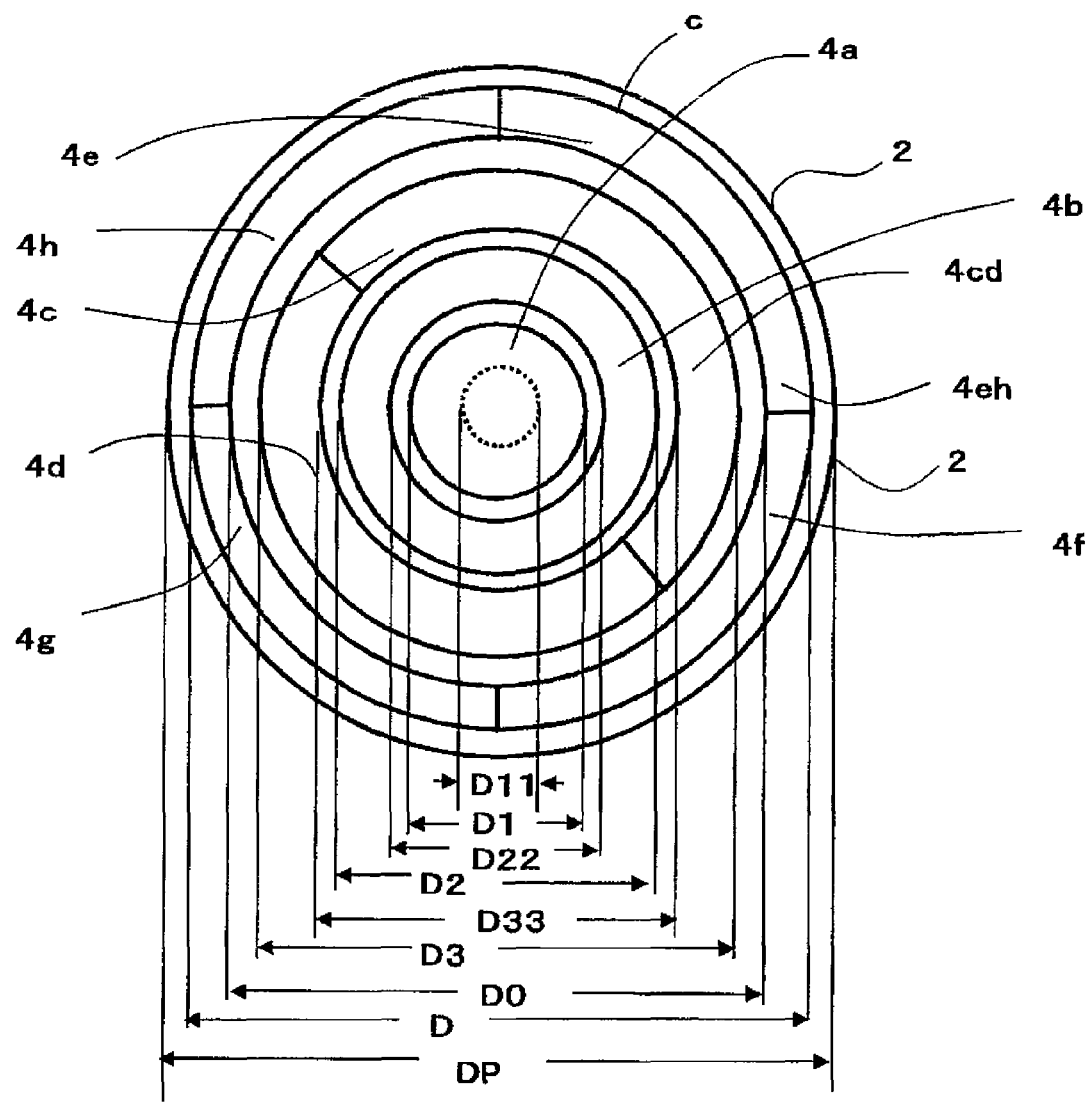
FIG. 7B is a diagram showing an example of dividing the ring-shaped resistive heating member zone of the wafer heating apparatus according to the second embodiment.

FIG. 6 is a front view showing the configuration of the resistive heating member 5 in the wafer heating apparatus of the second embodiment. In the second embodiment, the resistive heating member 5 comprises a plurality of separate portions of resistive heating member 5a, 5b, 5c, 5d, 5e, 5f, 5g, 5h, and the portions of resistive heating member 5a through 5h are disposed in the corresponding resistive heating member zones 4a through 4h. FIGS. 7A, 7B show the divided resistive heating member zone 4 wherein the portions of the resistive heating member 5a through 5h, respectively, are placed.

In the second embodiment, the portions of the resistive heating member 5a, 5b, 5c, 5d, 5e, 5f, 5g, 5h are formed in narrow consecutive band, each comprising a first arced section 51 of substantially the same width along an arc having center located at the center of the plate-shaped member 2 and a substantially semicircle-shaped band (linkage portion) 52 which connects the first arced sections 51. That is, the portions of the resistive heating member 5a, 5b, 5c, 5d, 5e, 5f, 5g, 5h each consists of a long bending resistive heating member formed in meandering shape where the first arced sections 51 is turned back 180 degrees in the turn-back section 52, with the power feeder sections 6 provided on both ends. The meandering portions of resistive heating member 5a through 5h are disposed in the corresponding resistive heating member zones 4a through 4h. The power feeder sections 6 may not be disposed in the resistive heating member zone 4a through 4h. In the second embodiment, the turn-back section 52 is formed as a second arced section having a radius of curvature sufficiently smaller than that of the first arced section 51, as shown in FIG. 6.

The resistive heating member zone in the wafer heating apparatus of the second embodiment is defined as follows.

The resistive heating member zone 4a is defined as the area inside of the circle circumscribing the first arced section 51 which is the outermost portion of the resistive heating member 5a.

The resistive heating member zone 4b is defined as the area between the circle circumscribing the first arced section 51 which is the outermost portion of the resistive heating member 5a and the circle inscribing the first arced section 51 which is located at the innermost position.

The resistive heating member zone 4cd is defined as the area between the circle circumscribing the first arced section 51 which is the outermost portion of the resistive heating member 5c and the resistive heating member 5d and the circle inscribing the first arced section 51 which is located at the innermost position.

The resistive heating member zone 4cd is divided into resistive heating member zone 4c and resistive heating member zone 4d with center angle of 180 degrees, where the resistive heating member 5c and the resistive heating member 5d are formed, respectively.

The resistive heating member zone 4eh is defined as the area between the circle circumscribing the first arced section 51 which is the outermost portion of the resistive heating member 5e and the resistive heating member 5h and the circle inscribing the first arced section 51 which is located at the innermost position.

The resistive heating member zone 4eh is divided into four portions of resistive heating member zones 4e, 4f, 4g, 4h with center angle of 90 degrees, where the resistive heating members 5e through 5h are formed, respectively.

According to the present invention, heating operation can be controlled independently in each of the resistive heating member zones 4a through 4h. The resistive heating member provided in each zone is controlled independently so as to minimize the temperature difference across the surface of wafer. In the second embodiment, the resistive heating member zone 4a is a circular zone having a predetermined radius with the center located at the center of the plate-shaped member 2. The resistive heating member zones 4b through 4h are ring-shaped zones that are interposed between an inner arc and an outer arc having center corresponding to the center of the plate-shaped member 2, located outside of the resistive heating member zone 4, or zones made by dividing the ring-shaped zone. The zones 4a and 4b may also be a single continuous circular zone. Thus since heating of the resistive heating member 5 provided in each resistive heating member zone 4 of the wafer heating apparatus of the second embodiment can be controlled independently, it is made possible to minimize the temperature difference across the surface of wafer. According to the present invention, the resistive heating member 5 may also have such a configuration as the turn-back portion 52 which connects the first arced sections 51 is a straight line or a curve instead of an arc.

Formed at the ends of the resistive heating member 5 are power feeder sections 6 made of a material such as gold, silver, palladium or platinum. Connection to an external electric power source can be established by pressing the power terminals 11 onto the power feeder section 6 by means of an elastic member. The power terminals 11 may also be directly connected to the resistive heating member 5 by soldering, brazing or the like.

The metal casing 19 has the side wall 22 and the base plate 21, and the plate-shaped member 2 is disposed to oppose the base plate 21 so as to cover the top of the casing 19. The base plate 21 has the opening 16 formed therein for discharging cooling gas, the power feeder terminals 11 connected to the power feeder section 6, the cooling nozzle 24 for cooling the plate-shaped member 2 and the temperature sensor 10 for measuring the temperature of the heater section 7.

The plate-shaped member 2 and the casing 19 are held together by means of bolts 40 along the periphery thereof, and these members are held together by screwing nuts via the heat insulation member 18 so that the plate-shaped member 2 and the casing 19 do not direct contact with each other. In the second embodiment, the heat insulating member 18 having L-shaped cross section is used so as to surround the plate-shaped member 2 on the side face along the periphery with the heat insulating member 18.

The wafer heating apparatus according to the second embodiment having the constitution described above is capable of heating the wafer W uniformly when electric power is supplied to the resistive heating member 5 thereby heating the mounting surface 3. And the heater section 7 can be quickly cooled down by sending cooling gas from the nozzle 24 at the same time as the power supply is stopped.

The wafer heating apparatus 1 of the present invention is characterized in that the position of the tip 24a of the nozzle 24 as projected onto the other surface of the plate-shaped member is located between the bands of the resistive heating member 5, more preferably between adjacent resistive heating member zones 4. Since the surface between the resistive heating member 5 can easily transfer heat via the insulation layer 14 to the plate-shaped member 2, and the tip 24a of the nozzle 24 is located between the resistive heating member 5, it is made possible to apply the cooling gas such as air discharged from the nozzle directly to the surface of the insulation layer 14 so that heat can be transferred via the surface of the insulation layer 14 from the plate-shaped member 2 efficiently to the cooling gas. As a result, heat can be removed quickly from the plate-shaped member 2, thereby to cool down the heater section 7 in a short time.

The resistive heating member 5 preferably has such a configuration as the plurality of first arced sections 51 that have substantially the same width throughout its length and are turned back in the linkage portion are disposed substantially concentrically as shown in FIG. 6, which enables it to minimize the temperature difference across the surface of wafer mounted on the mounting surface 3. It is further preferable that distance L1 of the turn-back portion 52 between the adjacent resistive heating members (for example, between the resistive heating member 5g and the resistive heating member 5h) is smaller than the distance L4 of the first arced section 51, since this enables it to make temperature difference across the surface of wafer further smaller. It is also preferable that distance L3 of the turn-back portion 52 in the same resistive heating member 5 is smaller than the distance L6 of the first arced section 51, since this enables it to make temperature difference across the surface of wafer further smaller.

Figure 8:
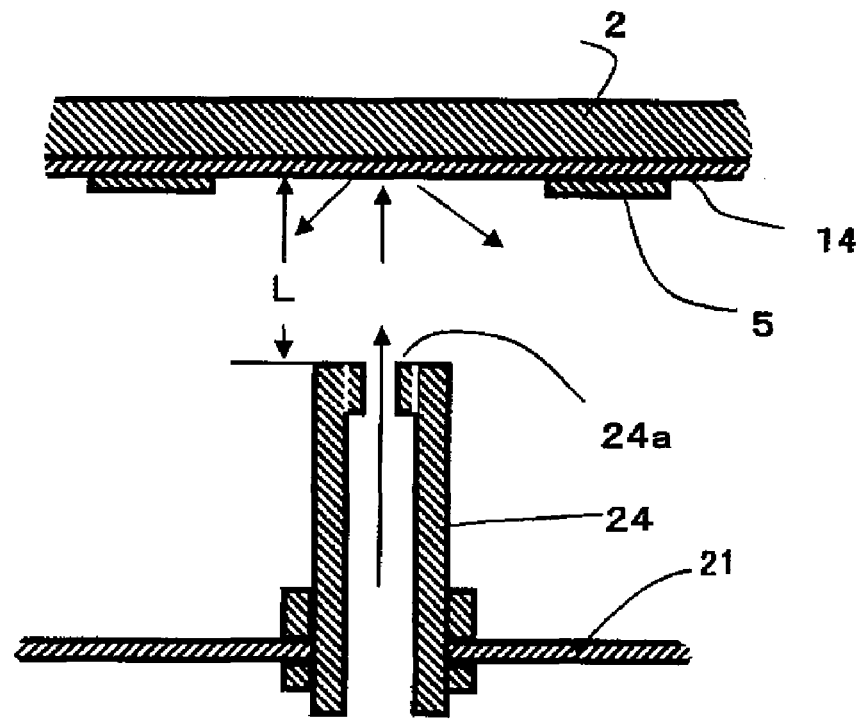
FIG. 8 is a sectional view showing the insulation layer and the resistive heating member formed on the plate-shaped member and the positions of the tips of the nozzles in the wafer heating apparatus according to the second embodiment.

FIG. 8 is an enlarged sectional view showing the tip of one cooling nozzle 24 and the plate-shaped member 2, the insulation layer 14 and the resistive heating member 5 disposed around thereof. As shown in FIG. 8, in the wafer heating apparatus 1 of the second embodiment, the cooling gas such as air discharged from the nozzle 24 hits a space between the resistive heating members 5. The phrase that the tip of the nozzle 24 is located between the resistive heating member 5 means that the center of the tip of the nozzle 24 faces the surface of the plate-shaped member 2 located between the adjacent portions of the resistive heating member 5 as indicated by reference numeral AP in FIG. 7. Preferably, the center of the tip of the nozzle 24 faces the center between the adjacent portions of the resistive heating member 5. This means that, in the first embodiment, since the surface of the plate-shaped member 2 having a thermal conductivity higher than that of the surface of the resistive heating member 5 is located between the adjacent portions of the resistive heating member 5, the medium discharged from the nozzle 24 directly cools the surface of the plate-shaped member 2. This enables it to efficiently cool the plate-shaped member 2 so as to remove heat from the heater section 7 in a shorter period of time, thereby reducing the time of cooling the heater section 7.

Figure 9A:
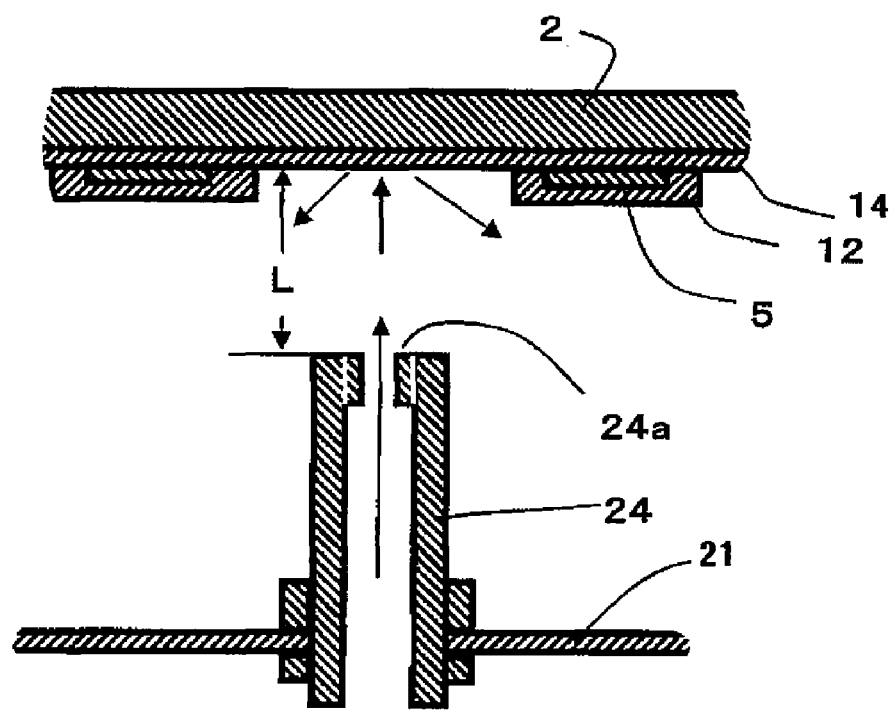
FIG. 9A is a sectional view showing the insulation layer that covers the resistive heating member formed on the plate-shaped member and the positions of the tips of the nozzles in the wafer heating apparatus according to the second embodiment.

FIG. 9A is a sectional view (sectional view showing a part of section enlarged) showing an example of the second embodiment where an insulation layer (insulation coverage layer) 12 further on the surface of the resistive heating member 5. In this example, the resistive heating member 5 is formed on the insulation layer 14, and the insulation layer 12 is formed so as to cover the resistive heating member 5. Relative positions of the heater section 7 and the nozzle 24 are similar to the case shown in FIG. 8.

When the insulation layer 12 is formed on a part or the entire top surface of the resistive heating member 5, surface of the resistive heating member 5 can be protected. Thus the surface of the resistive heating member 5 will not be damaged or contaminated when the cooling gas flows over the resistive heating member 5, and the chronic change can be reduced after repetitive cycles of heating and cooling the resistive heating member 5, thereby improving the durability.

More specifically, the resistive heating member 5 is formed from an insulating material based on glass including electrically conductive particles made of a noble metal dispersed therein, and may experience chronic change if the surface of the resistive heating member 5 is exposed or the resistive heating member 5 may come off due to thermal strain if the resistive heating member 5 is exposed to the cooling gas, while the insulation layer 12 prevents these troubles from occurring. That is, covering the resistive heating member 5 with the insulation layer 12 makes it possible to mitigate the occurrence of thermal strain in the resistive heating member 5, so that resistance of any part of the resistive heating member 5 does not change even when the wafer heating apparatus 1 repeats heating and cooling cycles, thus improving the durability and heating the surface of the wafer W uniformly. It suffices to form the insulation layer 12 over an area that can cover the resistive heating member 5. It is preferable that the area covered by the insulation layer 12 is not larger than necessary. It is preferable that the insulation layers 12a, 12b, 12cd, 12eh are independent in correspondence to the resistive heating member zones 4a, 4b, 4cd and 4eh, as will be described in detail later. The resistive heating member zone 4cd is the ring-shaped region that combines the resistive heating member zone 4c and the resistive heating member zone 4d, and the resistive heating member zone 4eh is the ring-shaped region that combines the resistive heating member zone 4e, the resistive heating member zone 4f, the resistive heating member zone 4g and the resistive heating member zone 4h.

Figure 9B:
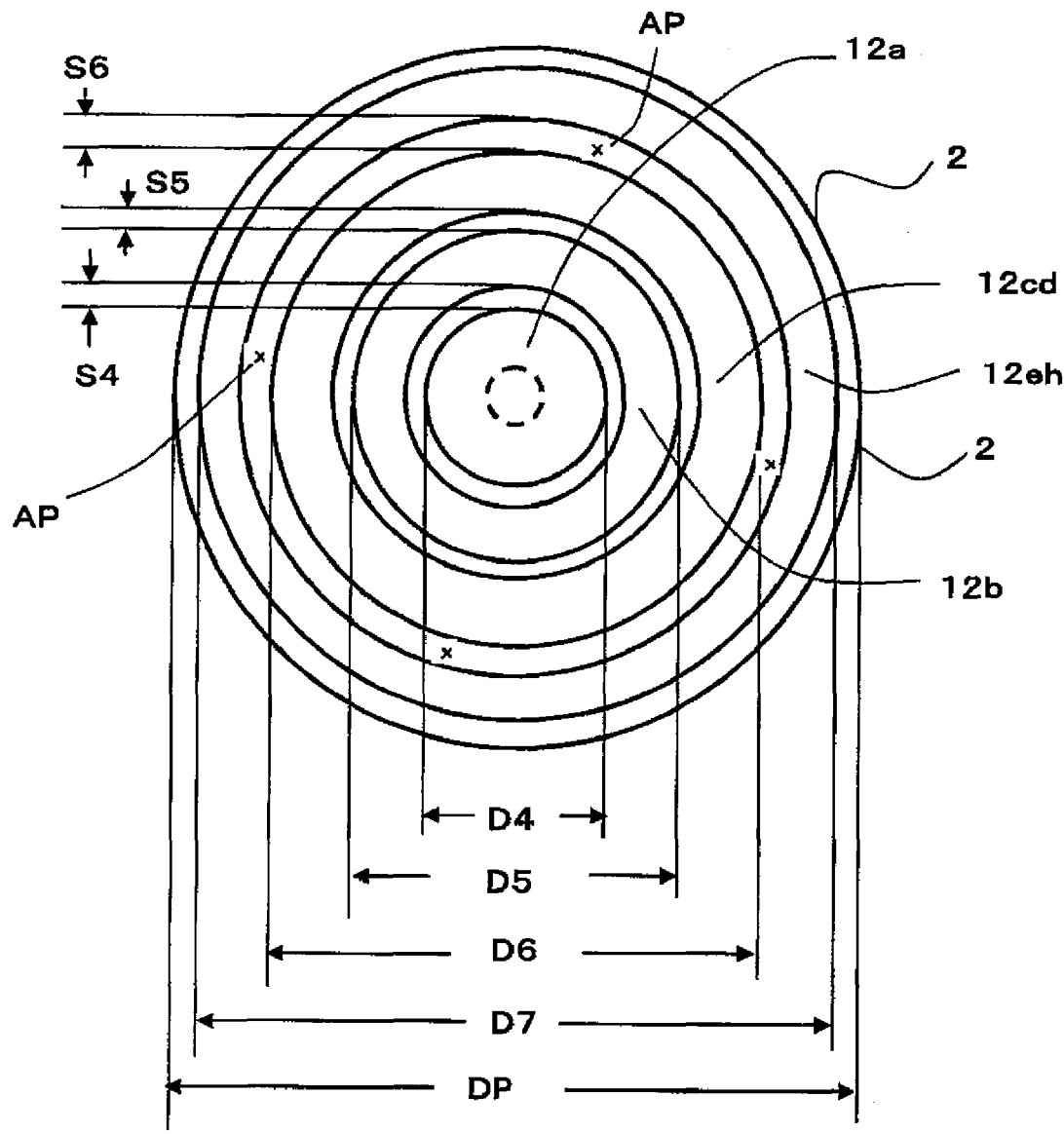
FIG. 9B is a diagram showing an example of the ring-shaped insulation layer in the wafer heating apparatus according to the second embodiment.

FIG. 9B is a plan view showing the positional relationship between the plate-shaped member 2, the insulation layers 12 (12a, 12b, 12cd, 12eh) and the tip 24a of the nozzle 24. According to the second embodiment, in the wafer heating apparatus 1 having the insulation layer 12 which covers the resistive heating member 5, the position of the tip 24a of the nozzle 24 as projected onto the other surface of the plate-shaped member 2 is located between the insulation layers 12 (between the insulation layer 12cd and the insulation layer 12eh in the example shown in FIG. 9B), so that the cooling gas such as air blown from the nozzle 24 is applied to between the insulation layers 12 that cover the resistive heating member 5. Since the insulation layer 12 is not formed at this position, heat of the plate-shaped member 2 can be transferred efficiently through the insulation layer 14. Since the cooling gas discharged from the nozzle 24 directly cools the insulation layer 14 on the surface of the plate-shaped member 2, so as to enable it to efficiently cool the plate-shaped member 2 and remove heat from the heater section 7 in a shorter period of time, thereby reducing the time of cooling the heater section 7.

Figure 10:
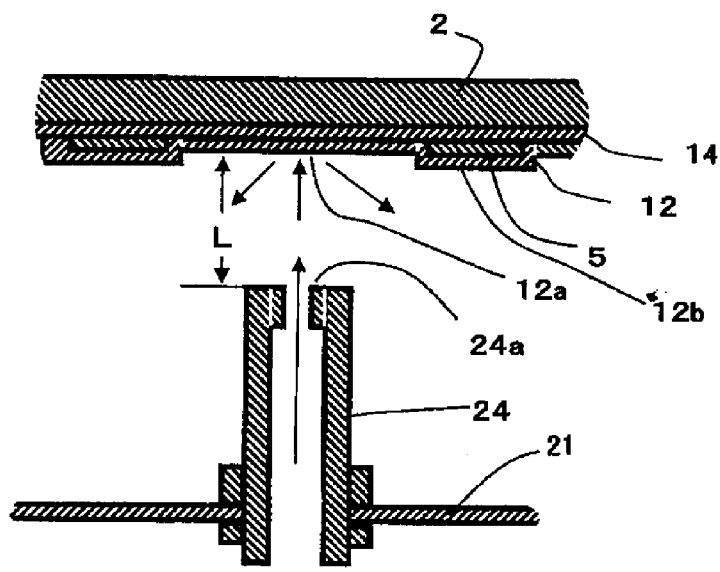
FIG. 10 is a sectional view showing the insulation layer and the resistive heating member formed on the plate-shaped member and the positions of the insulation layer that covers the former and the nozzle tips in a variation of the wafer heating apparatus according to the second embodiment.

FIG. 10 shows another example where the insulation layer 12 is formed on the resistive heating member 5. The insulation layer 12 is formed not only on the top surface of the resistive heating member 5 but also on the insulation layer 14. Here the portion of the insulation layer 12 formed on the insulation layer 14 is called the insulation layer 12a, and the portion of the insulation layer 12 formed on the resistive heating member 5 is called the insulation layer 12b. While the surface of the plate-shaped member 2 located between the resistive heating member is covered by the insulation layer 12a or the insulation layer 14, it is easier to transfer the heat to the plate-shaped member 2 through the insulation layer 12a than through the insulation layer 12b formed on the resistive heating member 5. Therefore, the plate-shaped member 2 can be cooled efficiently when the nozzle 24 is disposed so that the projected position of the tip thereof falls at a position between the resistive heating members 5, so as to cause the cooling gas discharged from the nozzle 24 to cool the insulation layer 12a between the resistive heating members 5.

FIG. 7A is a schematic diagram showing an example of division of the resistive heating member zone 4 according to the present invention. The resistive heating member zone 4 is defined in the other principal surface of the plate-shaped member 2. According to the second embodiment, it is preferable that the resistive heating member zone 4a of circular shape is located at the center of the plate-shaped member 2 and two or three concentric resistive heating member zones of ring shape are provided on the outside thereof. In the example shown in FIG. 7A, the resistive heating member zone 4a, the resistive heating member zone 4cd and the resistive heating member zone 4eh of concentric circles are provided on the outside of the resistive heating member zone 4a. The resistive heating member zone 4a and the resistive heating member zone 4b may be connected into a single resistive heating member zone.

In the second embodiment, in order to improve the uniformity of heating the wafer W, it is more preferable to divide the ring-shaped resistive heating member zone having a relatively large surface area located on the outside (for example, 4cd, 4eh) into 2, 3 or 4 resistive heating member zones. The divided configuration will be described later with reference to FIG. 7B. Heating of the surface of the disk-shaped wafer W is affected by the atmosphere around the wafer W, wall surface opposing the wafer W and the gas flow. Therefore, it is preferable to design such that the atmosphere around the wafer W, wall surface opposing the wafer W and the flow of gas become symmetric with respect to the center of the wafer W, in order to minimize the temperature difference across the surface of wafer. In order to heat the wafer W uniformly, it is necessary to use the wafer heating apparatus 1 suited to the situation symmetric with respect to the center of the wafer W. It is preferable to form the resistive heating member zone 4 by dividing the mounting surface 3 in a configuration symmetric with respect to the center.

In order to uniformly heat the surface of a wafer W measuring 300 mm or more, in particular, it is preferable to provide the ring-shaped resistive heating member zones in two or more concentric circles.

The wafer heating apparatus 1 having plurality of the resistive heating member 5 corresponding to the plurality of ring-shaped resistive heating member zones formed in the concentric circles is capable of controlling and correcting the slight deviation from symmetry in the environment and the variation in thickness of the symmetric heating member individually for each resistive heating member, and therefore the temperature difference across the surface of wafer can be decreased further.

FIG. 7B is a plan view showing another example of the resistive heating member zone 4 in the wafer heating apparatus 1 according to the second embodiment. This is a preferable example wherein, among the three ring-shaped resistive heating member zones shown in FIG. 7A, the resistive heating member zone 4eh located outside is divided into four equal fan-shaped resistive heating member zones 4e, 4f, 4g, 4h, and the resistive heating member zone 4cd located inside is divided in the circumferential direction into two equal fan-shaped resistive heating member zones 4c, 4d. Specifically, among the three ring-shaped resistive heating member zones 4b, 4cd and 4eh, the innermost ring-shaped resistive heating member zone 4b is the ring-shaped resistive heating member zone 4b consisting of a ring, while the resistive heating member zone 4cd located outside thereof is divided into two equal parts of fan-shaped resistive heating member zones 4c, 4d, and the resistive heating member zone 4eh located outside thereof is divided in the circumferential direction into four equal parts of fan-shaped resistive heating member zones 4e, 4f, 4g and 4h. Such a configuration is preferable as it achieves uniform temperature distribution over the surface of the wafer W, by dividing the ring located at the outer position into larger number of parts.

The resistive heating member zones 4a through 4g of the wafer heating apparatus 1 shown in FIG. 7B are provided with the resistive heating members 5a through 5g that can independently control the heat generation, respectively.

However, the zone 4a and the zone 4b may be connected with each other in parallel or series so as to be controlled as a single circuit, if the outside environment of the wafer heating apparatus 1 would not be changed frequently. With this constitution, a through hole for inserting the lift pin that lifts the wafer W can be provided between the zone 4a and the zone 4b.

While the ring-shaped resistive heating member zone 4cd is divided into two parts each having center angle of 180 degrees and the ring-shaped resistive heating member zone 4eh is divided into four parts each having center angle of 90 degrees in the second embodiment, the present invention is not limited to this constitution and the zone may be divided into three or more parts.

In FIG. 7B, the resistive heating member zones 4c, 4d are divided by a straight border line, but it needs not necessarily be a straight line and may be a wavy line. The resistive heating member zones 4c, 4d are preferably symmetrical with respect to the center of the resistive heating member zone.

Similarly, border lines between the resistive heating member zones 4e and 4f, 4f and 4g, 4g and 4h and 4h and 4e need not necessarily be straight lines but may be wavy lines. These zones are also preferably symmetrical with respect to the center of the resistive heating member zone.

According to the present invention, it is preferable to form the resistive heating members 5 by printing method or the like, and the resistive heating members 5 have dimensions of 1 to 5 mm in width and 5 to 50 μm in thickness. When a large area is printed at a time, there may arise unevenness in thickness of the printed layer due to difference in pressure between a squeegee and a screen across the printed surface. Especially when the resistive heating member 5 is large in size, thickness of the resistive heating member 5 becomes uneven across the surface, resulting in varying amount of heat generated. Varying amount of heat generated leads to larger temperature difference across the surface of the wafer W. In order to prevent difference in temperature from occurring due to the varying thickness of the resistive heating member, it is effective to divide the resistive heating member 5 of large diameter.

In the example of the second embodiment shown in FIG. 7A, the area of the resistive heating member 5 to be printed in the resistive heating member zone 4 can be made smaller since the ring-shaped resistive heating member zone 4cd of the concentric rings except for the central portion of the wafer W mounting surface 3 is divided into two parts, and the ring-shaped resistive heating member zone 4eh of the larger ring is divided into four parts. As a result, thickness of the resistive heating member 5 can be made uniform. Moreover, slight difference in temperature across the surface of the wafer W can be corrected and uniform temperature distribution over the surface of the wafer W can be achieved. In order to make fine adjustment of resistance of the band of the resistive heating member 5, a long groove may be formed along the resistive heating member by means of laser or the like, thereby adjusting the resistance.

The resistive heating members 5a, 5b, 5c, 5d, 5e, 5f, 5g, 5h shown in FIG. 6 each consists of the first arced sections 51 and the linkage section 52 which is a turn-back band. The linkage section 52 preferably has arc shape rather than straight, since arc shape enables it to minimize the temperature difference across the surface of wafer.

In the wafer heating apparatus 1 according to the present invention, it is preferable that distance S3 between the resistive heating member zone 4cd and the outermost ring-shaped resistive heating member zone 4eh is larger than the distance S2 between the resistive heating member zone 4b and the resistive heating member zone 4cd as shown in FIG. 7A. When the distance S3 of the outside is larger than the distance S2 of the inside in a constitution where two or three ring-shaped resistive heating member zones 4 are provided, the large width S3 of the ring-shaped resistive heating member zone 4 where the resistive heating member 5 is not formed enables it to expose a larger portion of the surface of the plate-shaped member 2 which is not covered by the resistive heating member 5, thereby increasing the effect of cooling. It also increases the heat conductivity of the plate-shaped member 2 via the insulation layer that constitutes the exposed portion, thus resulting in higher efficiency of cooling and faster rate of cooling the heater section 7.

It is preferable that a plurality of the nozzles 24 are provided in such a manner that the tips 24a thereof are projected onto the area between the outermost ring-shaped resistive heating member zone 4eh and the resistive heating member zone 4cd located inside thereof in the other surface of the plate-shaped member 2. While the ring-shaped region having width S3 is devoid of the resistive heating member where the plate-shaped member 2 having high heat conductivity is covered by the insulation layer 14 and the insulation layer 12, there occurs large heat transfer from the surface to the plate-shaped member 2 and the cooling gas discharged from the top 24a of the nozzle 24 directly hits this portion so that heat can be removed quickly from the plate-shaped member 2, thereby to cool down the heater section 7 in a short time. It is preferable that a plurality of the cooling nozzles 24 are provided along the region of width S3. For example, in the case of processing a wafer measuring 200 to 300 mm in diameter, the number of nozzles 24 is preferably 4 to 16 which enables it to effectively cool down the heater section 7. While the cooling nozzles 24 are provided along the region of width S3 in the example described above, it is preferable to provide a plurality of nozzles 24 in the mid portion along a circle since it is difficult to decrease the temperature of the mid portion with the nozzles provided only in the region of width S3.

In the wafer heating apparatus 1 of the present invention, it is preferable to make the surfaces of the insulation layers 12, 14 and/or the resistive heating member 5 unsmooth. When the surface of the insulation layer 14 which opposes the tip of the nozzle 24 shown in FIG. 8 and FIG. 9 and the surface of the insulation layer 12a shown in FIG. 10 have protrusions and recesses, the cooling gas discharged from the nozzle 24 hits the surface having protrusions and recesses of the insulation layers 12, 14 and the heat of the plate-shaped member 2 is transferred efficiently via the insulation layers 12, 14 to the cooling gas. In other words, this constitution is preferable since it makes heat exchange with the cooling gas easier to undergo on the surface having protrusions and recesses, thus increasing the effect of cooling the heater section 7. When the surface of the resistive heating member 5 shown in FIG. 8 has protrusions and recesses, a part of the cooling gas that has hit the insulation layer 14 flows along the insulation surface 14 and passes the surface of the resistive heating member 5 while carrying out heat exchange with higher efficiency with the surface of the resistive heating member 5, thus resulting in improved effect of removing heat from the heater section 7 via the resistive heating member. It is more preferable that the resistive heating member 5 and the insulation layer 14 have surface having protrusions and recesses.

When the surfaces of the insulation layers 12, 14 and the resistive heating member 5 have protrusions and recesses, should microscopic cracks occur in the insulation layers 12, 14 and the resistive heating member 5 due to thermal stress generated by the difference in thermal expansion between the insulation layers 12, 14 and the resistive heating member 5 and the plate-shaped member 2, the protrusions and recesses of the surface mitigate the stress at the tips of the cracks, so as to prevent the cracks from developing.

Figure 11:
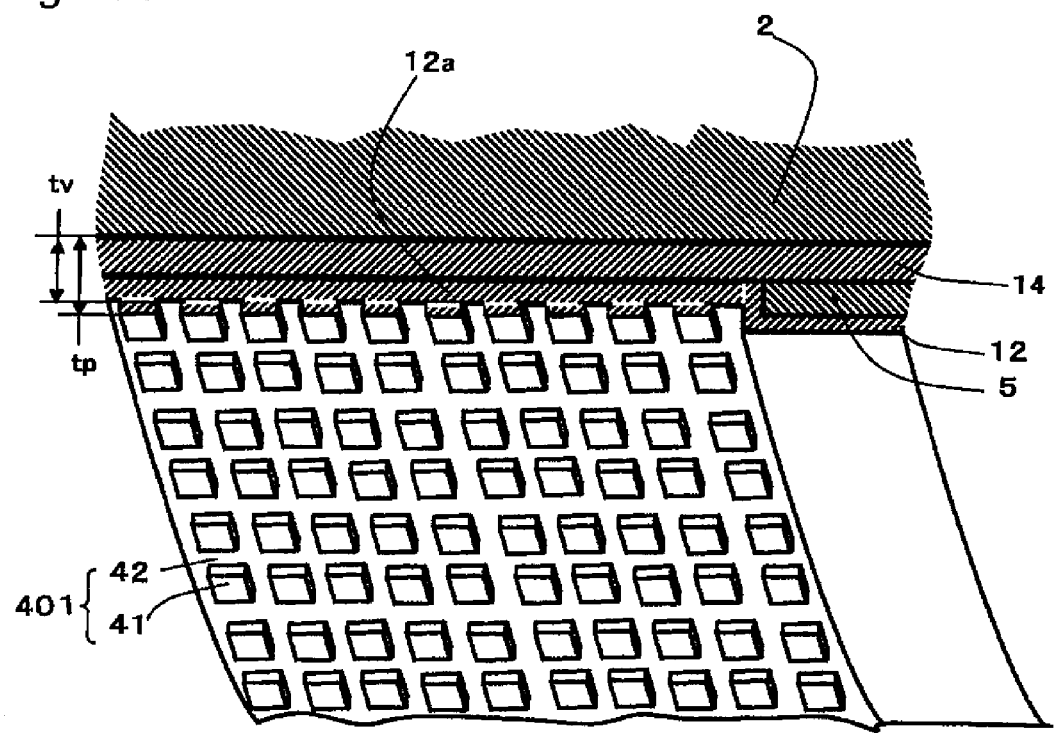
FIG. 11 is a partially enlarged perspective view showing the surface having protrusions and recesses of the insulation layer located between the resistive heating members in a preferable example of the second embodiment.
Figure 12:
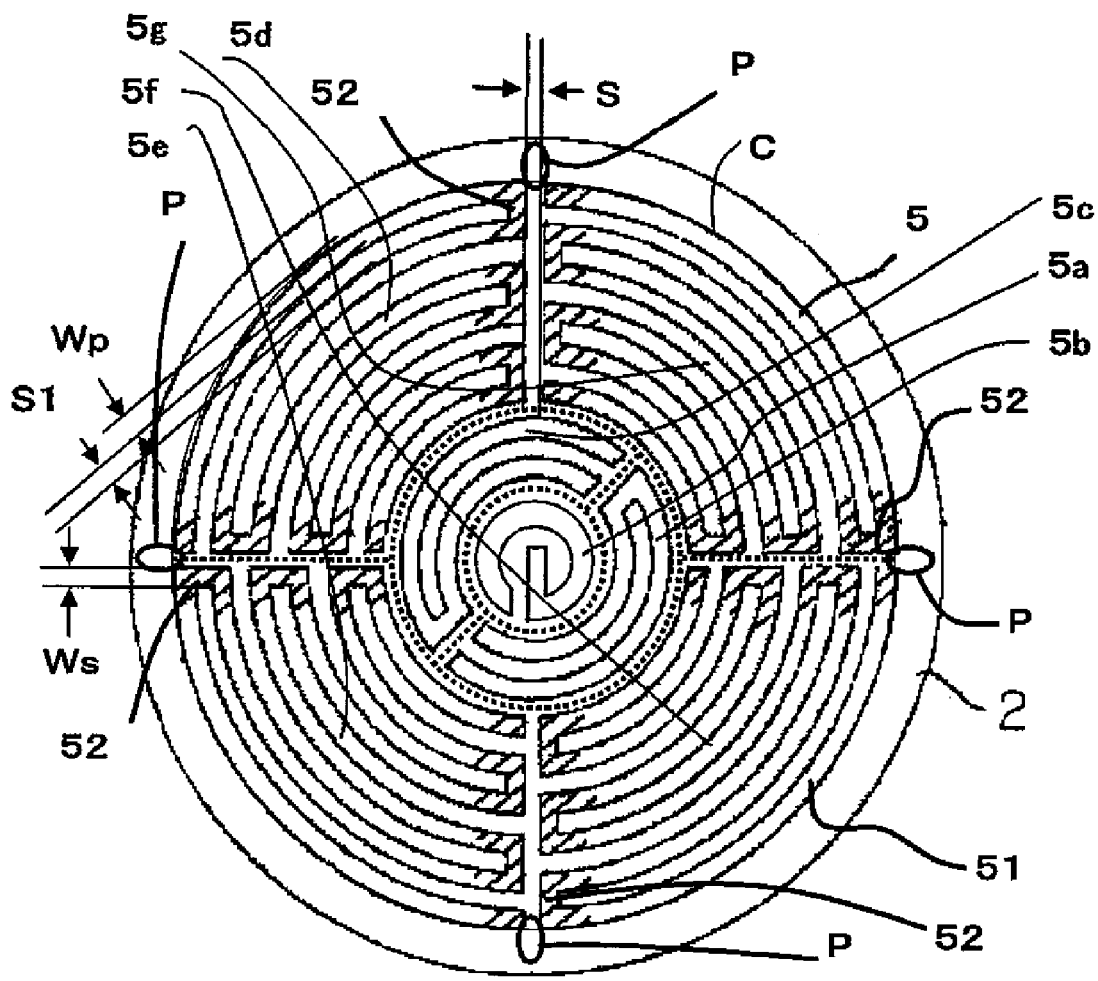
FIG. 12 is a front view showing the configuration of the resistive heating member of the heater section in the wafer heating apparatus according to a variation of the second embodiment.

The surface having protrusions and recesses preferably has substantially lattice-like configuration. FIG. 11 shows an example where the insulation layer 12 has surface having protrusions and recesses. When the nozzles 24 are provided in such a manner that the tips 24a thereof are projected onto the surface having protrusions and recesses 401 between the resistive heating member 5 in the other surface of the plate-shaped member 2, the cooling gas hits the surface having protrusions and recesses 401 so that heat exchange between the cooling gas and the surface having protrusions and recesses 40 becomes easier thus resulting in improved effect of cooling by removing heat from the heater section 7 via the surface having protrusions and recesses 401. When surface having protrusions and recesses 401 has substantially lattice-like configuration, the cooling gas that has hit the recess 42 then hits the side face of the protrusion 41 so as to carry out heat exchange, and the cooling gas can flow over a longer distance through the groove formed along a straight line, thus making it easier to carry out heat exchange through the surface having protrusions and recesses 401. When the surface having protrusions and recesses 401 has substantially lattice-like configuration, heat exchange between the cooling gas and the surface having protrusions and recesses 401 is increased thereby making it easier to cool down the heater section 7 in a shorter period of time.

The number of the grooves of the lattice configuration is preferably from 0.2 to 80, more preferably from 0.4 to 40 per 1 mm of width. When the number of the grooves is less than 0.2 per 1 mm, the effect of cooling through heat exchange decreases and such troubles as peel-off of the resistive heating member 5 and the insulation layers 12, 14 or crack may occur when the resistive heating member 4 is subjected to repetitive cycles of heating and cooling.

When the number of the grooves is more than 80 per 1 mm, flow of the cooling gas into the recess 42 may be hampered, thus resulting in lower efficiency of cooling. It also makes the grooves too small, which gives rise to the possibility of cracks occurring in the recess 42 and extending to the insulation layers 12, 14 and the resistive heating member 5. By controlling the number of the grooves in the surface having protrusions and recesses 401 within the range from 0.4 to 80 per 1 mm, it is made easier to carry out heat exchange between the heater section 7 and the cooling gas. Thus it is made possible to provide the wafer heating apparatus 1 of high reliability where the difference in thermal expansion between the insulation layers 12, 14 and the resistive heating member and the plate-shaped member 2 is absorbed and deterioration of the resistive heating member 5 can be suppressed.

While the common wisdom may dictate that deterioration of the resistive heating member 5 can be suppressed by making the insulation layer 12 thicker, the insulation layer 12 serving as the protective layer is formed from a material different from that of the resistive heating member 5, and therefore the difference in thermal expansion between the materials cancels the effect of mitigating the stress. In other words, excessive thickness of the insulation layer 12 may generate a significant stress in the insulation layer 12 when it is baked, thus resulting in lower reliability. Accordingly, the present invention has been completed on the basis of finding that it is effective in preventing deterioration of the resistive heating member 5 without increasing the overall thickness of the insulation layer 12, to make the surfaces of the insulation layers 12, 14 and/or the resistive heating member 5 of the plate-shaped member 2 unsmooth, preferably in substantially lattice configuration.

By forming the insulation layer 12 which covers the resistive heating member 5 in substantially lattice configuration, it is made possible to hold the resistive heating member 5 firmly with the protrusion of the substantially lattice configuration of the insulation layer 12, so that the resistive heating member 5 does not peel off.

Since the overall thickness of the insulation layer 12 is not large, and the stress due to the difference in thermal expansion is mitigated in the recess 42 of the substantially lattice configuration, troubles such as crack do not occur. This applies also to the plate-shaped member 2, the insulation layer 14 and the resistive heating member 5, and it can be seen that it is better to form the resistive heating member 5 in substantially lattice configuration.

The surface having protrusions and recesses 401 preferably has such characteristics as the proportion (tp/tv)×100 of the thickness (tp) of the protrusion 41 to the thickness (tv) of the recess 42 is in a range from 102 to 200%, and mean thickness of the resistive heating member 5 or the insulation layers 12, 14 is in a range from 3 to 60 µm. This constitution makes it possible to provide the wafer heating apparatus 1 of extremely high reliability where the difference in thermal expansion between the resistive heating member and the plate-shaped member 2 is absorbed and deterioration of the resistive heating member 5 can be suppressed.

When the proportion (tp/tv)×100 is less than 102, efficiency of heat exchange becomes lower and the tolerable cycles of heating and cooling before crack occurs becomes less than 4200, which is not desirable.

When the proportion exceeds 200%, the difference between the protrusion 41 and the recess 42 becomes too large and leads to a large temperature difference, and the tolerable cycles of heating and cooling before crack occurs may decrease.

When mean thickness of the insulation layers 12, 14 is less than 3 μm, variation in thickness of the resistive heating member 5 formed by printing method becomes 30% or larger, and the temperature difference across the surface of the wafer W may becomes large.

When mean thickness of the insulation layers 12, 14 is more than 60 μm, microscopic cracks may occur in the insulation layers 12, 14 due to the difference in thermal expansion between the insulation layers 12, 14 and the plate-shaped member 2.

Thickness (tv) of the recess may be given in terms of mean value of 5 positions around the center of each recess 42. Thickness (tp) of the protrusion may be given in terms of mean value of maximum thickness at 5 positions of each protrusion 41. The mean thickness may be given by averaging the thickness of the recess 42 and the thickness of the protrusion 41.

FIG. 9B is a plan view showing an example of the wafer heating apparatus 1 of the present invention where the insulation layer 12 is formed. Among the three ring-shaped resistive heating member zones 4b, 4cd and 4eh, the insulation layer 12eh that covers the resistive heating member zone 4eh located outside is preferably ring-shaped. It is preferable that the three ring-shaped insulation layers 12b, 12cd, 12eh individually cover the resistive heating member zones 4b, 4cd and 4eh, respectively, which equalize the surface temperature of the wafer W, and the insulation layer 12 is formed in accordance.

In the wafer heating apparatus 1 of the present invention, it is preferable that the distance S6 is larger than the other distances S4 and S5 as shown in FIG. 9B. The distance S4 is the distance between the insulation layer 12a of circular shape located at the center and the concentric ring-shaped insulation layer 12b located outside thereof. The distance S5 is the distance between the insulation layer 12b of ring shape and the ring-shaped insulation layer 12cd located outside thereof. The distance S6 is the distance between the insulation layer 12cd of ring shape and the outermost ring-shaped insulation layer 12eh.

When the distance S6 is larger than S4 and S5, a larger portion of the surface of the plate-shaped member 2 can be exposed since ring-shaped region having width of S6 devoid of the insulation layer 12 becomes larger, thereby increasing the effect of cooling. It also leads to more heat transfer through the insulation layers 12, 14 that constitute the exposed portion, thus resulting in improved cooling efficiency through high heat conductivity of the plate-shaped member 2 and faster rate of cooling the heater section 7.

In case the plate-shaped member 2 is made of sintered silicon carbide or sintered aluminum nitride, the plate-shaped member 2 may be heated at a temperature from 800 to 1200° C. so as to form an insulating oxide film on the surface of the plate-shaped member 2, and use the oxide film as the insulation layer 14.

The resistive heating member zone and the resistive heating member in the wafer heating apparatus 1 of the second embodiment will now be described in detail.

In order to minimize the temperature difference across the surface of the wafer W in the wafer heating apparatus 1 of the second embodiment, it is preferable to set the outer diameter D1 of the resistive heating member zone 4a located at the center in a range from 20 to 40% of the outer diameter D of the ring-shaped resistive heating member zone 4eh located along the periphery, outer diameter D2 of the resistive heating member zone 4b located outside thereof in a range from 40 to 55% of the outer diameter D of the resistive heating member zone 4eh located along the periphery, and set the outer diameter D3 of the ring-shaped resistive heating member zone 4cd located outside of the resistive heating member zone 4b in a range from 55 to 85% of the outer diameter D of the ring-shaped resistive heating member zone 4eh located at the outermost position.

The outer diameter D of the resistive heating member zone 4eh located along the periphery is the diameter of the circle that circumscribes to the resistive heating member 5eh located at the outermost position in the resistive heating member zone 4eh. The outer diameter D2 of the resistive heating member zone 4b is the diameter of the circle that circumscribes to the resistive heating member 5b located at the outermost position in the resistive heating member zone 4b. The outer diameter D3 is the diameter of the circle that circumscribes to the resistive heating member 5cd. Definition of the circumscribed circle is made by using the arc section excluding the protruding portions of the resistive heating member connected to the power feeder section.

The outer diameters are preferably in the ranges described above for the following reasons.

When the outer diameter D1 is less than 20% of D, temperature of the mid portion of the resistive heating member zone 4a would not rise sufficiently even if the resistive heating member zone 4a is caused to generate more heat, due to the small outer diameter of the central resistive heating member zone 4a. When the outer diameter D1 is more than 40% of D, temperature of the resistive heating member zone 4a would become too high along the periphery thereof when the temperature of the mid portion of the resistive heating member zone 4a is raised, due to the large outer diameter of the resistive heating member zone 4a located at the center. The outer diameter D1 is preferably in a range from 20% to 30%, and more preferably from 23 to 27% of D, which makes it possible to further decrease the temperature difference across the surface of the wafer W.

When the outer diameter D2 is less than 40% of the outer diameter D, since the wafer heating apparatus 1 tends to cool down along the periphery, an attempt to prevent temperature of the wafer W along the periphery thereof from decreasing by causing the resistive heating member zone 4cd to generate more heat would result in higher temperature of the resistive heating member zone 4cd in an inner portion thereof nearer to the center of the wafer W, thus increasing the temperature difference across the wafer surface. When the outer diameter D2 is more than 55% of the outer diameter D, an attempt to prevent the temperature of the wafer W along the periphery thereof from decreasing by causing the resistive heating member zone 4cd to generate more heat raises the temperature of the resistive heating member zone 4cd although the effect of decreasing temperature of the wafer W along the periphery thereof reaches the ring-shaped resistive heating member zone 4b, thus resulting in lower temperature of the resistive heating member zone 4b along the periphery thereof. The outer diameter D2 is preferably in a range from 41% to 53%, and more preferably from 43 to 49% of the outer diameter D, which makes it possible to further decrease the temperature difference across the wafer surface.

When the outer diameter D3 is less than 55% of the outer diameter D, since the wafer heating apparatus 1 tends to cool down along the periphery thereof, an attempt to prevent the temperature of the wafer W along the periphery thereof from decreasing by increasing the heat generation from the resistive heating member zone 4eh would result in higher temperature of the resistive heating member zone 4eh in the inner portion thereof nearer to the center of the wafer W, thus increasing the temperature difference across the surface of the wafer W. When the outer diameter D3 is more than 85% of the outer diameter D, an attempt to prevent the temperature of the wafer W along the periphery thereof from decreasing by causing the resistive heating member zone 4eh to generate more heat raises the temperature of the resistive heating member zone 4eh, although the effect of decreasing temperature of the wafer W along the periphery thereof reaches the resistive heating member zone 4cd, thus resulting in lower temperature of the resistive heating member zone 4cd along the periphery thereof. The outer diameter D3 is preferably in a range from 65% to 85%, and more preferably from 67 to 70% of the outer diameter D, which makes it possible to further decrease the temperature difference across the surface of the wafer W.

Dimensions of the resistive heating member zone 4 have been described in detail so far. The resistive heating member zone 4 of the present invention is characterized mainly by the fact that annular no-heater zone can be provided in that the resistive heating member 5 does not exist between the ring-shaped regions. Existence of the no-heater zone makes it possible to form the support pin 15, the through hole 26 and the powder feeder section 6 in the no-heater zone. Thus it is made easier to prevent temperature difference from being caused by the support pin 15, the through hole 26 and the powder feeder section 6, thus making the temperature difference across the surface of wafer less likely to increase.

The diameter D11 of a central portion of the resistive heating member zone 4a where the resistive heating member is not formed may be set in range from 5 to 10% of the diameter D. This allows it to provide the support pins 15, for example, within the circle of diameter D11, so as to prevent the temperature of the wafer surface from decreasing due to the support pins 15.

It is preferable that inner diameter D22 of the resistive heating member zone 4b is in a range from 34 to 45% of the outer diameter D. Setting in this range allows it to provide a ring-shaped no-heater zone of a size about 1 to 22% of diameter between rings 4a and 4b, thus making possible to minimize the decrease in temperature of the wafer surface even when the lift pin 25, etc. is provided in this region. Inner diameter D22 is preferably from 36 to 41% of the diameter D. Setting in this range allows it to provide through hole which penetrates the plate-shaped member between the first resistive heating member and the second resistive heating member.

Inner diameter D33 of the resistive heating member zone 4cd is preferably set in a range from 50 to 65% of the diameter D, which allows it to provide a ring-shaped no-heater zone where the resistive heating member does not exist between the resistive heating member zone 4b and the resistive heating member zone 4cd. Since this constitution makes it possible to provide the powder feeder section 6 for supplying electrical power to the resistive heating members in the ring-shaped no-heater zone, cold spot or the like can be prevented from being generated in the surface of the wafer W due to the power feeder section 6. Inner diameter D33 is more preferably in a range from 58 to 63% of the diameter D.

The inner diameter D0 of the resistive heating member zone 4eh can be set in a range from 85 to 93% of the diameter D. This makes it possible to provide a ring-shaped no-heater zone between the resistive heating member zone 4eh and the resistive heating member zone 4cd. Thus it is made easy to heat the wafer W without increasing the temperature difference across the wafer surface, by providing the support pins 15 that support the object to be heated such as wafer W, and the power feeder section 6 in the annular no-heater zone. Inner diameter D0 is more preferably in a range from 90 to 92% of the diameter D.

In the other principal surface of the plate-shaped member 2, diameter D of the circumscribed circle C of the resistive heating member 5 located at the outermost position is preferably in a range from 90 to 97% of the diameter DP of the plate-shaped ceramic member 2.

When diameter D of the circumscribed circle C of the resistive heating member 5 is smaller than 90% of the diameter DP of the plate-shaped ceramic member 2, it takes longer time to raise or lower the temperature and therefore results in unfavorable temperature characteristic of the wafer W when the wafer is quickly heated or cooled down. For the purpose of achieving uniform temperature distribution over the surface of the wafer W so that temperature of the wafer W does not become lower along the periphery, diameter D is preferably about 1.02 times the diameter of the wafer W. When the diameter DP of the plate-shaped ceramic member 2 is larger than the range described above in relation to the size of the wafer W, size of the wafer W becomes too small in relation to the diameter DP of the plate-shaped ceramic member 2, and the efficiency of heating the wafer W for the input power becomes lower. Moreover, larger size of the plate-shaped ceramic member 2 results in larger installation area of the wafer manufacturing apparatus, which is not desirable because it decreases the rate of operation of the semiconductor manufacturing apparatus.

When diameter D of the circumscribed circle C of the resistive heating member 5 is larger than 97% of the diameter DP of the plate-shaped ceramic member 2, the space between the contact member 18 and the periphery of the resistive heating member 5 becomes too small and heat dissipates unevenly from the resistive heating member 5 into the contact member 18. Particularly, since heat is transferred through the contact member 18 also from the portion along the periphery near the circumscribed circle C where the arc band 51 does not exist (for example, the portion indicated by P in FIG. 6), temperature may become lower in the portion P, thus resulting in larger temperature difference across the wafer surface. According to the present invention, diameter D of the circumscribed circle C of the resistive heating member 5 is set preferably in a range from 92 to 95% of the diameter DP of the plate-shaped ceramic member 2.

In the wafer heating apparatus 1 of the present invention, it is preferable that distance L1 (width of the no-heater zone P) between the outermost arc bands 51 that make contact with the circumscribed circle C of the resistive heating member 5 shown in FIG. 6 is smaller than the difference between the diameter DP of the plate-shaped ceramic member 2 and the diameter D of the circumscribed circle C (hereinafter referred to as LL). When the distance L1 is larger than LL, there is a possibility that heat of the no-heater zone P is transferred to the peripheral portion of the plate-shaped ceramic member, thereby decreasing the temperature of the no-heater zone P. When the distance L1 is smaller than LL, temperature of the no-heater zone P is less likely to decrease and the temperature difference across the surface of wafer decreases without lowering the temperature of the peripheral portion of the wafer W mounted on the mounting surface 3 of the plate-shaped ceramic member 2.

In order to prevent the temperature of the no-heater zone P from lowering, it is necessary to raise the temperature of the no-heater zone P. When the resistance of the linkage arc band 52 that heats the no-heater zone is set to a similar level or slightly higher so as to increase the amount of heat generation, it is made possible to achieve uniform temperature distribution over the surface of the wafer W. When the resistive heating member 5 is formed by printing process or the like, the resistance of the small arc band 52 can be made higher by making the width Ws of the linkage arc band 52 smaller by 1 to 5% than the width Wp of the arc band 51, thereby making the temperature of the small arc band 52 higher than the temperature of the arc band 51, thereby achieving uniform temperature distribution across the surface of the wafer W.

In the wafer heating apparatus 1 wherein one of the principal surfaces of the plate-like ceramic member 2 having thickness from 1 to 7 mm is used as the mounting surface 3 to place the wafer W thereon and the resistive heating member 5 is formed on the bottom surface of the plate-shaped ceramic member 2, it is preferable that thickness of the resistive heating member 5 is in a range from 5 to 50 μm and the area occupied by the resistive heating member 5 within the circumscribed circle C is in a range from 5 to 30% of the area of the circumscribed circle C that surrounds the resistive heating member 5 on the other surface of the plate-like ceramic member 2.

When the area occupied by the resistive heating member 5 in the circumscribed circle C is less than 5% of the area of the circumscribed circle C that surrounds the resistive heating member 5, distances L1, L2 etc. between the adjacent resistive heating members 5 become too large, and therefore temperature of a portion of the mounting surface 3 corresponding to the distance L1 that does not include the resistive heating member 5 becomes lower than that of the other portions, thus making it difficult to achieve uniform temperature distribution of the mounting surface 3.

When the area occupied by the resistive heating member 5 in the circumscribed circle C is larger than 30% of the area of the circumscribed circle C that surrounds the resistive heating member 5, on the other hand, thermal stress due to difference in the thermal expansion coefficient becomes large enough to deform the plate-shaped ceramic member 2, even when the difference in the thermal expansion coefficient between the plate-shaped ceramic member 2 and the resistive heating member 5 is controlled within $2.0 \times 10^{-6}/°C$. Even when the plate-shaped ceramic member 2 is made of a sintered ceramic material that is hard to deform, thickness t of the plate-shaped ceramic member 2 is as small as 1 to 7 mm, and therefore the plate-shaped ceramic member 2 may warp to become concave on the mounting surface 3 when the resistive heating member 5 is energized to heat. As a result, difference in temperature may become large, with the temperature of the wafer W becoming higher around the center than along the periphery.

The area occupied by the resistive heating member 5 in the circumscribed circle C is more preferably in a range from 7 to 20%, and furthermore preferably from 8% to 15% of the area of the circumscribed circle C that encloses the resistive heating member 5.

While there is a region where the linkage bands 52 oppose each other between different resistive heating members 5 or in a same resistive heating member, distance L1 between the linkage bands 52 in the region is preferably 0.5 mm or more and not more than three times the thickness of the plate-shaped ceramic member 2. When distance L1 is less than 0.5 mm, whisker-like protrusion that can cause short-circuiting may be produced in the region in which the resistive heating members 5 oppose each other, when printing the resistive heating member 5. When distance L1 is more than three times the thickness of the plate-shaped ceramic member 2, a cold zone may be produced on the surface of the wafer W at position near the region corresponding to the distance L1, thus increasing the temperature difference across the surface of the wafer W. In order to prevent the opposing resistive heating members in the region from short-circuiting and efficiently achieve the effect described above, thickness of the resistive heating member 5 is preferably in a range from 5 to 50 μm.

When thickness of the resistive heating member 5 is less than 5 μm, it becomes difficult to form the resistive heating member 5 with uniform thickness by the screen printing process. When thickness of the resistive heating member 5 is larger than 50 μm, the resistive heating member 5 becomes too rigid due to the relatively large thickness, even when the area occupied by the resistive heating member 5 is set to not larger than 30% of the area of the circumscribed circle C. As a result, the plate-shaped ceramic member 2 may be deformed due to expansion and shrinkage of the resistive heating member 5 caused by the temperature change of the plate-shaped ceramic member 2. Also it becomes difficult to form the resistive heating member 5 with uniform thickness by the screen printing process, resulting in large temperature difference across the surface of the wafer W. Thickness of the resistive heating member 5 is more preferably in a range from 10 to 30 μm.

Temperature of the heater section 7 is preferably measured by means of a plurality of temperature sensors 10 of which distal ends are embedded in the plate-shaped ceramic member 2 in correspondence to the resistive heating members 5 which can be heated independently. For the temperature sensors 10, it is preferable to use thermocouples of sheathed type having outer diameter of 0.8 mm or less, in consideration of the response characteristic and the ease of maintenance. However, thermocouple of bare wire type having outer diameter of 0.5 mm or less or a thermistor such RTD may also be used. The distal ends of the temperature sensors 10 are preferably secured in holes formed in the plate-shaped ceramic member 2 while being pressed against the inner wall surface of the hole by means of a fastening member provided in the hole, in order to ensure the reliability of measurement.

Heat conductivity of the plate-shaped member 2 is preferably higher than that of the insulation layer 14. When heat conductivity of the plate-shaped ceramic member 2 is high, heat is transferred from the inside of the plate-shaped ceramic member 2 resulting in faster rate of cooling the heater section 7, when the plate-shaped ceramic member 2 is cooled by the cooling gas applied thereto. The insulation layer 12 and the insulation layer 14 are preferably formed from glass or insulating resin having heat conductivity of 1 to 10 W/(m·K). The plate-shaped member 2 is preferably made of ceramics such as carbide or nitride that has heat conductivity of 50 to 280 W/(m·K).

It becomes difficult to manufacture when the difference in thermal expansion coefficient between the resistive heating member 5 and the plate-shaped member 2 is $0.1 \times 10^{-6}/°C$ or less. When the difference in thermal expansion coefficient between the resistive heating member 5 and the plate-shaped member 2 is more than $3.0 \times 10^{-6}/°C$, the resistive heating member 5 may warp in concave shape on the side of the mounting surface 3 due to the thermal stress acting between the resistive heating member 5 and the plate-shaped member 2 when the resistive heating member 5 is heated.

The glass used to form the insulation layer 12 may be either crystalline or amorphous in nature, a material having durable temperature of 200° C. or higher and difference in thermal expansion coefficient from that of the ceramics forming the plate-shaped ceramic member 2 is in a range of $\pm 1 \times 10^{-6}/°$ C. and more preferably from $-5 \times 10^{-7}/°$ C. to $+5 \times 10^{-7}/°$ C. in a temperature range from 0 to 200° C. is preferably used. Use of glass having a value of thermal expansion coefficient out of the range described above may lead to defects such as crack and peel-off when cooled down after bonding the glass due to large difference from the thermal expansion coefficient of the ceramics that forms the plate-shaped member 2.

It is preferable that the glass that forms the insulation layer 12 is amorphous glass which consists mainly from $SiO_2$ and includes 10% by weight on oxide basis or more of at least one kind selected from among B, Mg, Ca, Pb and Bi, and does not substantially include oxide of As or Sb (0.05% by weight or less on oxide basis).

Viscosity at a high temperature can be made lower with the glass having the composition described above. Inclusion of B, Mg, Ca, Pb or Bi is aimed at decreasing the apparent viscosity of the glass through dispersion of $SiO_2$ glass. PbO, $B_2O_3$ and $Bi_2O_3$ do not crystallize and remain in the glass so as to lower apparent viscosity and melting point of the glass, and are therefore effective in suppressing the generation of bubbles in the glass.

By lowering the viscosity of the glass, it is made possible to cause the bubbles generated in the insulation layer 12 to float to the surface of the insulation layer 12 so as to become open pores, thereby decreasing bubbles remaining in the insulation layer 12. Thus such a glass layer can be formed as a region free from bubbles continues over 10 μm or more in the direction of thickness of the insulation layer 12. Use of amorphous glass is preferable since it makes it easier to form the insulation layer 12 including less bubbles than crystallized glass. Thus it is made possible to decrease bubbles in the insulation layer 12 without adding oxide of toxic As or Sb that has the effect of removing bubbles.

When the content of B, Mg, Ca, Pb and/or Bi is less than 10% by weight on oxide basis, viscosity of the glass at a high temperature cannot be made sufficiently low, and it becomes difficult to decrease bubbles. When crystallized glass is used, the glass expands or shrinks during the process of nucleation. During the expansion and shrinkage, a large number of minute bubbles are generated around the crystal nuclei which decrease the withstanding voltage of the insulation layer. Therefore, it is not preferable to use crystallized glass as it makes it difficult to prevent the occurrence of defects in the glass that constitutes the insulation layer 12, in comparison to the case of using amorphous glass.

The glass that constitutes the insulation layer 12 preferably includes alkali content in concentration not higher than 2% by weight. While alkali content added to the glass is effective in decreasing the viscosity, it leads to a problem related to the durability through migration of the glass component. When alkali content in the glass that constitutes the insulation layer 12 is controlled to within 2% by weight, durability is improved as determined in durability test in which the resistive heating member 5 is heated by applying a DC voltage to the resistive heating member 5. It was found that durable life in continuous durability test conducted at 250° C. can be extended to 1000 hours when alkali content in the glass that constitutes the insulation layer 12 is not higher than 2% by weight, and 5000 hours when alkali content is not higher than 1% by weight. The alkali content refers to oxides of alkali metals such as $Li_2O$, $Na_2O$ and $K_2O$.

The glass of the insulation layer 12 is preferably formed by applying a paste prepared by blending a plurality of glass powders each having mean particle size D50 of 15 μm or less and differing in mean particle size D50 by 20% or more from each other, and controlling the process of removing the binder so that remaining carbon content is 1% by weight or less with respect to the weight of glass.

By blending a plurality of glass powders having different mean particle sizes, it is made possible to increase the density of the packed glass powder and thereby decrease the bubbles in the insulation layer. By controlling the process of removing the binder so that remaining carbon content is 1% by weight or less with respect to the weight of glass, it is made possible to suppress the reaction between the carbon included in the binder and the oxygen included in the glass and increase the bulk density of the glass powder after the process of removing the binder, so that such a glass layer can be formed more easily as a region free from bubbles continues over 10 μm or more in the direction of thickness of the insulation layer.

In case a plurality of glass powders each having mean particle size D50 larger than 15 μm or differing in mean particle size D50 by less than 20% from each other are used in the process of forming the insulation layer 12, the glass cannot be packed densely enough and it is difficult to fill in the voids between the glass particles. Also in case carbon content of more than 1% by weight or less with respect to the weight of glass remains in the process of removing the binder, it is difficult to suppress the generation of bubbles.

Baking temperature of the glass is preferably not lower than the working temperature (104 poise or less in terms of viscosity of the glass).

Third Embodiment

The wafer heating apparatus according to the third embodiment of the present invention will now be described.

Figure 13:
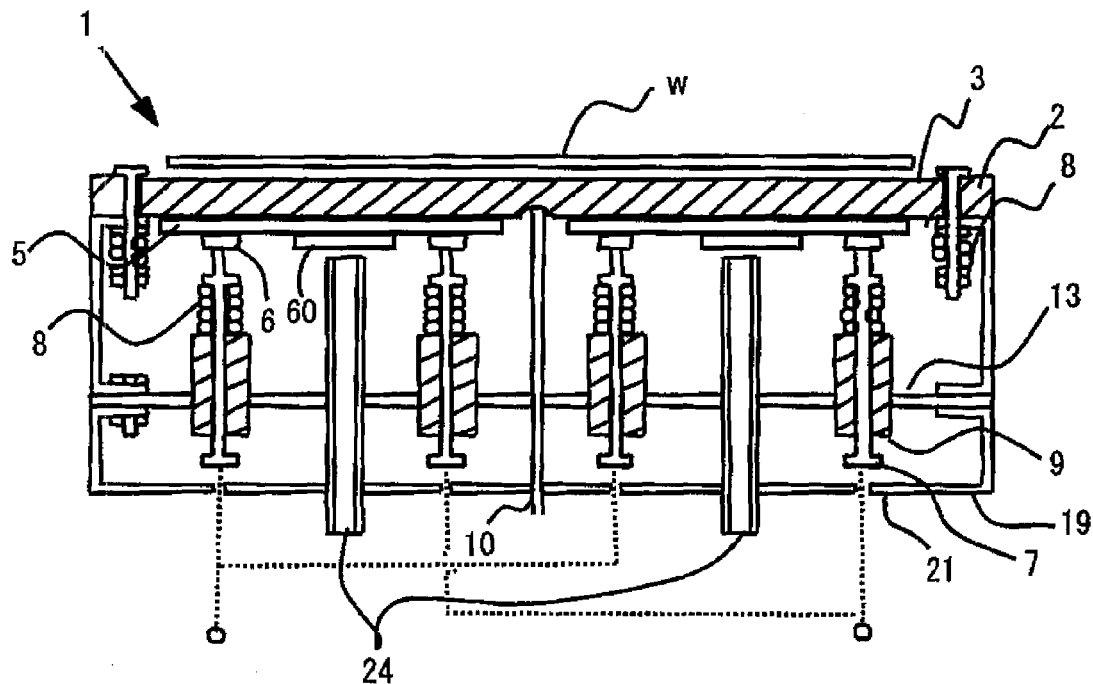
FIG. 13 is a sectional view showing the wafer heating apparatus according to third embodiment of the present invention.

FIG. 13 is a sectional view showing the constitution of the wafer heating apparatus 1 according to the third embodiment, comprising the plate-shaped member 2 having one of the principal surfaces thereof serving as the mounting surface 3 to mount a wafer W thereon and the other principal surface having the band-shaped resistive heating member 5 of one or more circuits formed thereon, with an insulation layer 60 formed thereon as required. The power feeder section 6 is provided to supply electric power to the resistive heating members 5 independently from each other, and the casing 19 is provided to enclose the power feeder section 6.

The lift pin not shown is provided so as to be capable of moving vertically and load the wafer W onto the mounting surface 3 or unload it therefrom.

The cooling nozzle 24 that discharges the cooling gas is provided on the bottom surface 21 of the casing 19.

The cooling gas discharged from the cooling nozzle 24 is blown onto the under surface of the plate-shaped member 2 so as to remove heat from the under surface of the plate-shaped member 2. The cooling gas that has been heated is purged to the outside through the hole formed in the bottom 21 of the metal casing 19 while transferring the heat to the casing 19, thereby quickly cooling down the plate-shaped member 2.

To heat the wafer W with the wafer heating apparatus 1, the wafer W that has been transferred to above the mounting surface 3 by a transfer arm (not shown) is held by the lift pins (not shown), then the lift pins are lowered thereby to place the wafer W on the mounting surface 3.

Then electric power is supplied through the power feeder section 6 so as to heat the resistive heating member 5 and heat the wafer W placed on the mounting surface 3 via the plate-shaped member 2.

The wafer heating apparatus 1 of the third embodiment is characterized in that the surface of the resistive heating member 5 is surface having protrusions and recesses 55.

Figure 14A:
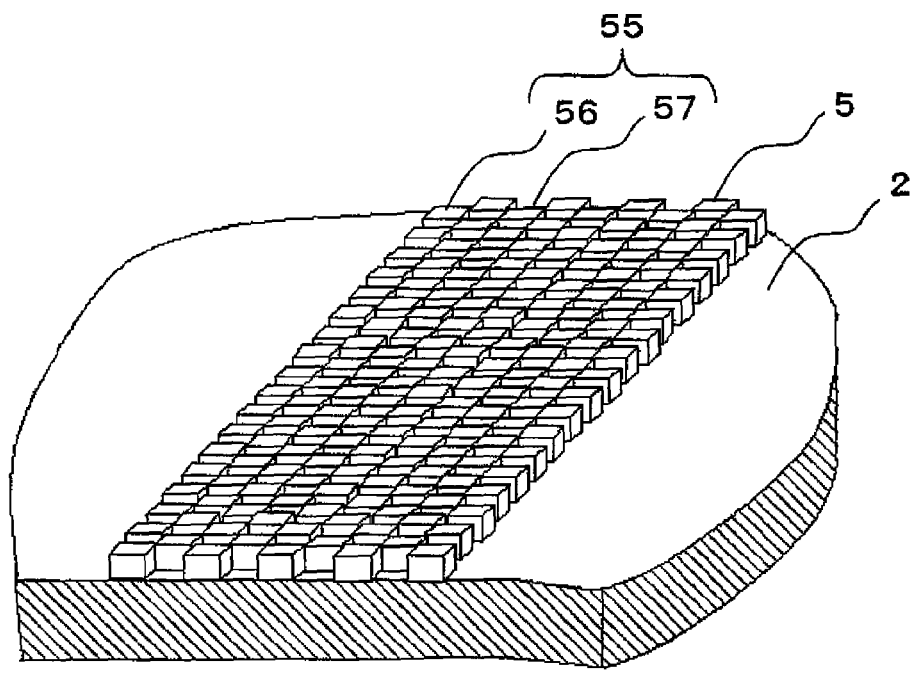
FIG. 14A is a sectional view in perspective of the plate-shaped member of the wafer heating apparatus according to third embodiment.
Figure 14B:
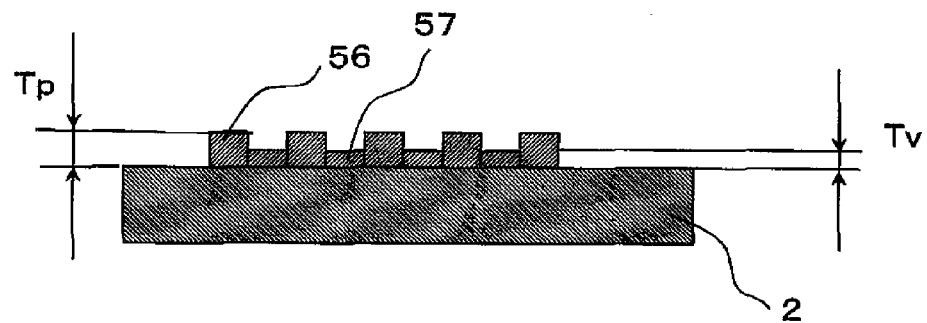
FIG. 14B is a sectional view of the plate-shaped member of the wafer heating apparatus according to the third embodiment.

FIG. 14A is a perspective view showing the surface having protrusions and recesses 55, and FIG. 14B is a sectional view thereof.

In the wafer heating apparatus 1 of the third embodiment, the resistive heating member 5 is prevented from breaking by forming the surface of the resistive heating member 5 as the surface having protrusions and recesses 55. Specifically, temperature of the resistive heating member 5 rises quickly when it is supplied with electric power. This quick rise of temperature generates thermal stress between the resistive heating member 5 and the plate-shaped ceramic member 2 due to the differences in the temperature and in the thermal expansion coefficient between the resistive heating member 5 and the plate-shaped ceramic member 2. This may result in a significant compressive stress generated in the resistive heating member 5, which may break the resistive heating member 5. It was found that this stress can be mitigated by forming the surface of the resistive heating member 5 as the surface having protrusions and recesses 55.

That is, the significant compressive stress generated in the surface by heating and cooling can be distributed over a wide area of the surface having protrusions and recesses 55, thereby preventing the peel-off and crack of the resistive heating member 5 from occurring due to the stress. While repetition of heating and cooling of the resistive heating member 5 causes the stress to be generated repetitively in the resistive heating member 5, it was found that tolerable thermal cycles of the resistive heating member 5 can be improved by mitigating the stress by means of the surface having protrusions and recesses 55.

While the surface having protrusions and recesses 55 of the resistive heating member 5 has been described as an example, similar effect can be achieved also with the wafer heating apparatus having the insulation layer 60 formed on the surface of the resistive heating member 5.

Figure 15:
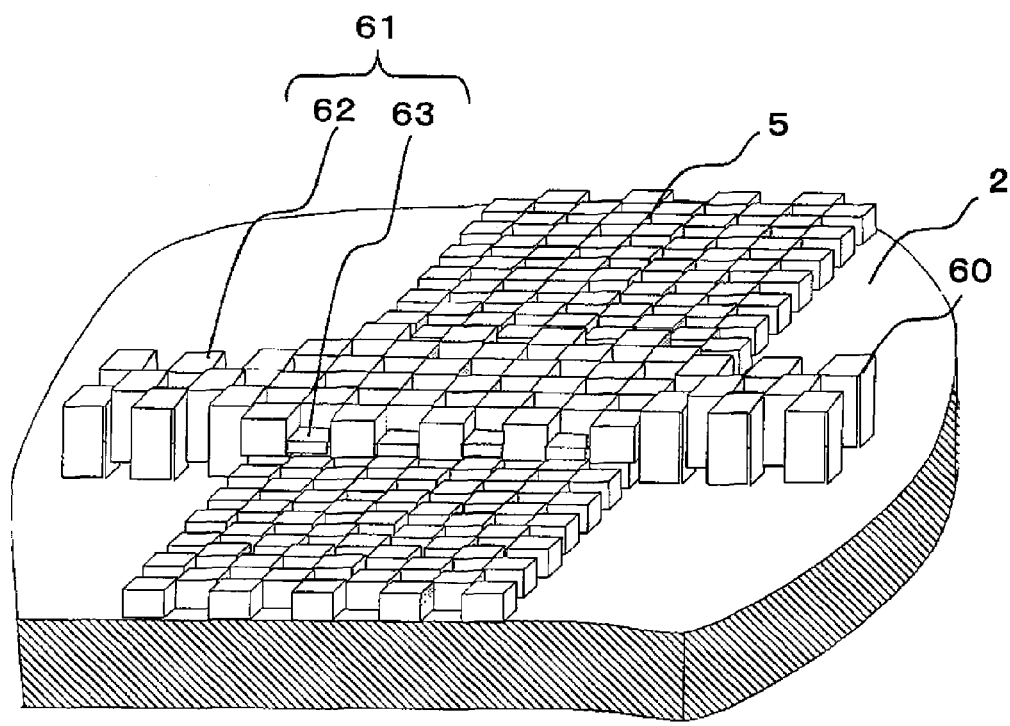
FIG. 15 is a sectional view in perspective of the plate-shaped member of the wafer heating apparatus according to the third embodiment.
Figure 16:
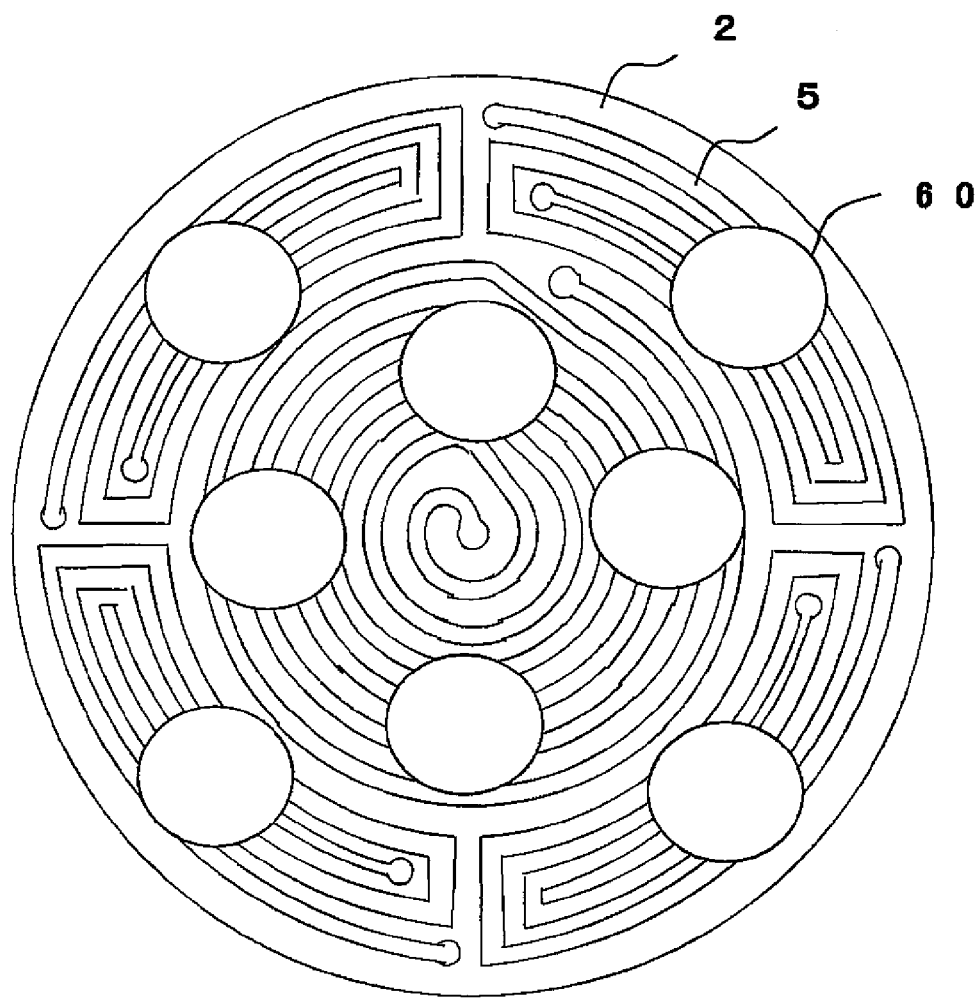
FIG. 16 is a plan view of the plate-shaped member of the wafer heating apparatus according to the third embodiment.

FIG. 15 is a perspective view showing an example of the wafer heating apparatus according to a variation of the third embodiment, wherein the insulation layer 60 is formed and the surface of the insulation layer 60 is turned into surface having protrusions and recesses 61 in the wafer heating apparatus shown in FIGS. 14A, 14B. By making the surface of the insulation layer 60 as the surface having protrusions and recesses 61, peel-off and crack of the resistive heating member 5 can be prevented from occurring even when the resistive heating member 5 is subjected to repetitive cycles of heating and cooling. The surface of the resistive heating member 5 under the insulation layer 60 may be either surface having protrusions and recesses as shown in FIG. 15 or smooth surface.

The thermal stress generated due to the differences in the temperature and in the thermal expansion coefficient tends to appear on the surface of the insulation layer 60 which faces the outside. When the surface is formed as the surface having protrusions and recesses 61, the stress can be dispersed for a reason similar to that described in relation to the resistive heating member, so as to prevent the insulation layer 60 and the resistive heating member 5 from peeling off or cracking.

It is preferable that the surface having protrusions and recesses 55, 61 of the resistive heating member 5 and/or the insulation layer 60 of the plate-shaped member 2 are formed in substantially lattice configuration as shown in FIG. 14 and FIG. 15, which improves the effect of mitigating the stress. It is believed that lattice configuration makes it easier for the stress to diffuse over the surface, thereby achieving the effect of mitigating the stress.

The number of the grooves of the lattice configuration is preferably from 0.2 to 80, more preferably from 0.4 to 40 per 1 mm of width. When the number of the grooves is less than 0.2 per 1 mm, the effect of mitigating the stress decreases and so does the effect of preventing such troubles as peel-off of the resistive heating member 5 from occurring when the resistive heating member 5 is subjected to repetitive cycles of heating and cooling.

When the number of the grooves is more than 80 per 1 mm, it makes the grooves too small, which gives rise to the possibility of cracks occurring in the recesses 57, 63 and extending to the resistive heating member 5. By controlling the number of the grooves in the surface having protrusions and recesses 55 within the range from 0.4 to 80 per 1 mm, it is made possible to provide the wafer heating apparatus 1 of high reliability where the difference in thermal expansion between the plate-shaped member 2 and the resistive heating member 2 is absorbed and deterioration of the resistive heating member 5 can be suppressed.

While the common wisdom may dictate that deterioration of the resistive heating member 5 can be suppressed by making the insulation layer 60 thicker, the insulation layer 60 serving as the protective layer is formed from a material different from that of the resistive heating member 5, and therefore the difference in thermal expansion between the materials cancels the effect of mitigating the stress. In other words, excessive thickness of the insulation layer 60 may generate a significant stress in the insulation layer 60 when it is baked, thus resulting in lower reliability. Accordingly in the present invention, as the means for preventing deterioration of the resistive heating member 5 without increasing the overall thickness of the insulation layer 60, the surfaces of the insulation layer 60 and/or the resistive heating member 5 of the plate-shaped member 2 are turned into surface having protrusions and recesses, preferably in substantially lattice configuration.

By forming the insulation layer 60 which covers the resistive heating member 5 in substantially lattice configuration, it is made possible to hold the resistive heating member 5 firmly with the protrusion of the substantially lattice configuration of the insulation layer 60, so that the resistive heating member 5 does not peel off.

Since the overall thickness of the insulation layer 60 is not large, and the stress due to the difference in thermal expansion is mitigated in the recess 63 of the substantially lattice configuration, troubles such as crack do not occur. This applies also to the plate-shaped member 2 and the resistive heating member 5, and it can be seen that it is better to form the resistive heating member 5 in substantially lattice configuration.

The surface having protrusions and recesses 55, 61 preferably has such characteristics as the proportion (tp/tv)×100 of the thickness (tp) of the protrusion to the thickness (tv) of the recess is in a range from 105 to 200%, and mean thickness of the resistive heating member 5 or the insulation layer 60 is in a range from 3 to 60 μm. This constitution makes it possible to provide the wafer heating apparatus 1 of extremely high reliability where the difference in thermal expansion between the resistive heating member 5 and the plate-shaped member 2 is absorbed and deterioration of the resistive heating member 5 can be suppressed.

When the proportion (tp/tv)×100 is less than 105%, efficiency of heat exchange becomes lower and the tolerable number of cycles of heating and cooling before crack occurs becomes less than 4200, which is not desirable.

When the proportion exceeds 200%, the difference between the protrusion 56 and the recess 57 becomes too large and leads to a large temperature difference, and the tolerable number of cycles of heating and cooling before crack occurs may decrease.

When mean thickness of the insulation layer 60 is less than 3 μm, variation in thickness of the resistive heating member 5 formed by printing method becomes 30% or larger, and the temperature difference across the surface of the wafer W may becomes large.

When mean thickness of the insulation layer 60 is more than 60 μm, microscopic cracks may occur in the insulation layer 60 due to the difference in thermal expansion coefficient between the insulation layer 60 and the plate-shaped member 2.

Thickness (tv) of the recess may be given in terms of mean value of 5 positions around the center of the recesses 57, 63. Thickness (tp) of the protrusion may be given in terms of mean value of maximum thickness at 5 positions of the protrusions 56, 62. The mean thickness may be given by averaging the thickness of the recesses 57, 63 and the thickness of the protrusions 56, 62.

The resistive heating member 5 is preferably formed from a composite material consisting of at least two materials selected from among Pt, Au and Ag and glass. These metals are noble metals which have high resistance against oxidization and well match with the glass that holds the metals firmly.

The resistive heating member 5 is also preferably formed from Pt, Au and glass, or from Pt, Ag and glass, of which glass is more preferably constituted from the same components as those of the insulation layer 60. This constitution improves the fusibility of the resistive heating member 5 and the insulation layer 60, and makes these members less likely to peel off each other and crack.

Composition of the composite material that constitutes the resistive heating member 5 is preferably 20 to 40% by weight of Pt, 10 to 30% by weight of Au and 40 to 60% by weight of glass, and more preferably 30% of Pt, 20% of Au and 50% by weight of glass in case Pt and Au are used.

In case Pt and Ag are used, the composition is preferably 20 to 40% by weight of Pt, 10 to 30% by weight of Ag and 40 to 60% by weight of glass, and more preferably 30% of Pt, 20% of Ag and 50% by weight of glass The glass is preferably crystallized glass having composition of $ZnO$, $B_2O_3$, $SiO_2$ and $MnO_2$, with $ZnO$ being the main component. Preferable composition is 50 to 70% by weight of $ZnO$, 20 to 30% by weight of $B_2O_3$, 5 to 20% by weight of $SiO_2$ and 1 to 3% by weight of $MnO_2$.

The insulation layer 60 is preferably constituted from glass as the main component, and more preferably crystallized glass having composition of $ZnO$, $B_2O_3$, $SiO_2$ and $MnO_2$, with $ZnO$ being the main component. Preferable composition is 50 to 70% by weight of $ZnO$, 20 to 30% by weight of $B_2O_3$, 5 to 20% by weight of $SiO_2$ and 1 to 3% by weight of $MnO_2$. Crystallization temperature of the glass is around 740° C., and has thermal expansion coefficient of 4 ppm/° C. This constitution achieves relatively small difference in thermal expansion between silicon carbide and aluminum nitride that constitute the plate-shaped member 2, and sufficient heat resistance for the wafer heating apparatus 1 used at temperatures not higher than 300° C. Difference in thermal expansion between the resistive heating member 5 and the plate-shaped member 2 is preferably $3.0 \times 10^{-6}$/° C. or less, since it allows the insulation layer 60 having substantially lattice configuration to easily absorb the difference of thermal expansion.

Glass of other compositions including PbO as the main component such as $PbO$—$SiO_2$, $PbO$—$B_2O_3$—$SiO_2$ or $PbO$—$ZnO$—$B_2O_3$ includes toxic Pb and a low crystallization temperature of 500° C. or lower, and is not preferable.

Thus the wafer heating apparatus 1 is obtained wherein one of the principal surfaces of the plate-shaped member 2 serves as the mounting surface to mount a wafer thereon and the other principal surface has the resistive heating member of one or more circuits formed thereon, while the insulation layer 60 having a configuration that corresponds to a part or whole of the resistive heating member 5 is formed.

In the wafer heating apparatus 1, a wafer W can be heated by energizing the resistive heating member 5 and is cooled down by stopping electric power to the resistive heating member 5. Cooling operation is preferably carried out by discharging air as the cooling gas from the nozzle 24 thereby cooling the resistive heating member 5 and the plate-shaped ceramic member 2. When the cooling gas is blown onto the surfaces having protrusions and recesses 55, 61, heat exchange proceeds smoothly between the surfaces having protrusions and recesses 55, 61 and the gas, so as to efficiently cool the plate-shaped ceramic member 2.

The surfaces having protrusions and recesses 55, 61 of lattice-like configuration may be formed on the resistive heating member 5 and/or the insulation layer 60 by screen printing of a paste prepared from the material constituting the resistive heating member 5 and/or the insulation layer 60. A printing plate for screen printing method or transfer method may be used. Specifically, the resistive heating member 5 and/or the insulation layer 60 of lattice-like configuration may be formed by using a paste prepared from the material constituting the resistive heating member 5 and/or the insulation layer 60 with viscosity controlled to 3000 poise or more and a mesh printing plate.

The lattice-like configuration may be formed by pressing dimpled jig against the resistive heating member 5 and/or the insulation layer 60 which has been printed with a smooth surface and has not dried and hardened, so as to transfer the lattice-like configuration onto the printed surface.

The lattice-like configuration of the resistive heating member 5 and/or the insulation layer 60 can be completed by firing the printing surface at a temperature near the crystallization temperature of the glass.

The glass used to form the insulation layer 60 may be either crystalline or amorphous in nature, and a material having durable temperature of 200° C. or higher and difference in thermal expansion coefficient from that of the ceramics forming the plate-shaped member 2 is in a range from $-5 \times 10^{-7}$/° C. to $+5 \times 10^{-7}$/° C. in a temperature range from 0 to 200° C. is preferably used. Use of glass having a value of thermal expansion coefficient out of the range described above may lead to defects such as crack and peel-off when cooled down after baking the glass due to large difference from the thermal expansion coefficient of the ceramics that forms the plate-shaped member 2.

The insulation layer 60 made of glass may be formed on the plate-shaped ceramic member 2 by applying the glass paste by screen printing or the like, and firing the glass paste at a temperature of 600° C. or higher.

When the insulation layer 60 is made of glass, adhesion of the insulation layer made of glass and the plate-shaped member 2 made of sintered body of silicon carbide or sintered aluminum nitride can be improved by heating the plate-shaped member 2 at a temperature from 850 to 1300° C. thereby to oxidize the surface to be covered by the insulation layer 60.

The resistive heating member 5 and/or the insulation layer 60 may not necessarily be formed only on the surface of the resistive heating member, and may extend to the underlying plate-shaped member 2, and may not cover the entire surface of the resistive heating member 5. The resistive heating member 5 and/or the insulation layer 60 may be formed only on a portion where high stress is generated locally and is susceptible to cracks, such as the portion exposed to the cooling medium.

Since the overall thickness of the resistive heating member 5 and/or the insulation layer 60 having the surface having protrusions and recesses 55, 61 of substantially lattice configuration is not large, and the stress due to the difference in thermal expansion is mitigated in the recess 57 of the substantially lattice configuration, troubles such as crack do not occur in the resistive heating member 5 and the insulation layer 60.

As described above, according to the third embodiment of the present invention, it is made possible to provide the wafer heating apparatus of very high reliability where the difference in thermal expansion between the plate-shaped member 2, the resistive heating member 5 and/or the insulation layer 60 is absorbed and deterioration of the resistive heating member 5 and/or the insulation layer 60 can be suppressed.

The other constitution of the present invention will now be described.

(Plate-Shaped Member 2)

According to the present invention, the plate-shaped member 2 is preferably formed from a ceramic material having a large value of Young's modulus, which deforms less when heated and makes it possible to form a member thinner than in the case of other material. As a result, it is made possible to heat to a predetermined processing temperature in a shorter time and cool down from the processing temperature to the room temperature in a shorter time, thus improving the productivity. Joule heat of the resistive heating member 5 can be transferred quickly with a smaller thickness, and the temperature difference across the mounting surface 3 can be made extremely small.

In case the plate-shaped member 2 is made of sintered silicon carbide or sintered aluminum nitride, the member deforms less when heated and it is made possible to form the member thinner. As a result, it is made possible to heat to a predetermined processing temperature in a shorter time and cool down from the processing temperature to the room temperature in a shorter time, thus improving the productivity. Since the plate-shaped member 2 has heat conductivity of 10 W/(m·K) or higher, Joule heat of the resistive heating member 5 can be transferred quickly with a smaller thickness, and the temperature difference across the mounting surface 3 can be made extremely small. When heat conductivity is 10 W/(m·K) or lower, it takes a longer time to heat to a predetermined processing temperature and takes a longer time to cool down from the processing temperature to the room temperature.

Thickness of the plate-shaped member 2 is preferably from 2 to 7 mm. When thickness of the plate-shaped member 2 is less than 2 mm, strength of the plate-shaped member 2 may become too low to endure the thermal stress when it is heated by the resistive heating member 5 or receives the cooling fluid that is blown from the nozzle 24, thus causing cracks in the plate-shaped ceramic member 2 due to the thermal stress caused by the temperature change. When thickness t is less than 2 mm, it becomes difficult to smooth out the differences in temperature by means of the plate-shaped ceramic member 2 due to the small thickness, thus resulting in differences in temperature over the mounting surface 3 reflecting the variation in the Joule heat generated by the resistive heating member 5, thus making it difficult to heat the mounting surface uniformly. When thickness of the plate-shaped member 2 is more than 7 mm, heat capacity of the plate-shaped member 2 becomes large and requires a longer period of time for the temperature to stabilize after heating or cooling. Specifically, when thickness is more than 7 mm, since the plate-shaped member 2 has lower heat conductivity than metals even when it is made of silicon carbide or aluminum nitride ceramics having high heat conductivity, heat capacity of the plate-shaped member 2 becomes large and requires a longer period of time to heat to a predetermined processing temperature and takes a longer time to cool down from the processing temperature to the room temperature.

When the wafer heating apparatus is used in forming the resist film, it is preferable to use the plate-shaped ceramic member 2 that is made of silicon carbide as the main component since this material does not generate a gas through reaction with moisture that is contained in the atmosphere or adversely affect the structure of the resist film, thus making it possible to form fine wiring in high density. Care should be paid at this time, so that a sintering assist agent does not include nitrogen that may react with water and form ammonia and/or amine.

Sintered body of silicon carbide that forms the plate-shaped member 2 is made by mixing silicon carbide as the main component and boron (B) or carbon (C) as the sintering additive, or adding a metal oxide such as alumina ($Al_2O_3$) or yttria ($Y_2O_3$), forming the mixture in plate shape after mixing well, and firing the green compact at a temperature from 1900 to 2100° C. Silicon carbide based on either $\alpha$ type or $\beta$ type may be used.

When the sintered body of silicon carbide which has electric conductivity is used as the plate-shaped member 2, the insulation layer that isolates the plate-shaped member 2 having semi-conductivity and the resistive heating member 5 may be made of glass or a resin. When glass is used, withstanding voltage is below 1.5 kV and sufficient insulation cannot be ensured when the thickness is less than 100 μm. When the thickness is more than 400 μm, on the other hand, cracks may be generated to make the layer unable to function as an insulation layer, due to large difference in thermal expansion between the insulation layer and the sintered body of silicon carbide or sintered aluminum nitride that forms the plate-shaped ceramic member 2. Therefore, thickness of the insulation layer made of glass is preferably in a range from 100 to 400 μm, more preferably in a range from 200 to 350 μm.

The principal surface of the plate-shaped member 2 opposite to the mounting surface 3 is preferably polished to achieve flatness within 20 μm and mean surface roughness (Ra) in a range from 0.1 μm to 0.5 μm, in order to improve the adhesion of the surface with the insulation layer that is made of glass or resin.

When the plate-shaped member 2 is made of a sintered material based on aluminum nitride as the main component, an oxide of rare earth element such as $Y_2O_3$ or $Yb_2O_3$ and, as required, an oxide of alkali earth metal such as CaO are added as the sintering assist agent to the main component of aluminum nitride and, after mixing well and forming into plate shape, fired at a temperature from 1900 to 2100° C. in nitrogen gas atmosphere, so as to obtain satisfactory sintered aluminum nitride.

In order to improve adhesion of the resistive heating member 5 with the plate-shaped member 2, an insulation layer made of glass may be formed, but may be omitted in case sufficient amount of glass is added to the resistive heating member 5 and sufficient bonding strength is obtained accordingly.

(Casing 19)

It is preferable that the bottomed metal casing 19 has a depth of 10 to 50 mm, with the bottom surface 21 disposed at a distance of 10 to 50 mm, more preferably 20 to 30 mm from the plate-shaped member 2. This makes it easy to equalize the heating of the mounting surface 3 though exchange of radiation heat between the plate-shaped member 2 and the bottomed metal casing 19. Also as the effect of thermal insulation with the outside is provided, time required for the mounting surface 3 to reach stabilized and uniform temperature distribution is reduced.

The resistive heating member 5 is supplied with electric power by pressing the power terminals 11 provided on the bottomed metal casing 19 onto the power feeder section 6 formed on the surface of the plate-shaped member 2 by means of an elastic member 8 thereby establishing electrical continuity. This is because forming the terminals by embedding the terminals made of a metal in the plate-shaped member 2 adversely affects the uniformity of heating due to the heat capacity of the terminals. When electrical continuity is established by pressing the power terminals 11 by means of the elastic member as in the present invention, thermal stress due to the temperature difference between the plate-shaped member 2 and the bottomed metal casing 19 can be mitigated so as to maintain electrical continuity with high reliability. Moreover, since the contact is prevented from being concentrated to a point, an electrically conductive material having elasticity may be inserted as an intermediate layer. The effect of the intermediate layer can be achieved simply by inserting a foil sheet. Diameter of the power feeder section 6 of the power terminal 11 is preferably in a range from 1.5 to 5 mm.

(Resistive Heating Member 5)

It is preferable to use a noble metal (for example, metal of Pt group or Au) which has high heat resistance and high oxidization resistance, or an alloy based on such metals as the main component, as the electrically conductive component of the resistive heating member 5. It is preferable that the resistive heating member 5 includes 30 to 75% by weight of glass component, in order to improve adhesion of the resistive heating member 5 with the plate-shaped member 2 or the insulation layer 14 and improve the sintering performance of the resistive heating member 5, and the resistive heating member 5 has heat conductivity lower than that of the plate-shaped member 2.

The resistive heating member 5 may be formed, for example, by printing an electrode paste, which includes electrically conductive metal particles, glass frit and metal oxide, onto the plate-shaped member 2 and baking it. At least one kind of metal selected from among Au, Ag, Cu, Pd, Pt and Rh is preferably used as the metal particles included in the electrode paste, and the glass frit is preferably a low-expansion glass that is made of an oxide of metal including B, Si and Zn and has thermal expansion coefficient of $4.5\times10^{-6}/°$ C. or lower, lower than that of the plate-shaped member 2. The metal oxide is preferably one kind selected from among silicon oxide, boron oxide, alumina and titania.

The glass frit that forms the resistive heating member 5 is made of an oxide of metal including B, Si and Zn, and the metal particles that constitute the resistive heating member 5 have thermal expansion coefficient higher than that of the plate-shaped ceramic member 2, and therefore it is preferable to use a low-expansion glass that has thermal expansion coefficient of $4.5\times10^{-6}/°$ C. or lower, lower than that of the plate-shaped ceramic member 2, in order to make the thermal expansion coefficient of the resistive heating member 5 proximate to that of the plate-shaped ceramic member 2.

The reason for using at least one kind selected from among silicon oxide, boron oxide, alumina and titania as the metal oxide that forms the resistive heating member 5 is that these metal oxides have high tenacity with the metal particles included in the resistive heating member 5 and have thermal expansion coefficients proximate to that of the plate-shaped member 2, thus showing high tenacity also with the plate-shaped member 2.

It is not desirable, however, that the content of the metal oxide in the resistive heating member 5 exceeds 50%, since resistance of the resistive heating member 5 becomes higher despite increased tenacity with the plate-shaped member 2. Therefore content of the metal oxide is preferably not higher than 60%.

The resistive heating member 5 that is made of the electrically conductive metal particles, the glass frit and the metal oxide preferably has thermal expansion coefficient of which difference from that of the plate-shaped member 2 is not greater than $3.0\times10^{-6}/°$ C.

This is because it is difficult to constraint the difference in thermal expansion coefficient between the resistive heating member 5 and the plate-shaped member 2 to $0.1\times10^{-6}/°$ C. for the reason of the manufacturing process, and a difference in thermal expansion coefficient between the resistive heating member 5 and the plate-shaped member 2 larger than $3.0\times10^{-6}/°$ C. may lead to warping of the mounting surface 3 in concave shape due to thermal stress generated between the resistive heating member 5 and the plate-shaped member 2, when the resistive heating member 5 is energized.

(Nozzles 24 and Arrangement Thereof)

Distance L between the tip of the nozzle 24 and the plate-shaped member 2 is important, and is preferably in a range from 0.1 to 10 mm, in order to blow the cooling gas onto the plate-shaped member 2 at a faster speed. Such an arrangement allows the cooling gas discharged from the nozzle to hit the plate-shaped member 2 at a sufficient speed without significantly slowing down, thus making it possible to efficiently remove heat.

When distance L between the nozzle 24 and the plate-shaped member 2 is less than 0.1 mm, the gas that has hit the plate-shaped member 2 and has bounced back hampers the subsequent discharge of the gas, and decreases the efficiency of cooling. When distance L between the nozzle 24 and the plate-shaped member 2 is more than 10 mm, the gas diffuses and slows down with reduced flow rate when it hits the plate-shaped member 2, thus resulting in lower efficiency of cooling.

Minimum distance between the position of the center of the tip of the nozzle as projected onto the other surface of the plate-shaped member 2 and the resistive heating member is preferably from 3 to 10 mm.

In case the minimum distance between the center of the tip of the nozzle and the resistive heating member on the other surface as the plane of projection is less than 3 mm, part of the gas discharged from the nozzle hits the surface of the resistive heating member 5. The resistive heating member 5 includes a glass layer and therefore has low heat conductivity. When heat is transferred from the surface of the resistive heating member 5 to the plate-shaped member 2, it takes a longer time to transfer the heat because of the existence of the resistive heating layer having low heat conductivity and the interface between the resistive heating member 5 and the plate-shaped member 2. Therefore, even when this portion is cooled, the efficiency of cooling is low and a long time is taken in cooling.

When the minimum distance between the position of the center of the tip of the nozzle 24 as projected onto the other surface of the plate-shaped member 2 and the resistive heating member 5 is larger than 10 mm, although the surface area of the plate-shaped member 2 where the resistive heating member 5 is not formed becomes larger and the rate of cooling becomes faster, surface temperature of the wafer W becomes lower in a portion thereof that corresponds to the portion of the plate-shaped member 2 where the resistive heating member 5 is not formed, thus resulting in large temperature difference across the surface of wafer and uneven temperature distribution. Therefore, in order to dispose the resistive heating member 5 on of the plate-shaped member 2 and achieve uniform temperature distribution across the wafer W, it is better to decrease the surface area where the resistive heating member 5 is not formed.

In order to ensure sufficient flow velocity of gas required for cooling with the pressure of a compressor commonly used for cooling gas, orifice diameter of the nozzle 24 is preferably in a range from 0.5 to 3 mm. When the orifice diameter of the nozzle 24 is larger than 3.0 mm, flow velocity becomes too slow and the efficiency of cooling decreases significantly. When the orifice diameter is less than 0.5 mm, pressure loss increases and flow velocity becomes slow, efficiency of cooling decreases. Temperature of the cooling gas was set at the normal temperature and total flow rate of the cooling gas was set to 120 liters per minute.

The nozzle 24 is preferably disposed at an angle from 80 to 100 degrees with respect to the plate-shaped member 2. When the angle is set in this range, the cooling gas hits the plate-shaped member 2 with strong impact, thus cooling with high efficiency. When the nozzle 24 is disposed at an angle less than 80 degrees or larger than 100 degrees with respect to the plate-shaped member 2, the cooling gas hits the plate-shaped member 2 obliquely and then flows parallel to the plate-shaped member 2, thus resulting in lower efficiency of cooling.

The angle of the nozzle 24 with respect to the plate-shaped member 2 refers to the angle between the central axis of the nozzle 24, namely the flowing direction of the cooling medium, and the plate-shaped member 2.

The nozzle 24 is made of a metallic material having resistance against oxidization such as stainless steel (Fe—Ni—Cr alloy) or nickel (Ni), or a metallic material such as ordinary steel (Fe) or titanium (Ti) plated with nickel, or plated with nickel and gold thereon, so as to render oxidization resistance. Ceramic material such as zirconia ($ZrO_2$) may also be preferably used. The nozzle 24 made of such a material enables it to stabilize the flow velocity as the diameter of the orifice does not change due to oxidization when heated, and it is made possible to obtain the wafer heating apparatus having high reliability wherein gas and particulates which are harmful to the heat treatment of the wafer would not be generated.

While impurities such as oil or moisture, should ever mix in the cooling gas, are prevented from damaging the resistive heating member 5 and the insulation layers 24, 12, it goes without saying that the reliability can be improved further by passing the cooling gas through a filter thereby removing the impurities.

(Opening 16 of Casing)

In the wafer heating apparatus according to the first to third embodiment, it is preferable to form the opening 16 occupying 5 to 70% of the area in the base plate 13 of the casing 19, in order to purge the cooling gas to the outside. When the area of the opening 16 is less than 5%, the gas discharged from the nozzle 24 and the gas to be purged become mixed in the casing 19, thus decreasing the efficiency of cooling. When the area of the opening 16 is more than 70%, a space for holding the power terminals 11 and the nozzle 24 cannot be secured, while strength of the casing 19 becomes low and flatness of the plate-shaped member 2 increases, thus resulting in poor uniformity of temperature in transient condition, particularly during heating.

By providing the opening 16 in the base plate 13, it is made possible to reduce the cooling period as the cooling gas, which has been discharged from the nozzle 24 and has removed heat from the surface of the plate-shaped member 2, is purged through the opening 16 to the outside of the wafer heating apparatus 1 without remaining within the casing 19, so that the surface of the plate-shaped member 2 can be cooled efficiently by the cooling gas which is subsequently discharged from the nozzle 24.

(Heat Insulating Member 18)

Cross section of the ring-shaped heat insulating member 18 perpendicular to the mounting surface 3 may be of any shape including polygon and circle. In case the plate-shaped member 2 and the heat insulating member 18 make planar contact with each other, heat transfer from the plate-shaped member 2 through the heat insulating 18 to the bottomed metal casing 19 can be restricted satisfactorily small when width of the contact region between the plate-shaped member 2 and the heat insulating member 18 is in a range from 0.1 mm to 13 mm. The width is more preferably in a range from 0.1 to 8 mm. If width of the contact region of the heat insulating member 18 is less than 0.1 mm, the contact region may deform when the heat insulating member is put into contact with the plate-shaped member 2, thus causing the heat insulating member 18 to break. If width of the contact region of the heat insulating member 18 is larger than 13 mm, heat of the plate-shaped member 2 is transferred to the heat insulating member, thus resulting in lower temperature of the plate-shaped member 2 along the periphery thereof and difficulty in achieving uniform temperature distribution over the surface of the wafer W. Width of the contact region between the plate-shaped member 2 and the heat insulating member 18 is more preferably in a range from 0.1 mm to 8 mm, and most preferably from 0.1 to 2 mm.

Heat conductivity of the heat insulating member 18 is preferably lower than that of the plate-shaped member 2. When heat conductivity of the heat insulating member 18 is lower than that of the plate-shaped member 2, it is made possible to achieve uniform temperature distribution over the surface of the wafer W that is placed on the plate-shaped member 2, and temperature of the plate-shaped member 2 can be quickly raised and lowered without being affected by the bottomed metal casing 19 due to small heat transfer to the heat insulating member 18, thus enabling it to quickly change the temperature.

In the heater 7 where heat conductivity of the heat insulating member 18 is less than 10% of the heat conductivity of the plate-shaped member 2, heat transfer from the plate-shaped member to the bottomed metal casing 19 decreases and more heat is transferred by the ambient gas (air in this case) and radiation from the plate-shaped ceramic member to the bottomed metal casing 19.

When heat conductivity of the heat insulating member 18 is higher than the heat conductivity of the plate-shaped member 2, heat is transferred from the peripheral portion of the plate-shaped member 2 through the heat insulating member 18 to the bottomed metal casing 19, thereby heating the bottomed metal casing 19 while the temperature of the peripheral portion of the plate-shaped member 2 decreases thus resulting in larger temperature difference across the surface of the wafer W. Also because the bottomed metal casing 19 is heated, it takes longer time to cool down the plate-shaped member 2 due to high temperature of the metal casing 19 when it is attempted to cool down the plate-shaped member 2 by blowing air thereto from the gas nozzle 24, or it takes longer time to heat the plate-shaped member 2 to a predetermined temperature.

The material used to make the heat insulating member 18 preferably has Young's modulus of 1 GPa or higher, and more preferably 10 GPa or higher, in order to maintain a small contact area. Such a level of contact area enables it to minimize the deformation of the heat insulating member 18 even when the plate-shaped member 2 is fastened onto the bottomed metal casing 19 via the heat insulating member 18 having small contact region of 0.1 mm to 8 mm in width. Thus the plate-shaped member 2 can be prevented from being displaced or deviating from parallelism so as to remain held precisely.

The material used to make the heat insulating member 18 is preferably a metal such as carbon steel that includes iron and carbon or a special steel that includes nickel, manganese and/or chromium since such metals have high values of Young's modulus. The material used to make the heat insulating member 18 also preferably has heat conductivity that is lower than that of the plate-shaped member 2, such as stainless steel or Fe—Ni—Co alloy, the so-called Koval.

The cross section of the heat insulating member 18 along the plane perpendicular to the mounting surface 3 preferably has circular shape rather than polygon. Use of a wire having circular section 1 mm in diameter as the heat insulating member 18 makes it possible to achieve uniform temperature distribution over the surface of the wafer W and quickly raise and lower the temperature without causing displacement of the plate-shaped member 2 and the bottomed metal casing 19. Such a constitution makes it possible to hold the contact section in stable condition with a small contact area between the heat insulating member 18 and the plate-shaped ceramic member 2 while reducing the possibility of the contact region being chipped into particles even with a small contact area, One principal surface of the plate-shaped member 2 may have a plurality of wafer support pins 15 provided thereon as shown in FIG. 1, so as to hold the wafer W at a predetermined distance from the one principal surface of the plate-shaped member 2. Such a constitution enables it to prevent the temperature from unevenly distributed due to uneven bearing.

Examples of the present invention will now be described.

Examples 1 through 4 are related to the first embodiment, Examples 5 and 6 are related to the second embodiment, and Example 7 is related to the third embodiment,

EXAMPLE 1

A sintered body of silicon carbide having heat conductivity of 100 W/(m·K) was ground to make a plurality of round plate-shaped members measuring 3 mm in thickness and 330 mm in diameter.

Then an electrically conductive paste was prepared by mixing Au powder and Pd powder as electrically conductive materials and a glass paste with a binder of composition described previously. The electrically conductive paste was printed onto the plate-shaped member in a predetermined pattern of the resistive heating member by screen printing process so as to attach the resistive heating member and the powder feeder section onto the plate-shaped member. After printing, the organic solvent was evaporated by heating to 150° C., then degreasing treatment was applied by heating to 550° C. for 30 minutes, followed by baking at a temperature from 700 to 900° C. Thus the resistive heating member having thickness of 50 μm was made. Composition of the powder feeder section was controlled so as to have specific resistance lower than that of the resistive heating member, by controlling the proportions of the metallic component and the glass component.

The casing was fastened onto the side wall made of SUS 304 by screwing on the base plate having thickness of 3.0 mm made of SUS 304 as the foundation.

The plate-shaped member was placed on the casing, and bolts were passed through the periphery with nuts screwed thereon while interposing a heat insulating member and interposing an elastic member on the casing side so that the plate-shaped member and the casing did not make direct contact with each other, so as to elastically fasten the members and make the wafer heating apparatus.

Figure 17:
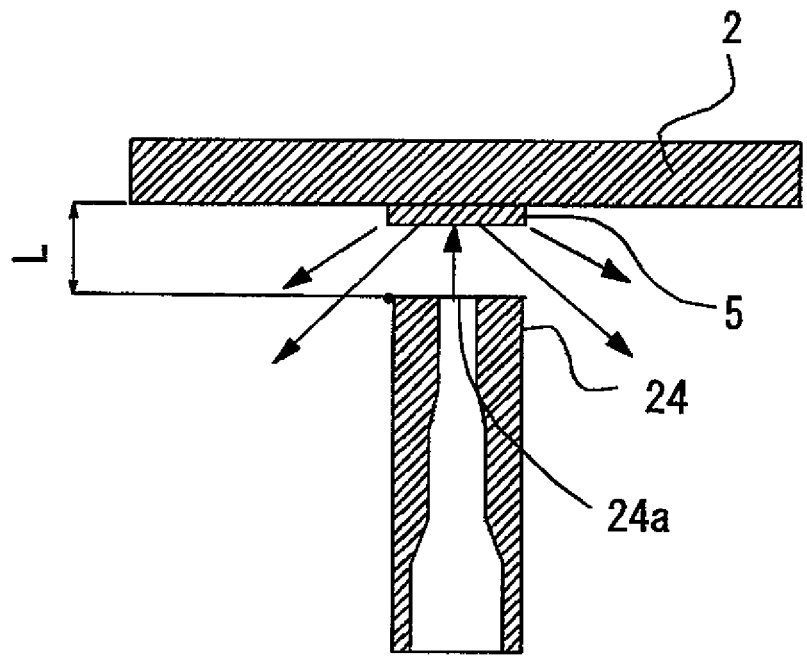
FIG. 17 is an enlarged view showing the relative positions of the tips of the nozzles and the resistive heating member in the wafer heating apparatus according to Comparative Example.
Figure 18:
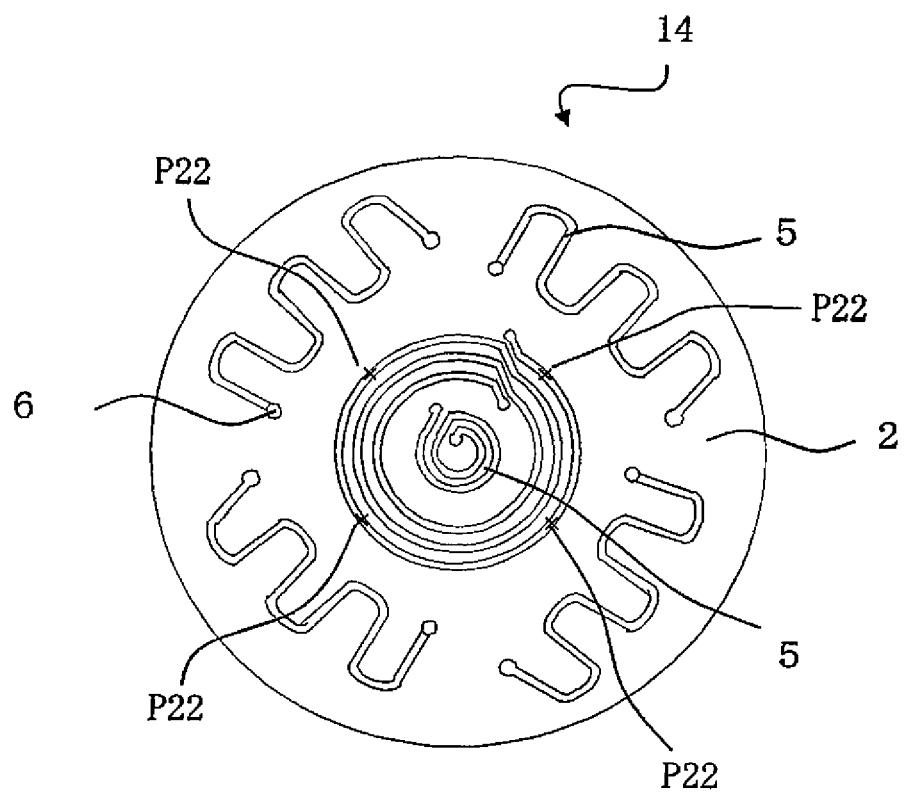
FIG. 18 is a plan view showing the configuration of the bands of the resistive heating member and the positions of the tips of the nozzles in the wafer heating apparatus according to Comparative Example.
Figure 19:
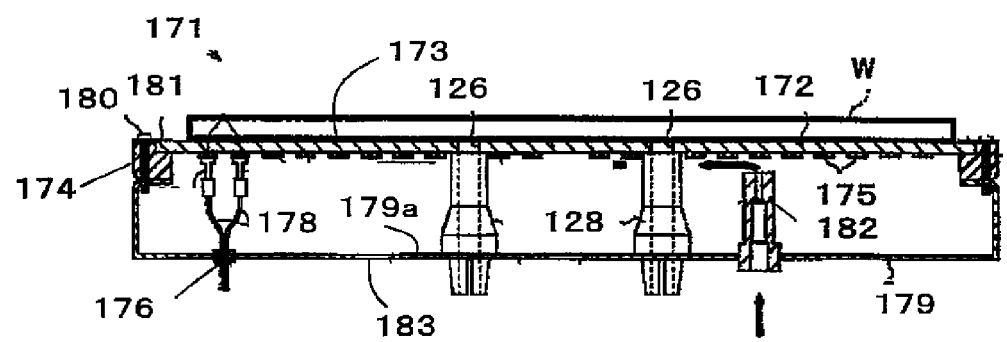
FIG. 19 is a section view showing an example of the wafer heating apparatus of the prior art.
Figure 20:
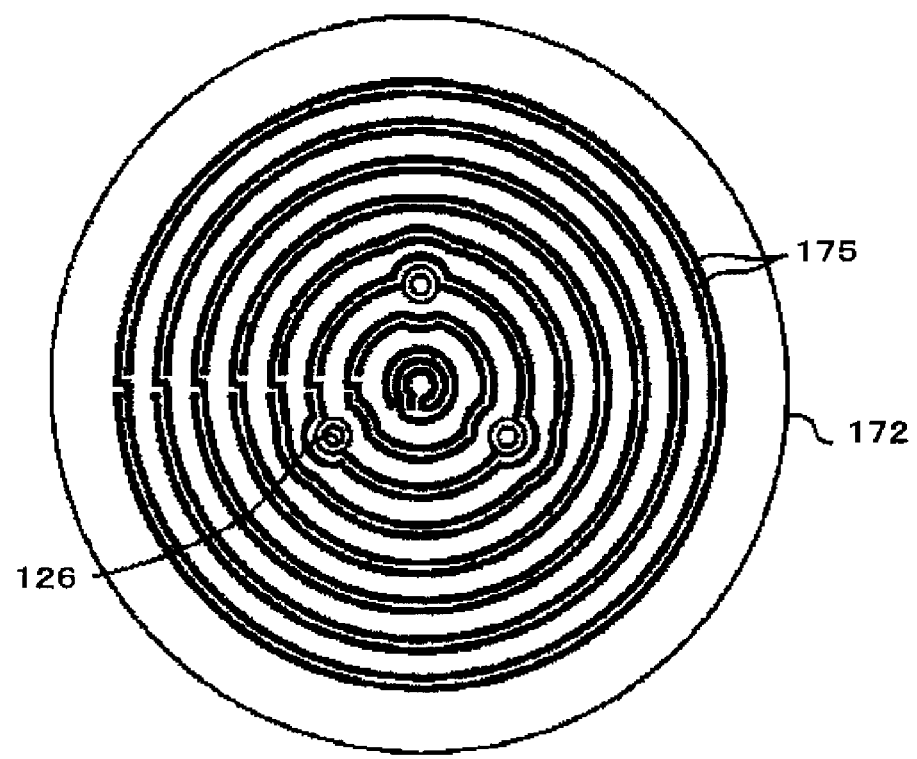
FIG. 20 is a front view showing the configuration of the resistive heating member in the wafer heating apparatus of the prior art.

Tip of the cooling nozzle of sample No. 1 is in the form of a plate-shaped member (P30 shown in FIG. 3) and is located between the resistive heating member 5 similarly to that shown in FIG. 2 and FIG. 3. Tip of the cooling nozzle of sample No. 2 which is Comparative Example is located on the resistive heating member as indicated by P22 shown in FIG. 17 and FIG. 18.

Electric power was supplied to the powder terminals of each of the wafer heating apparatuses and the wafer W was kept at 140° C. with temperature difference controlled within ±0.5° C. After changing the set temperature to 90° C., cooling gas was immediately discharged from the nozzle 24 toward the plate-shaped member 2. The period of time before the temperature lowered to 90° C. and temperature difference across the surface of the wafer W was controlled within ±0.5° C. was defined as the decreasing temperature stabilization time. In order to improve the efficiency of cooling, target value of decreasing temperature stabilization time was set to within 200 seconds. Variation in temperature across the surface of the wafer W was evaluated by using a temperature measuring wafer comprising a wafer measuring 300 mm in diameter and temperature sensors embedded therein at 29 positions.

The wafer heating apparatus fabricated was evaluated in a thermostatic chamber that was controlled to 25° C., while flowing the cooling gas set at the normal temperature and total flow rate of 120 liters per minute. Orifice diameter of the nozzle was set to 1.0 mm, and the distance L between the tip of the cooling nozzle and the plate-shaped member was set to 5.0 mm.

First, the influence of the cooling position on the cooling time was evaluated, with the results shown in Table 1.

TABLE 1

| Sample No. | | Decreasing temperature stabilization time (seconds) |
|---|---|---|
| 1 | Between bands of resistive heating member | 195 |
| *2 | Resistive heating member | 300 |

Sample marked with * is out of the scope of the present invention.

In sample No. 1 where the tip of the nozzle was located between the bands of the resistive heating member (P20 in FIG. 3), excellent property was obtained with a short temperature stabilization time of 195 seconds.

In sample No. 2 of Comparative Example where the tip of the nozzle was located above the resistive heating member, the property was not so good with a long temperature stabilization time of 300 seconds.

It was found that excellent property with a short cooling time can be achieved when the nozzle tip is a part of the plate-shaped member which has a high heat conductivity, This is because the cooling air can be applied directly to the plate-shaped member having a high heat conductivity so as to remove heat in a shorter time, thereby cooling with high efficiency. Therefore, it is necessary to cool the part of the plate-shaped member in order to cool with high efficiency.

EXAMPLE 2

The influence of the distance L between the tip of the nozzle 24 and the plate-shaped member 2 on the cooling time was evaluated, similarly to Example 1 by adjusting the position of securing the nozzle 24 and changing the distance L between the tip of the nozzle 24 and the plate-shaped member 2.

Electric power was supplied to the powder feeder section 6 of each of the wafer heating apparatuses 1 and the surface of the wafer W was kept at 140° C. with temperature difference controlled within ±0.5° C. After changing the set temperature to 90° C., cooling gas was immediately discharged from the nozzle 24 toward the plate-shaped member 2. The period of time before the temperature lowered to 90° C. and temperature difference across the surface of the wafer W was controlled within ±0.5° C. was defined as the decreasing temperature stabilization time. In order to improve the efficiency of cooling, target value of decreasing temperature stabilization time was set to within 200 seconds. Variation in temperature across the surface of the wafer W was evaluated by using a temperature measuring wafer comprising a wafer measuring 300 mm in diameter and temperature sensors embedded therein at 29 positions.

The wafer heating apparatus fabricated was evaluated in a thermostatic chamber that was controlled at 25° C., while flowing the cooling gas set at the normal temperature and total flow rate of 120 liters per minute. Orifice diameter of the nozzle 24 was set to 1.0 mm.

The results of evaluation are shown in Table 2.

TABLE 2

| Sample No. | Distance (mm) between nozzle tip and the plate-shaped member (mm) | Decreasing temperature stabilization time (seconds) |
|---|---|---|
| 3 | 0.05 | 195 |
| 4 | 0.1 | 190 |
| 5 | 1 | 185 |
| 6 | 5 | 185 |
| 7 | 10 | 190 |
| 8 | 15 | 195 |

From Table 2, it can be seen that the distance L between the tip of the cooling nozzle and the plate-shaped member has importance, and that samples Nos. 4 through 7 where L is from 0.1 to 10 mm shows excellent property with a short temperature stabilization time of 190 seconds or less.

When the distance between the nozzle tip and the plate-shaped member is as small as 0.05 mm or as large as 15 mm as in samples Nos. 3 and 8, however, temperature stabilization time was somewhat longer, 195 seconds. In sample No. 3 where the distance L between the plate-shaped member 2 and the nozzle 24 is as small as 0.05 mm, the gas that has hit the plate-shaped member 2 and has bounced back hampers the discharge of the gas, and decreases the efficiency of cooling. In sample No. 8 where distance L between the nozzle 24 and the plate-shaped member 2 is as large as 15 mm, the gas diffuses and slows down with reduced flow rate when it hits the plate-shaped member 2, thus resulting in lower efficiency of cooling.

EXAMPLE 3

Influences on the cooling time were evaluated, similarly to Example 1 by adjusting the position of securing the nozzle 24 and changing the minimum distance between the position of the center of tip of the nozzle 24 as projected on the other surface of the plate-shaped member 2 and the resistive heating member 5.

The results of evaluation are shown in Table 3.

TABLE 3

| Sample No. | Minimum distance (mm) between the center of nozzle tip and the resistive heating member (mm) | Temperature difference across wafer W surface (° C.) | Decreasing temperature stabilization time (seconds) |
|---|---|---|---|
| 9 | 0.1 | 0.20 | 185 |
| 10 | 1 | 0.23 | 180 |
| 11 | 3 | 0.23 | 175 |
| 12 | 10 | 0.24 | 170 |

In samples Nos. 11 through 12 where the minimum distance between the position of the center of tip of the nozzle 24 as projected on the other surface of the plate-shaped member 2 and the resistive heating member 5 is from 3 to 10 mm, temperature stabilization time was as short as 175 seconds or less, and the temperatures across the surface of the wafer W showed differences as small as 0.25° C. or less. Thus temperature stabilization time shorter than that of Example 2 was obtained.

In samples Nos. 9, 10 where the minimum distance between the position of the tip of the nozzle 24 as projected on the other surface of the plate-shaped member and the resistive heating member is as small as 0.1 and 1 mm, respectively, air discharged from the cooling nozzle 24 hits the resistive heating member 5, thus resulting in long temperature stabilization time. When the air hits the resistive heating member 5, it results in slow transfer of heat due to the influence of the interface between the resistive heating member 5 having low heat conductivity and the plate-shaped member 2, thus resulting in low efficiency of cooling and longer cooling time.

From the results described above, it was found that the minimum distance between the position of the center of tip of the nozzle 24 as projected on the other surface of the plate-shaped member and the resistive heating member 5 has great influence and is preferably 3 mm or more and within 100 mm.

EXAMPLE 4

Influence of the number of nozzles 24 on the cooling time was evaluated, similarly to Example 1 by adjusting the number of nozzles 24. The results of evaluation are shown in Table 4.

TABLE 4

| Sample No. | Number of nozzles | Decreasing temperature stabilization time (seconds) |
|---|---|---|
| 16 | 3 | 170 |
| 17 | 4 | 165 |
| 18 | 8 | 160 |

TABLE 4-continued

| Sample No. | Number of nozzles | Decreasing temperature stabilization time (seconds) |
|---|---|---|
| 19 | 16 | 160 |
| 20 | 17 | 170 |

In samples Nos. 17 through 19 where the number of nozzles is from 4 to 16, temperature stabilization time was as short as 165 seconds or less, showing favorable results. The temperature stabilization time was further shorter than Example 3.

In sample No. 16 where the cooling performance showed unevenness due to small number of nozzles, decreasing temperature stabilization time was long and the efficiency of cooling was low. In sample No. 20, flow velocity was slow due to a problem related to the facility as the number of nozzles 24 was 17, thus resulting in longer decreasing temperature stabilization time and low efficiency of cooling.

When too many nozzles are provided, a large facility having a large capacity of holding gas is required to obtain sufficient levels of gas pressure and flow velocity required by the nozzles 24, which is not convenient for mass production. Accordingly, the number of the nozzles 24 is preferably from 4 to 16.

EXAMPLE 5

A sintered body of silicon carbide having heat conductivity of 100 W/(m·K) was ground to make a plurality of round plate-shaped members measuring 3 mm in thickness and 330 mm in diameter.

A glass paste was applied to the entire surface on one side of the plate-shaped member by screen printing so as to form an insulation layer which was then fired to dry at 150° C., followed by degreasing treatment was applied by heating to 550° C. for 30 minutes. Thereafter an insulation layer was baked at a temperature of 800 to 950° C. Then an electrically conductive paste was prepared by mixing Au powder and Pd powder as electrically conductive material and a glass paste with a binder added thereto. The electrically conductive paste was printed onto the insulation layer in the shape of the resistive heating member shown in FIG. 6, in order to form the resistive heating member and the powder feeder section. After printing, the organic solvent was evaporated by heating to 150° C., and degreasing treatment was applied by heating to 550° C. for 30 minutes, followed by baking at a temperature from 700 to 900° C. Thus the resistive heating member having thickness of 55 μm was formed. Composition of the power feeder section was controlled so as to have specific resistance lower than that of the resistive heating member, by controlling the proportions of the metallic component and the glass component.

Heater section having the insulation layer 12 in band shape so as to cover the resistive heating member, and heater section having the insulation layer 12 covering the front surface of the resistive heating member were made.

The casing was fastened onto the side wall made of SUS 304 by screwing on the base plate having thickness of 3.0 mm made of SUS 304 as the foundation.

The plate-shaped member was placed on the casing, and bolts were passed through the periphery with nuts screwed thereon while interposing a heat insulating member so that the plate-shaped member and the casing did not make direct contact with each other, thereby making the wafer heating apparatus.

Tip of the nozzle of sample No. 101 is at the position of the plate-shaped member (AP in FIG. 7A), and the tip of the nozzle is located between the resistive heating members 5 similarly to FIG. 8. There is no insulation layer on the resistive heating member.

The same heater section as described above was made, and a paste of glass frit was printed onto the resistive heating member, and was heated to form an insulation layer. The insulation layer was formed so as to correspond to the resistive heating member zone shown in FIG. 6, while the distance of each resistive heating member zone was set to 30 mm for S1, 33 mm for S2 and 42 mm for S3, and the distance between the insulation layers was accordingly set to 25 mm, 25 mm and 35 mm. The heat insulating member and the casing were assembled similarly to that described above, thereby making the wafer heating apparatus having nozzles provided thereon.

The tip of the nozzle of sample No. 102 is located between the resistive heating members. Insulation layers are also formed to cover the ring-shaped zones individually on the resistive heating member (FIG. 9). Distance between the insulation layer that covers the outermost resistive heating member zone and the insulation layer that covers the innermost resistive heating member zone is set to 35 mm, and the tip of the nozzle was disposed between the insulation layers.

The tip of the nozzle of sample No. 103 is located between the resistive heating members. Insulating layer is uniformly formed over the entire surface of the resistive heating member (FIG. 10).

In sample No. 104, the nozzle was located on the insulation layer of the outermost resistive heating member zone.

Orifice diameter at the tip of the nozzle was 1.2 mm, and the distance between the nozzle tip and the heater section was 6 mm. Samples Nos. 101 through 104 were provided with 8 nozzles disposed on the outside and 4 nozzles disposed on the ring-shaped resistive heating member zone 4 at the second position from the center of the plate-shaped member.

Electric power was supplied to the powder terminals of each of the wafer heating apparatuses and the surface of the wafer W was kept at 140° C. with temperature difference controlled within ±0.5° C. After changing the set temperature to 90° C., cooling gas was immediately discharged from all of the nozzles. The period of time before the temperature lowered to 90° C. and temperature difference across the surface of the wafer W was controlled within ±0.5° C. was defined as the cooling time. In order to improve the efficiency of cooling, target value of decreasing temperature stabilization time was set to within 180 seconds. Variation in temperature across the surface of the wafer W was evaluated by using a temperature measuring wafer comprising a wafer measuring 300 mm in diameter and temperature sensors embedded therein at 29 positions.

The wafer heating apparatus fabricated as described above was evaluated in a thermostatic chamber that was controlled at 25° C., while causing the cooling gas of the normal temperature to flow at total flow rate of 120 liters per minute.

Influence of the cooling position on the cooling time was evaluated.

After raising the temperature of the wafer heating apparatus from 30 to 200° C. in 5 minutes and holding this temperature for 5 minutes, forcible cooling operation was carried out for 30 minutes to complete one heating and cooling cycle. This cycle was repeated 1000 times. Then the temperature was changed from the room temperature to 200° C., and the difference between the maximum temperature and minimum temperature of the wafer was determined 10 minutes later, as the temperature difference in stationary wafer W.

The results are sown in Table 5.

TABLE 5

| Sample No. | Position of nozzle tip | Form of insulation layer 12 | Cooling time (seconds) | Temperature difference in wafer of stationary condition after repetitive heating and cooling cycles (° C.) |
|---|---|---|---|---|
| 101 | On insulation layer 14 of plate-shaped member between resistive heating members | Not provided | 135 | 0.32 |
| 102 | On insulation layer 14 of plate-shaped member between resistive heating members | The resistive heating member is covered by band-shaped insulation layer 12. | 140 | 0.24 |
| 103 | On insulation layer 12 of plate-shaped member between resistive heating members | Insulation layer is provided over the entire surface to cover the resistive heating member. | 152 | 0.25 |
| *104 | On insulation layer 12 and on resistive heating member | Insulation layer is provided over the entire surface to cover the resistive heating member. | 358 | 0.32 |

Marked with * is an example out of the scope of the present invention.

Sample No. 101 where the tip of the nozzle is located between the bands of resistive heating members (AP in FIG. 7A) showed excellent properties with short cooling time of 135 seconds and small temperature difference in stationary wafer W of 0.32° C. after heating and cooling cycles.

Sample No. 102 where the band-shaped insulation layer is located on the resistive heating member showed satisfactory properties with short cooling time of 140 seconds and small temperature difference in stationary wafer W of 0.24° C. after heating and cooling cycles.

Sample No. 103, where the insulation layer 14 was formed on the plate-shaped member and the resistive heating member was formed thereon, with an insulation layer formed further on the resistive heating member, and the heater section was cooled by applying the cooling gas to the insulation layer located between the resistive heating members, showed short cooling time of 152 seconds, small temperature difference in stationary wafer W of 0.25° C. after heating and cooling cycles and high durability.

It was found that excellent properties with short cooling time can be achieved by arranging so that the tip of the nozzle as projected onto the other surface of the plate-shaped member whereon the resistive heating member is formed is located between the resistive heating members where heat can be transferred easily to the plate-shaped member, and cooling the plate-shaped member via the insulation layer.

Sample No. 104, where the insulation layer was formed on the resistive heating member and the resistive heating member was formed thereon, with an insulation layer formed further on the resistive heating member, and the cooling gas was blown onto the insulation layer located on the resistive heating member for cooling, showed long cooling time of 358 seconds.

EXAMPLE 6

In Example 6, samples were made similarly to samples Nos. 101 through 103 of Example 5, surfaces of the insulation layers were processed by sand blast into surface having protrusions and recesses, thereby making samples Nos. 121 through 124. The grooves were formed with width of 30 μm and depth of 20 μm and the protrusions were formed in square shape measuring 40 μm on one side. The samples were evaluated similarly to Example 5.

The results are sown in Table 6.

TABLE 6

| Sample No. | Position of nozzle tip | Form of insulation layer 12 | Whether the insulation layer 12 has surface having protrusions and recesses or not | Cooling time (seconds) |
|---|---|---|---|---|
| 121 | On insulation layer 14 of plate-shaped member between resistive heating members | Not provided | Yes | 95 |
| 122 | On insulation layer 14 of plate-shaped member between resistive heating members | The resistive heating member is covered by band-shaped insulation layer 12. | Yes | 102 |
| 123 | On insulation layer 12 of plate-shaped member between resistive heating members | Insulating layer is provided over the entire surface to cover the resistive heating member. | Yes | 108 |

Samples Nos. 121 through 123 showed cooling time of 95, 102 and 108 seconds, respectively, far shorter than 135, 140 and 152 seconds of samples Nos. 101 through 103, indicating that excellent cooling performance is obtained by providing surface having protrusions and recesses of the insulation layer.

EXAMPLE 7

Examples and Comparative Examples of the present invention will now be described (members common to Examples and Comparative Examples may be denoted by either of the reference numerals used therefore).

A sintered body of aluminum nitride having heat conductivity of 100 W/(m·K), specific gravity of 3.2 and water absorption of 0% was ground to make a plurality of round plate-shaped members 2 measuring 300 mm in diameter while changing the thickness.

A paste formed by mixing Pt, Au, Ag and glass powders was printed in the pattern of the resistive heating member 5 by screen printing method on the plate-shaped member 2, so as to form the resistive heating member 5 on the plate-shaped member 2. Since the paste was prepared to have very high fluidity with viscosity of about 100 poise for the purpose of making the printing process easier, the surfaces having protrusions and recesses 55, 61 were smoothed out after printing, thus resulting in very smooth printed surface regardless of the mesh size of the printing plate.

Before the printed surface dried completely, dimpled jigs having various sizes were thereon so as to transfer substantially lattice configuration. Since the resistive heating member 5 had low consistency in the configuration thereof immediately after being printed, the substantially lattice configuration could not be transferred, while the resistive heating member 5 which had completely dried was too hard to be subjected to transferring.

In case the resistive heating member 5 was dried at 80° C. for about 10 minutes after printing, the substantially lattice configuration could be transferred. Then the plate-shaped member 2, with the resistive heating member 5 having the surface having protrusions and recesses 55, 61 of substantially lattice configuration was formed thereon, was fired at 700° C., near the crystallization temperature of glass, so as to obtain the resistive heating member 5 having various properties shown in Table 7.

Since the resistive heating member 5 shows shrinkage of several percentage points when fired, dimpled jig having such a size selected by taking account of the shrinkage ratio was used.

While the process described above employed the method of transferring the substantially lattice configuration by means of the dimpled jig, it was also possible to form the substantially lattice configuration by using the mesh of the printing plate used in the screen printing process. Specifically, it was possible to form the surface having protrusions and recesses having 0.2 to 80 grooves per 1 mm of width formed in lattice shape, although the ease of printing was somewhat inferior, by printing using a printing plate having mesh of 40 to 600 according to JIS R6002 and a paste having very high viscosity of about 3000 poise and high consistency of configuration to form the resistive heating member, then drying and firing the printed layer whereon the pattern of the printing plate remained. Width of the grooves could be changed simply by changing the mesh size. The method of forming the substantially lattice configuration by using the mesh of the printing plate used in the screen printing process has an advantage of simplifying the process since the dimpled jig is unnecessary. Since the paste of the resistive heating member 5 shows shrinkage of several percentage points when fired, mesh size is selected by taking account of the shrinkage ratio was used.

Then the insulation layer 60, with the resistive heating member 5 having the surfaces having protrusions and recesses 55, 61 of substantially lattice configuration formed thereon, was formed. As the method for forming the insulation layer 60, with the resistive heating member 5 which had the surfaces having protrusions and recesses 55, 61 of substantially lattice configuration formed thereon, a glass paste prepared by mixing a glass powder, ethyl cellulose as a binder and terpineol as an organic solvent was printed smoothly by screen printing method. Before the glass paste was dried completely, dimpled jigs having various sizes were thereon so as to transfer substantially lattice configuration. Then the plate-shaped member 2, with the resistive heating member 5 having the insulation layer 60 with the substantially lattice configuration formed thereon, was fired at 700° C., near the crystallization temperature of glass, so as to obtain the insulation layer 60 of substantially lattice configuration.

Since the glass paste also shows shrinkage of several percentage points when fired, dimpled jig having such a size selected by taking account of the shrinkage ratio was used.

While the process described above employed the method of transferring the substantially lattice configuration by means of the dimpled jig, it was also possible to form the substantially lattice configuration by using the mesh of the printing plate used in the screen printing process. Specifically, it was possible to form the surface having protrusions and recesses having 0.2 to 80 grooves per 1 mm of width formed in lattice shape, although the ease of printing was somewhat inferior, by using printing plate having mesh of 40 to 600 according to JIS R6002.

It goes without saying that width of the grooves can be changed simply by changing the mesh size according to the desired lattice configuration. The method of forming the substantially lattice configuration by using the mesh of the printing plate used in the screen printing process has an advantage of simplifying the process since the dimpled jig is unnecessary. Since the glass paste shows shrinkage of several percentage points when fired, mesh size is selected by taking account of the shrinkage ratio may be used.

The plate-shaped member 2 described above and the casing 19 were assembled, thereby making the wafer heating apparatus 1.

Heating and cooling cycle test was conducted by repeating the cycle where, with 200 V applied to the wafer heating apparatus, temperature was raised to 300° C., the cooling medium was purged through the discharge port, and the temperature was lowered quickly from 300° C. to the room temperature. The relation between the number of heating and cooling cycles and peel-off or crack of the resistive heating member 5 was investigated.

In the first heating and cooling cycle, the period of time taken to lower the temperature from 300° C. to 50° C. was measured as the cooling time.

The results are shown in Table 7 (Tables 7-1 through 7-6).

TABLE 7

| Sample No. | Surface configuration of resistive heating member | Surface configuration of insulation layer |
|---|---|---|
| *201 | Smooth | Smooth |
| 202 | Smooth | Grooves of substantially lattice configuration |

TABLE 7-continued

| Sample No. | Surface configuration of resistive heating member | Surface configuration of insulation layer |
|---|---|---|
| 203 | Grooves of substantially lattice configuration | Smooth |
| 204 | Surface having protrusions and recesses | Surface having protrusions and recesses |
| 205 | Grooves of substantially lattice configuration | Grooves of substantially lattice configuration |
| 206 | Grooves of substantially lattice configuration | Grooves of substantially lattice configuration |
| 207 | Grooves of substantially lattice configuration | Grooves of substantially lattice configuration |
| 208 | Grooves of substantially lattice configuration | Grooves of substantially lattice configuration |
| 209 | Grooves of substantially lattice configuration | Grooves of substantially lattice configuration |
| 210 | Grooves of substantially lattice configuration | Grooves of substantially lattice configuration |
| 211 | Grooves of substantially lattice configuration | Grooves of substantially lattice configuration |
| 212 | Grooves of substantially lattice configuration | Grooves of substantially lattice configuration |
| 213 | Grooves of substantially lattice configuration | Grooves of substantially lattice configuration |
| 214 | Grooves of substantially lattice configuration | Grooves of substantially lattice configuration |
| 215 | Grooves of substantially lattice configuration | Grooves of substantially lattice configuration |
| 216 | Grooves of substantially lattice configuration | Grooves of substantially lattice configuration |
| 217 | Grooves of substantially lattice configuration | Grooves of substantially lattice configuration |
| 218 | Grooves of substantially lattice configuration | Grooves of substantially lattice configuration |
| 219 | Grooves of substantially lattice configuration | Grooves of substantially lattice configuration |
| 220 | Grooves of substantially lattice configuration | Grooves of substantially lattice configuration |
| 221 | Grooves of substantially lattice configuration | Grooves of substantially lattice configuration |
| 222 | Grooves of substantially lattice configuration | Grooves of substantially lattice configuration |
| 223 | Grooves of substantially lattice configuration | Grooves of substantially lattice configuration |
| 224 | Grooves of substantially lattice configuration | Grooves of substantially lattice configuration |
| 225 | Grooves of substantially lattice configuration | Grooves of substantially lattice configuration |
| 226 | Grooves of substantially lattice configuration | Grooves of substantially lattice configuration |
| 227 | Grooves of substantially lattice configuration | Grooves of substantially lattice configuration |
| 228 | Grooves of substantially lattice configuration | Grooves of substantially lattice configuration |
| 229 | Grooves of substantially lattice configuration | Grooves of substantially lattice configuration |
| 230 | Grooves of substantially lattice configuration | Grooves of substantially lattice configuration |
| 231 | Grooves of substantially lattice configuration | Grooves of substantially lattice configuration |

Marked with * is an example out of the scope of the present invention.

TABLE 7-2

| | Resistive heating member | | | | |
|---|---|---|---|---|---|
| Sample No. | Number of lattice-shaped grooves per 1 mm | Thickness ($t_v$) of recess (μm) | Thickness ($t_p$) of protrusion (μm) | Proportion ($t_p/t_v$) × 100 | Mean thickness of resistive heating member (μm) |
| *201 | | | | | 2 |
| 202 | | | | | 2 |
| 203 | 20 | 25 | 35 | 140.0% | 60 |
| 204 | | 25 | 35 | | 60 |
| 205 | 0.1 | 25 | 35 | 140.0% | 60 |
| 206 | 0.2 | 25 | 35 | 140.0% | 60 |
| 207 | 0.4 | 25 | 35 | 140.0% | 60 |
| 208 | 40 | 25 | 35 | 140.0% | 60 |
| 209 | 80 | 25 | 35 | 140.0% | 60 |
| 210 | 100 | 25 | 35 | 140.0% | 60 |
| 211 | 20 | 1 | 1 | 100.0% | 2 |
| 212 | 20 | 25 | 27 | 108.0% | 52 |
| 213 | 20 | 25 | 35 | 140.0% | 60 |
| 214 | 20 | 18 | 35 | 194.4% | 53 |
| 215 | 20 | 1 | 2 | 200.0% | 3 |
| 216 | 20 | 17 | 35 | 205.9% | 52 |
| 217 | 20 | 25 | 45 | 180.0% | 70 |
| 218 | 20 | 25 | 35 | 140.0% | 60 |
| 219 | 20 | 25 | 35 | 140.0% | 60 |
| 220 | 20 | 25 | 35 | 140.0% | 60 |
| 221 | 20 | 25 | 35 | 140.0% | 60 |
| 222 | 20 | 25 | 35 | 140.0% | 60 |
| 223 | 20 | 25 | 35 | 140.0% | 60 |
| 224 | 20 | 25 | 35 | 140.0% | 60 |
| 225 | 20 | 25 | 35 | 140.0% | 60 |
| 226 | 20 | 25 | 35 | 140.0% | 60 |
| 227 | 20 | 25 | 35 | 140.0% | 60 |
| 228 | 20 | 25 | 35 | 140.0% | 60 |
| 229 | 20 | 25 | 35 | 140.0% | 60 |
| 230 | 20 | 25 | 35 | 140.0% | 60 |
| 231 | 20 | 25 | 35 | 140.0% | 60 |

TABLE 7-3

| Sample No. | Insulation layer | | | | |
|---|---|---|---|---|---|
| | Number of lattice-shaped grooves per 1 mm | Thickness (tv) of recess (μm) | Thickness (tp) of protrusion (μm) | Proportion (tp/tv) × 100 | Mean thickness of insulation layer (μm) |
| *201 | | | | | 2 |
| 202 | 20 | 25 | 35 | 140.0% | 60 |
| 203 | | | | | 2 |
| 204 | | | | | 2 |
| 205 | 0.1 | 25 | 35 | 140.0% | 60 |
| 206 | 0.2 | 25 | 35 | 140.0% | 60 |
| 207 | 0.4 | 25 | 35 | 140.0% | 60 |
| 208 | 40 | 25 | 35 | 140.0% | 60 |
| 209 | 80 | 25 | 35 | 140.0% | 60 |
| 210 | 100 | 25 | 35 | 140.0% | 60 |
| 211 | 20 | 1 | 1 | 100.0% | 2 |
| 212 | 20 | 25 | 27 | 108.0% | 52 |
| 213 | 20 | 25 | 35 | 140.0% | 60 |
| 214 | 20 | 18 | 35 | 194.4% | 53 |
| 215 | 20 | 1 | 2 | 200.0% | 3 |
| 216 | 20 | 17 | 35 | 205.9% | 52 |
| 217 | 20 | 25 | 45 | 180.0% | 70 |
| 218 | 20 | 25 | 35 | 140.0% | 60 |
| 219 | 20 | 25 | 35 | 140.0% | 60 |
| 220 | 20 | 25 | 35 | 140.0% | 60 |
| 221 | 20 | 25 | 35 | 140.0% | 60 |
| 222 | 20 | 25 | 35 | 140.0% | 60 |
| 223 | 20 | 25 | 35 | 140.0% | 60 |
| 224 | 20 | 25 | 35 | 140.0% | 60 |
| 225 | 20 | 25 | 35 | 140.0% | 60 |
| 226 | 20 | 25 | 35 | 140.0% | 60 |
| 227 | 20 | 25 | 35 | 140.0% | 60 |
| 228 | 20 | 25 | 35 | 140.0% | 60 |
| 229 | 20 | 25 | 35 | 140.0% | 60 |
| 230 | 20 | 25 | 35 | 140.0% | 60 |
| 231 | 20 | 25 | 35 | 140.0% | 60 |

TABLE 7-4

| Sample No. | Composition of resistive heating member (% by weight) | | | |
|---|---|---|---|---|
| | Pt | Au | Ag | Glass |
| *201 | 30 | 20 | 0 | 50 |
| 202 | 30 | 20 | 0 | 50 |
| 203 | 30 | 20 | 0 | 50 |
| 204 | 30 | 20 | 0 | 50 |
| 205 | 30 | 20 | 0 | 50 |
| 206 | 30 | 20 | 0 | 50 |
| 207 | 30 | 20 | 0 | 50 |
| 208 | 30 | 20 | 0 | 50 |
| 209 | 30 | 20 | 0 | 50 |
| 210 | 30 | 20 | 0 | 50 |
| 211 | 30 | 20 | 0 | 50 |
| 212 | 30 | 20 | 0 | 50 |
| 213 | 30 | 20 | 0 | 50 |
| 214 | 30 | 20 | 0 | 50 |
| 215 | 30 | 20 | 0 | 50 |
| 216 | 30 | 20 | 0 | 50 |
| 217 | 30 | 20 | 0 | 50 |
| 218 | 30 | 20 | 0 | 50 |
| 219 | 30 | 20 | 0 | 50 |
| 220 | 30 | 20 | 0 | 50 |
| 221 | 40 | 10 | 0 | 50 |
| 222 | 30 | 20 | 0 | 50 |
| 223 | 20 | 30 | 0 | 50 |
| 224 | 40 | 0 | 10 | 50 |
| 225 | 30 | 0 | 20 | 50 |
| 226 | 20 | 0 | 30 | 50 |
| 227 | 0 | 20 | 30 | 50 |
| 228 | 0 | 30 | 30 | 40 |
| 229 | 0 | 30 | 20 | 50 |
| 230 | 0 | 10 | 40 | 50 |
| 231 | 10 | 20 | 10 | 60 |

TABLE 7-5

| Sample No. | Composition of insulation layer (% by weight) | | | |
|---|---|---|---|---|
| | ZnO | $B_2O_3$ | $SiO_2$ | $MnO_2$ |
| *201 | 50 | 30 | 20 | 0 |
| 202 | 50 | 30 | 20 | 0 |
| 203 | 50 | 30 | 20 | 0 |
| 204 | 50 | 30 | 20 | 0 |
| 205 | 50 | 30 | 20 | 0 |
| 206 | 50 | 30 | 20 | 0 |
| 207 | 50 | 30 | 20 | 0 |
| 209 | 50 | 30 | 20 | 0 |
| 209 | 50 | 30 | 20 | 0 |
| 210 | 50 | 30 | 20 | 0 |
| 211 | 50 | 30 | 20 | 0 |
| 212 | 50 | 30 | 20 | 0 |
| 213 | 50 | 30 | 20 | 0 |
| 214 | 50 | 30 | 20 | 0 |
| 215 | 50 | 30 | 20 | 0 |
| 216 | 50 | 30 | 20 | 0 |
| 217 | 50 | 30 | 20 | 0 |
| 218 | 50 | 30 | 18 | 2 |
| 219 | 60 | 20 | 18 | 2 |
| 220 | 70 | 20 | 8 | 2 |
| 221 | 50 | 30 | 20 | 0 |
| 222 | 60 | 20 | 18 | 2 |
| 223 | 50 | 30 | 20 | 0 |
| 224 | 50 | 30 | 20 | 0 |
| 225 | 60 | 20 | 18 | 2 |
| 226 | 50 | 30 | 20 | 0 |
| 227 | 50 | 30 | 20 | 0 |
| 228 | 50 | 30 | 20 | 0 |
| 229 | 50 | 30 | 20 | 0 |
| 230 | 50 | 30 | 20 | 0 |
| 231 | 50 | 30 | 20 | 0 |

TABLE 7-6

| Sample No. | Number of heating and cooling cycles before crack | Cooling time (time taken to cool from 300° C. to 50° C.) (seconds) |
|---|---|---|
| *201 | 2400 | 450 |
| 202 | 4050 | 300 |
| 203 | 4060 | 300 |
| 204 | 4100 | 300 |
| 205 | 5500 | 280 |
| 206 | 9200 | 270 |
| 207 | 14300 | 260 |
| 208 | 14600 | 220 |
| 209 | 9200 | 220 |
| 210 | 6800 | 220 |
| 211 | 4200 | 220 |
| 212 | 14800 | 220 |
| 213 | 15000 | 220 |
| 214 | 14800 | 220 |
| 215 | 11000 | 220 |
| 216 | 9800 | 220 |
| 217 | 6000 | 220 |
| 218 | 15400 | 220 |
| 219 | 23200 | 220 |
| 220 | 15600 | 220 |
| 221 | 12300 | 220 |
| 222 | 23200 | 220 |
| 223 | 11200 | 220 |
| 224 | 12300 | 220 |
| 225 | 23200 | 220 |
| 226 | 11200 | 220 |
| 227 | 13400 | 220 |
| 228 | 13500 | 220 |
| 229 | 13100 | 220 |
| 230 | 13500 | 220 |
| 231 | 8800 | 220 |

Samples Nos. 202 through 231 of the wafer heating apparatus 1, where the resistive heating member 5 and/or the insulation layer 60 had surfaces having protrusions and recesses 55, 61 such as substantially lattice configuration formed thereon, showed satisfactory performance without peel-of or crack of the resistive heating member 5 after undergoing 4000 heating and cooling cycles.

The wafer heating apparatus 1 having the resistive heating member 5 of smooth surface as sample No. 201 experienced crack in the resistive heating member 5 after 400 heating and cooling cycles.

Samples Nos. 206 through 209 of the wafer heating apparatus 1, where the resistive heating member 5 and/or the insulation layer 60 of the plate-shaped member 2 had surface having protrusions and recesses 55, 61 of substantially lattice configuration formed thereon, and had 0.2 to 80 grooves per 1 mm of width formed in lattice shape, provided the wafer heating apparatus 1 of high reliability where the difference in thermal expansion between the plate-shaped member 2, the resistive heating member 2 and/or the insulation layer 60 was absorbed and deterioration of the resistive heating member 5 and/or the insulation layer 60 could be suppressed, thus resulting in high durability of 9000 cycles without peel-of or crack of the resistive heating member 5.

Samples Nos. 212 through 215 where the surface having protrusions and recesses 55, 61 had the proportion (tp/tv)× 100 of the thickness (tp) of the protrusion to the thickness (tv) of the recess in a range from 105 to 200%, and mean thickness of the resistive heating member 5 or the insulation layer 60 was in a range from 3 to 60 μm, showed even higher durability of 10000 cycles without peel-of or crack.

Thus the wafer heating apparatus 1 of particularly high reliability was obtained.

Samples Nos. 202 through 231, where the resistive heating member 5 and/or the insulation layer 60 had surface having protrusions and recesses 55, 61, showed cooling time of 300 seconds or less, shorter than that of sample No. 201 that was Comparative Example without surface having protrusions and recesses 55, 61, while the cooling time was shorter when surface having protrusions and recesses 55, 61, particularly grooves of substantially lattice configuration were formed.

As for the glass component, crystallized glass based on $ZnO$—$B_2O_3$—$SiO_2$—$MnO_2$ including ZnO as the main component showed good results. Particularly, samples Nos. 218 through 220, where the insulation layer was formed from glass having composition of 50 to 70% by weight of ZnO, 20 to 30% by weight of $B_2O_3$, 5 to 20% by weight of $SiO_2$ and 1 to 2% by weight of $MnO_2$ showed satisfactory results by enduring the largest number of heating and cooling cycles from 15000 to 232000.

The resistive heating member 5 formed from a material consisting of at least two materials selected from among Pt, Au and Ag and glass showed good results, particularly when the composition was 30% of Pt, 20% of Au and 50% by weight of glass, or 30% of Pt, 20% of Ag and 50% by weight of glass.

It yielded better results to keep the errors of these values within ±5% by weight.

The insulation layer 60 may not necessarily be formed only on the surface of the resistive heating member 5 and may extend to the underlying plate-shaped member 2 without causing any problem.

The invention claimed is:

1. A wafer heating apparatus comprising:
a plate-shaped member comprising a first principal surface and a second principal surface, wherein the first and second principal surfaces oppose one another, wherein the first principal surface is configured for mounting a wafer;
resistive heating members on the second principal surface;
power feeder terminals connected to the resistive heating members, wherein the power feeder terminals are configured for supplying electric power to the resistive heating members;
a casing provided to cover the power feeder terminals on the second principal surface of the plate-shaped member; and
a nozzle of which tip faces the second principal surface of the plate-shaped member for cooling the plate-shaped member,
wherein a projected position of the tip of the nozzle as projected onto the second principal surface is located between the resistive heating members,
wherein the projected position of the tip of the nozzle as projected onto the second principal surface is located between the power feeder terminals.

2. The wafer heating apparatus according to claim 1, comprising insulation layers on or under one of the resistive heating members, wherein the projected position of the tip of the nozzle is positioned between the insulating layers.

3. The wafer heating apparatus according to claim 2, wherein a thermal conductivity of the plate-shaped member is higher than a thermal conductivity of the insulating layers.

4. The wafer heating apparatus according to claim 1, wherein a thermal conductivity of the plate-shaped member is higher than a thermal conductivity of the resistive heating members.

5. The wafer heating apparatus according to claim 1, the apparatus comprising a plurality of said nozzles, wherein top faces of the nozzles are positioned on a circle.

6. The wafer heating apparatus according to claim 5, wherein the plate-shaped member has a disc shape the center of said circle is located on the axis of the plate-shaped member.

7. A semiconductor manufacturing apparatus comprising the wafer heating apparatus according to claim 1.

8. The wafer heating apparatus according to claim 1, wherein each of the resistive heating members comprises a plurality of band portions and a plurality of linkage portions, wherein the plurality of linkage portions link the plurality of band portions, and wherein the band portions are disposed substantially concentrically.

9. The wafer heating apparatus according to claim 1, wherein a surface of the resistive heating members has protrusions and recesses.

10. The wafer heating apparatus according to claim 9, wherein said recesses are grooves of lattice-like configuration.

11. The wafer heating apparatus according to claim 1, wherein an insulation coverage layer is formed on a part or an entire top surface of the resistive heating members.

12. The wafer heating apparatus according to claim 11, wherein a surface of the insulation coverage layer has protrusions and recesses.

13. The wafer heating apparatus according to claim 12, wherein said recesses are grooves of lattice-like configuration.

14. A wafer heating apparatus comprising:
a plate-shaped member comprising a first principal surface and a second principal surface, wherein the first and second principal surfaces oppose one another, wherein the first principal surface is configured for mounting;
resistive heating members on the second principal surface;
power feeder terminals connected to the resistive heating members, wherein the power feeder terminals are configured for supplying electric power to the resistive heating members;
a casing provided to cover the power feeder terminals on the second principal surface of the plate-shaped member; and
a nozzle of which tip faces the second principal surface of the plate-shaped member for cooling the plate-shaped member,
wherein a projected position of the tip of the nozzle as projected onto the second principal surface is located between the resistive heating members,
wherein each of the resistive heating members comprises a plurality of band portions and a plurality of linkage portions, wherein the plurality of linkage portions link the plurality of band portions, and wherein the band portions are disposed substantially concentrically,
wherein the resistive heating members have a first resistive heating member positioned at the innermost, a second resistive heating member positioned outside of the first resistive heating member, a third resistive heating member positioned outside of the second resistive heating member, a fourth resistive heating member positioned outside of the third resistive heating member,
wherein a first resistive heating member zone defined as an area inside of a circle circumscribing the first resistive heating member, a second resistive heating member zone defined as an area inside of a circle circumscribing the second resistive heating member, a third resistive heating member zone defined as an area inside of a circle circumscribing the third resistive heating member and a fourth resistive heating member zone defined as an area inside of a circle circumscribing the fourth resistive heating member are disposed substantially concentrically.

15. The wafer heating apparatus according to claim 14, the apparatus comprising a plurality of the nozzles.

16. The wafer heating apparatus according to claim 1, wherein the resistive heating members are linked together.

17. The wafer heating apparatus according to claim 2, wherein the insulation layers are linked together.

18. The wafer heating apparatus according to claim 1, wherein each of the resistive heating members comprises a plurality of band portions and a plurality of linkage portions, wherein the plurality of linkage portions link the plurality of band portions, and wherein the projected position of the tip of the nozzle is located between the plurality of band portions.

19. The wafer heating apparatus according to claim 14, comprising the insulation layer of claim 2, wherein the insulation layer comprises a plurality of separate portions separated corresponding to the first to fourth resistive heating members and wherein a projected position of the tip of the nozzle as projected onto the other surface is located between the separate portions.

20. The wafer heating apparatus according to claim 14, the apparatus comprising four said fourth resistive heating members and two said third resistive heating members, wherein the fourth resistive heating member zone is divided into four zones each having the fourth resistive heating member, and wherein third resistive heating member zone is divided into two zones each having the third resistive heating member.

21. The wafer heating apparatus according to claim 14, wherein a distance between the fourth resistive heating member zone and the third resistive heating member zone is larger than a distance between the third resistive heating member zone and the second resistive heating member zone and a distance between the second resistive heating member zone and the first resistive heating member zone.

22. The wafer heating apparatus according to claim 14, the apparatus comprising a plurality of said nozzles, wherein a position projected on the other surface of the tip of each of the nozzles is positioned between the fourth resistive heating member zone and the third resistive heating member zone.

* * * * *